(12) United States Patent
Yamazaki et al.

(10) Patent No.: US 8,884,651 B2
(45) Date of Patent: Nov. 11, 2014

(54) LOGIC CIRCUIT AND SEMICONDUCTOR DEVICE

(71) Applicant: Semiconductor Energy Laboratory Co., Ltd., Atsugi (JP)

(72) Inventors: Shunpei Yamazaki, Setagaya (JP); Jun Koyama, Sagamihara (JP); Masashi Tsubuku, Atsugi (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/073,902

(22) Filed: Nov. 7, 2013

(65) Prior Publication Data

US 2014/0061639 A1    Mar. 6, 2014

Related U.S. Application Data

(63) Continuation of application No. 12/902,670, filed on Oct. 12, 2010.

(30) Foreign Application Priority Data

Oct. 16, 2009    (JP) ................................ 2009-238918

(51) Int. Cl.
*H03K 19/0175*    (2006.01)
(Continued)

(52) U.S. Cl.
CPC .......... *H01L 27/1222* (2013.01); *G09G 3/3291* (2013.01); *G09G 3/3233* (2013.01); *G09G 3/20* (2013.01); *H01L 29/7869* (2013.01); *G09G 2300/0842* (2013.01); *G09G 2310/0275* (2013.01); *G09G 2300/0439* (2013.01); *G09G 2310/0286* (2013.01); *H01L 27/1225* (2013.01)
USPC ................................ 326/81; 326/83; 327/108

(58) Field of Classification Search
CPC ................ H03K 19/00315; H03K 19/018521; H03K 3/356113; H03K 19/0013; H03K 19/00361; H04L 25/0272; H04L 27/028; H04L 25/0292
USPC ............................... 326/81–83; 327/108, 109
See application file for complete search history.

(56) References Cited

U.S. PATENT DOCUMENTS 5,313,222 A    5/1994 Lee
5,731,856 A    3/1998 Kim et al.
(Continued)

FOREIGN PATENT DOCUMENTS

EP    1 737 044 A    12/2006
EP    2 226 847 A    9/2010
(Continued)

OTHER PUBLICATIONS

Fortunato et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543
(Continued)

*Primary Examiner* — Dylan White
(74) *Attorney, Agent, or Firm* — Eric J. Robinson; Robinson Intellectual Property Law Office, P.C.

(57) ABSTRACT

To reduce a leakage current of a transistor so that malfunction of a logic circuit can be suppressed. The logic circuit includes a transistor which includes an oxide semiconductor layer having a function of a channel formation layer and in which an off current is $1 \times 10^{-13}$ A or less per micrometer in channel width. A first signal, a second signal, and a third signal that is a clock signal are input as input signals. A fourth signal and a fifth signal whose voltage states are set in accordance with the first to third signals which have been input are output as output signals.

6 Claims, 31 Drawing Sheets

(51) Int. Cl.
  *H03K 19/094* (2006.01)
  *H03K 3/00* (2006.01)
  *H03B 1/00* (2006.01)
  *G09G 3/32* (2006.01)
  *G09G 3/20* (2006.01)
  *H01L 29/786* (2006.01)
  *H01L 27/12* (2006.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,300,648 B1 | 10/2001 | Mei et al. |
| 6,384,461 B1 | 5/2002 | Lu et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,688,107 B2 | 3/2010 | Osame et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 8,284,142 B2 | 10/2012 | Yamazaki et al. |
| 8,314,765 B2 | 11/2012 | Umezaki |
| 8,330,702 B2 | 12/2012 | Miyake et al. |
| 8,384,077 B2 | 2/2013 | Yano et al. |
| 8,519,929 B2 | 8/2013 | Umezaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0057533 A1 | 3/2003 | Lemmi et al. |
| 2003/0102432 A1 | 6/2003 | Boieriu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0233293 A1 | 10/2006 | Osame et al. |
| 2006/0238135 A1 | 10/2006 | Kimura |
| 2006/0244107 A1 | 11/2006 | Sugihara et al. |
| 2006/0248421 A1* | 11/2006 | Choi .................. 714/731 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0274433 A1* | 11/2007 | Tobita ................. 377/64 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0143706 A1* | 6/2008 | Kim .................. 345/213 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152541 A1 | 6/2009 | Maekawa et al. |
| 2009/0179199 A1 | 7/2009 | Sano et al. |
| 2009/0201071 A1 | 8/2009 | Jinta |
| 2009/0278122 A1 | 11/2009 | Hosono et al. |
| 2009/0280600 A1 | 11/2009 | Hosono et al. |
| 2010/0245307 A1 | 9/2010 | Kimura et al. |
| 2010/0276689 A1 | 11/2010 | Iwasaki |
| 2010/0279462 A1 | 11/2010 | Iwasaki |
| 2010/0283049 A1 | 11/2010 | Sato et al. |
| 2013/0222352 A1* | 8/2013 | Jeong ................ 345/205 |
| 2014/0043093 A1* | 2/2014 | Yamazaki et al. ...... 327/437 |
| 2014/0043094 A1* | 2/2014 | Yamazaki et al. ...... 327/437 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-046216 | 2/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-251348 A | 9/2005 |
| JP | 2006-165527 | 6/2006 |

(56) References Cited

FOREIGN PATENT DOCUMENTS

| | | |
|---|---|---|
| JP | 2006-165528 | 6/2006 |
| JP | 2006-165529 | 6/2006 |
| JP | 2006-323987 A | 11/2006 |
| JP | 2007-103918 A | 4/2007 |
| JP | 2007-194594 A | 8/2007 |
| JP | 2009-141002 A | 6/2009 |
| WO | WO 2004/114391 | 12/2004 |
| WO | WO 2007/029844 | 3/2007 |
| WO | WO 2009/072532 | 6/2009 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350°C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the $16^{th}$ International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

(56) References Cited

OTHER PUBLICATIONS

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 IN. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000°C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

International Search Report (Application No. PCT/JP2010/066745) dated Dec. 21, 2010.

Written Opinion (Application No. PCT/JP2010/066745) dated Dec. 21, 2010.

\* cited by examiner

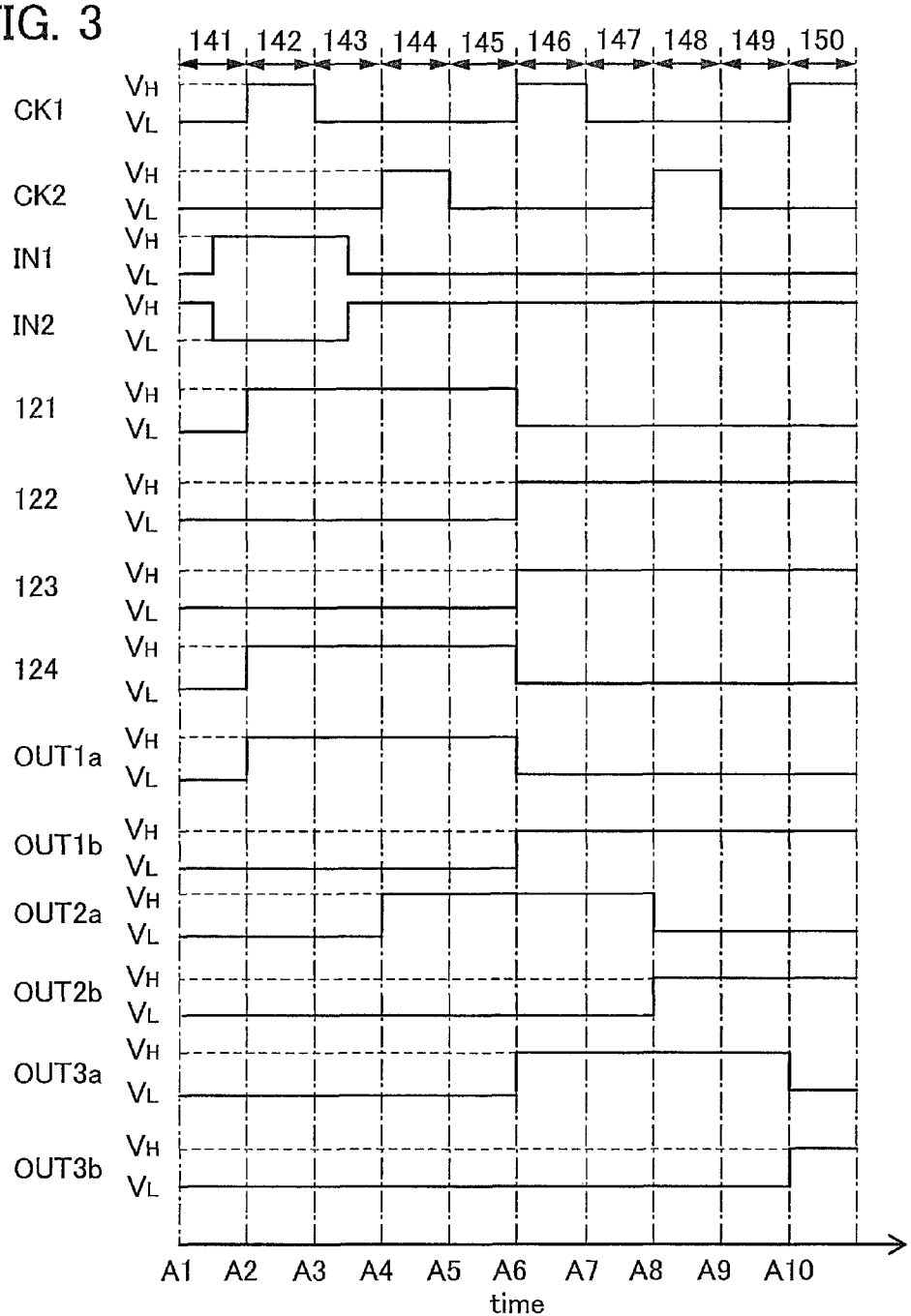

394  393  391          397

399

395a          395b

396

398          392

390

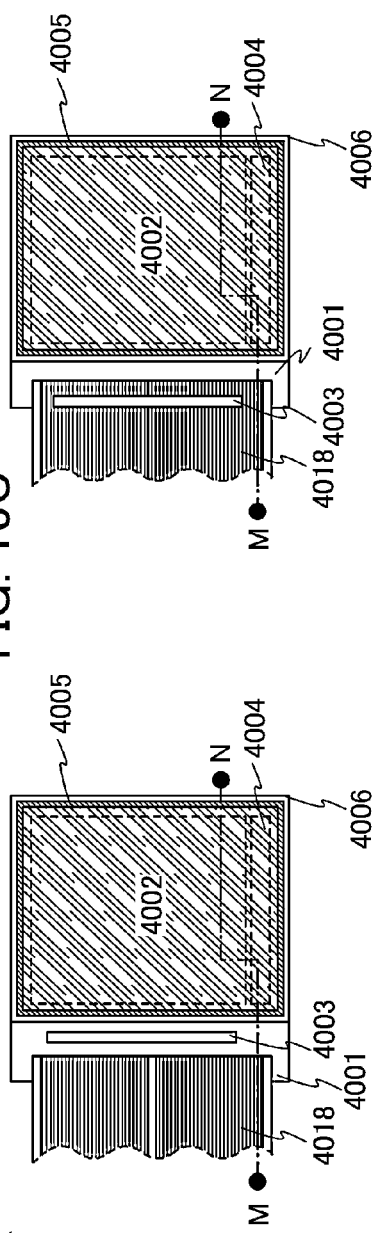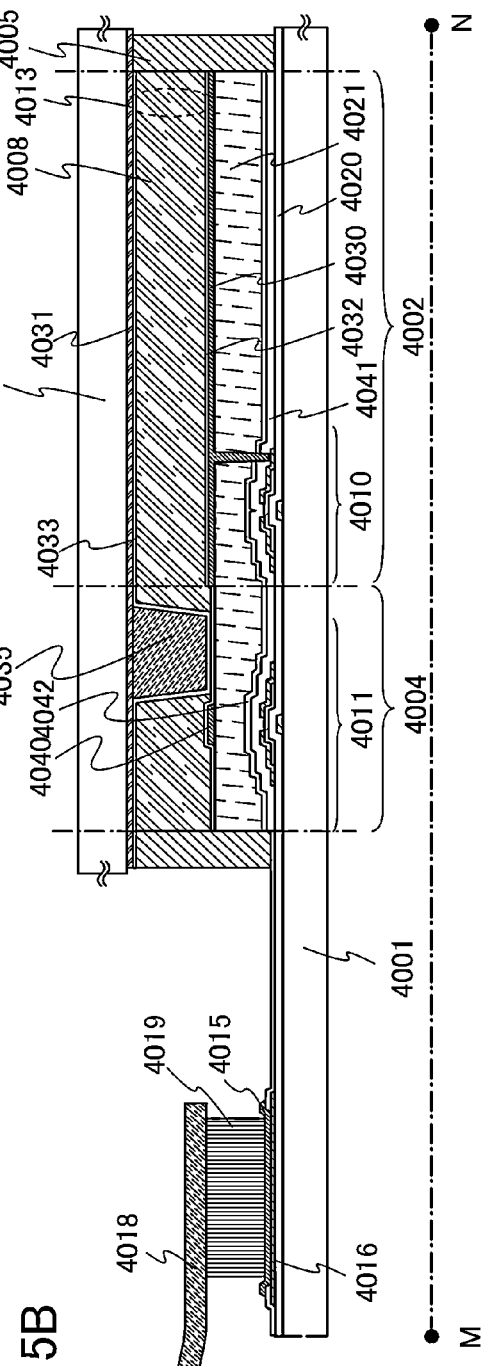

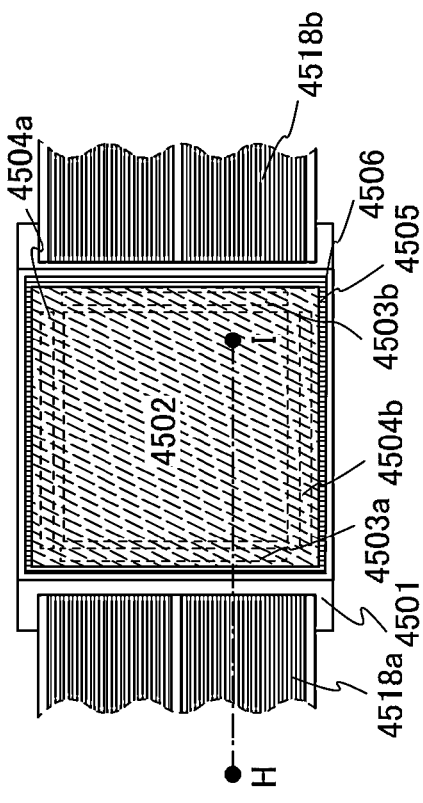
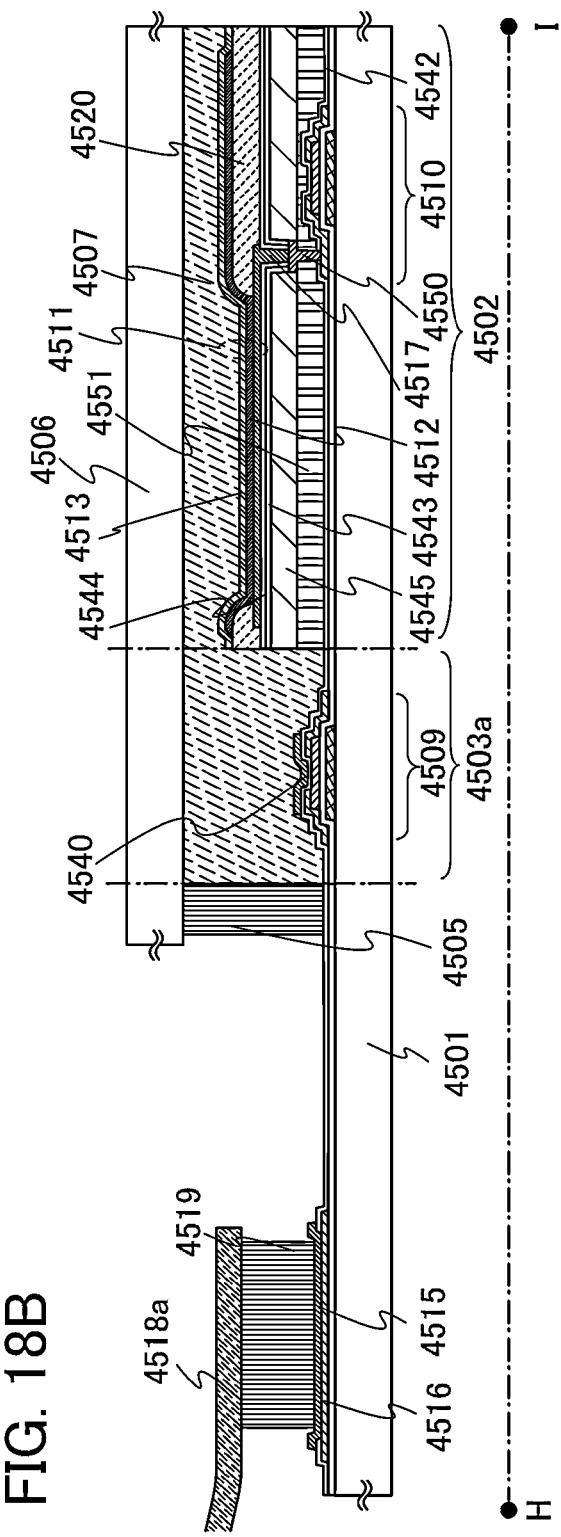
FIG. 18A
FIG. 18B

LOGIC CIRCUIT AND SEMICONDUCTOR DEVICE

TECHNICAL FIELD

An embodiment of the present invention relates to a logic circuit. In addition, an embodiment of the present invention relates to a semiconductor device including a driver circuit formed using the logic circuit.

Note that a semiconductor device in this specification refers to a general device which can function by utilizing semiconductor characteristics. Electrooptic devices such as display devices, semiconductor circuits, and electronic devices are all semiconductor devices.

BACKGROUND ART

Thin film transistors (hereinafter also referred to as TFTs) formed over a flat plate such as a glass substrate, which are typically used in liquid crystal display devices, are generally formed using semiconductor materials such as amorphous silicon or polycrystalline silicon. Although TFTs formed using amorphous silicon have low field-effect mobility, they have an advantage that larger glass substrates can be used. Meanwhile, TFTs formed using polycrystalline silicon have high field-effect mobility; however, they need to be subjected to a crystallization step such as laser annealing and thus are not always suitable for larger glass substrates.

On the other hand, TFTs formed using oxide semiconductors as semiconductor materials have attracted attention. For example, Patent Documents 1 and 2 each disclose a technique in which a TFT is formed using zinc oxide or an In—Ga—Zn—O-based oxide semiconductor as a semiconductor material and used for a switching element in an image display device.

A TFT in which a channel formation region (also referred to as a channel region) is provided in an oxide semiconductor can have a higher electric field mobility than a TFT formed using amorphous silicon. An oxide semiconductor film can be formed with a sputtering method or the like and thus, fabrication of the TFT using an oxide semiconductor is easier than that of the TFT using polycrystalline silicon.

TFTs formed using such an oxide semiconductor are expected to be applied to switching elements included in pixel portions and driver circuits of display devices such as a liquid crystal display, an electroluminescent display (hereinafter also referred to as an EL display), and electronic paper. For example, Patent Document 3 discloses a technique in which a pixel portion and a driver circuit of a display device are formed using TFTs each formed using the oxide semiconductor described above.

REFERENCE

[Patent Document 1] Japanese Published Patent Application No. 2006-165527
[Patent Document 2] Japanese Published Patent Application No. 2006-165529
[Patent Document 3] Japanese Published Patent Application No. 2006-165528

DISCLOSURE OF INVENTION

A driver circuit includes a shift register, a buffer, and the like and the shift register or the buffer includes a logic circuit. The logic circuit is formed using a transistor; however, in a conventional transistor, a leakage current is generated in some cases even when the transistor is off. When a leakage current is generated, for example, even in the case where a value of a voltage of an output signal is to be maintained within a certain range in the logic circuit, the value of the output signal fluctuates and thus malfunction may occur.

An object of one embodiment of the present invention is to reduce a leakage current of a transistor and another object is to reduce a leakage current of a transistor so that malfunction of a logic circuit can be suppressed.

In an embodiment of the present invention, a transistor in which an off current is small and which includes an oxide semiconductor layer having a function of a channel formation layer is used as a transistor included in a logic circuit. With this embodiment, malfunction in the logic circuit is suppressed.

The oxide semiconductor layer used for a channel formation layer of a transistor is an intrinsic or substantially intrinsic semiconductor highly purified by removing an impurity which is to be an electron donor (donor) from an oxide semiconductor and has a larger energy gap than a silicon semiconductor. In a transistor including the oxide semiconductor layer, a leakage current (off current) is small when the transistor is off. In addition, the transistor including the oxide semiconductor layer as the channel formation layer is not significantly affected by variation in threshold voltage.

An embodiment of the present invention is a logic circuit including a transistor which includes an oxide semiconductor layer having a function of a channel formation layer and in which an off current is $1\times10^{-13}$ A or less (preferably, $1\times10^{-17}$ A or less) per micrometer in channel width. A first signal, a second signal, and a third signal that is a clock signal are input as input signals. A fourth signal and a fifth signal whose voltage states are set in accordance with the first signal, the second signal, and the third signal which have been input are output as output signals.

In an embodiment of the present invention, a logic circuit may include a first unit logic circuit which outputs a fourth signal whose voltage state is set in accordance with first to third signals which have been input, and a second unit logic circuit which outputs a fifth signal whose voltage state is set in accordance with the first to third signals which have been input.

An embodiment of the present invention is a logic circuit including a first unit logic circuit and a second unit logic circuit. To the first unit logic circuit, a first signal, a second signal, and a third signal that is a clock signal are input as input signals. In addition, the first unit logic circuit outputs a fourth signal whose voltage state is set in accordance with the first to third signals which have been input. To the second unit logic circuit, the first signal, the second signal, and the third signal that is a clock signal are input as input signals. In addition, the second unit logic circuit outputs a fifth signal whose voltage state is set in accordance with the first to third signals which have been input. The first unit logic circuit and the second unit logic circuit each include a first transistor, a second transistor, a first capacitor, a third transistor, a fourth transistor, and a second capacitor. The first transistor has a gate, a source, and a drain, where the third signal is input to the gate and one of the first signal and the second signal is input to one of the source and the drain. The second transistor has a gate, a source, and a drain, where the gate is electrically connected to the other of the source and the drain of the first transistor, one of a high power supply voltage and a low power supply voltage is applied to one of the source and the drain, and a voltage of the other of the source and the drain is a voltage of the fourth signal or the fifth signal. The first capacitor has a first electrode and a second electrode, where the first electrode is electrically connected to the gate of the second transistor and the second electrode is electrically connected to the other of the source and the drain of the second transistor. The third transistor has a gate, a source, and a drain, where the third signal is input to the gate and the other of the first signal and the second signal is input to one of the source and the drain. The fourth transistor has a gate, a source, and a drain, where the gate is electrically connected to the other of the source and the drain of the third transistor, one of the source and the drain is electrically connected to one of the source and the drain of the second transistor, and the other of the high power supply voltage and the low power supply voltage is input to the other of the source and the drain. The second capacitor has a first electrode and a second electrode, where the first electrode is electrically connected to the other of the source and the drain of the third transistor, and the other of the high power supply voltage and the low power supply voltage is input to the second electrode. The first to fourth transistors each include an oxide semiconductor layer having a function of a channel formation layer. An off current in each of the first to fourth transistors is $1 \times 10^{-13}$ A or less (preferably, $1 \times 10^{-17}$ A or less) per micrometer in channel width.

An embodiment of the present invention is a semiconductor device including a driver circuit and a pixel portion. The driver circuit is provided with a shift register including the logic circuit described above. The pixel portion includes a pixel whose display state is controlled by the driver circuit.

With an embodiment of the present invention, a leakage current in a transistor can be reduced. In addition, by reducing a leakage current in the transistor, a voltage of an output signal can be maintained to be a value within a desired range. Accordingly, malfunction can be suppressed.

BRIEF DESCRIPTION OF DRAWINGS

FIG. 3 is a timing chart illustrating an example of an operation of the shift register in FIG. 2;

FIGS. 15A to 15C illustrate semiconductor devices.

FIGS. 18A and 18B illustrate a semiconductor device.

BEST MODE FOR CARRYING OUT THE INVENTION

Embodiments of the present invention are described with reference to drawings. Note that the present invention is not limited to the following description, and it will be easily understood by those skilled in the art that the modes and details of the present invention can be modified in various ways without departing from the spirit and scope of the present invention. Therefore, the present invention should not be construed as being limited to the following description of the embodiments.

(Embodiment 1)

In this embodiment, a logic circuit which is an embodiment of the present invention is described first. In this specification, a logic circuit includes a combinational logic circuit where a state of an output signal at some point in time is determined by a state of an input signal at the point in time except in the specified case and a sequential logic circuit where a state of an output signal at some point in time is determined by not only a state of an input signal at the point in time but also a state of the sequential logic circuit at the time before the point in time in its category.

Figure 1A:
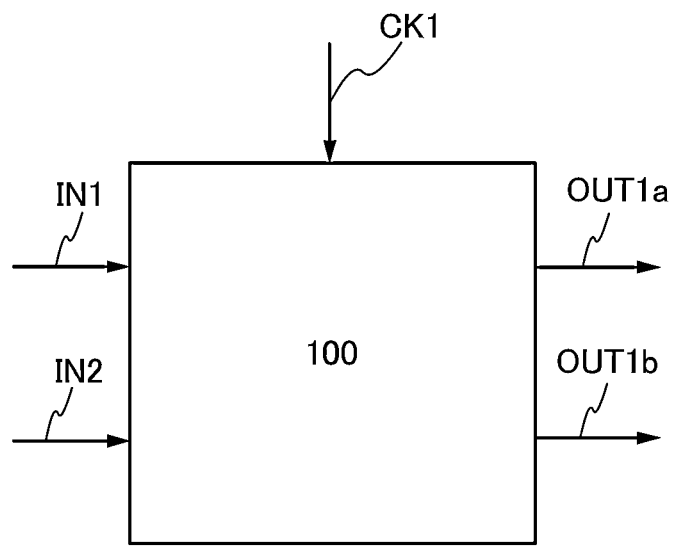
FIGS. 1A and 1B illustrate a configuration example of a logic circuit in Embodiment 1.
Figure 1B:
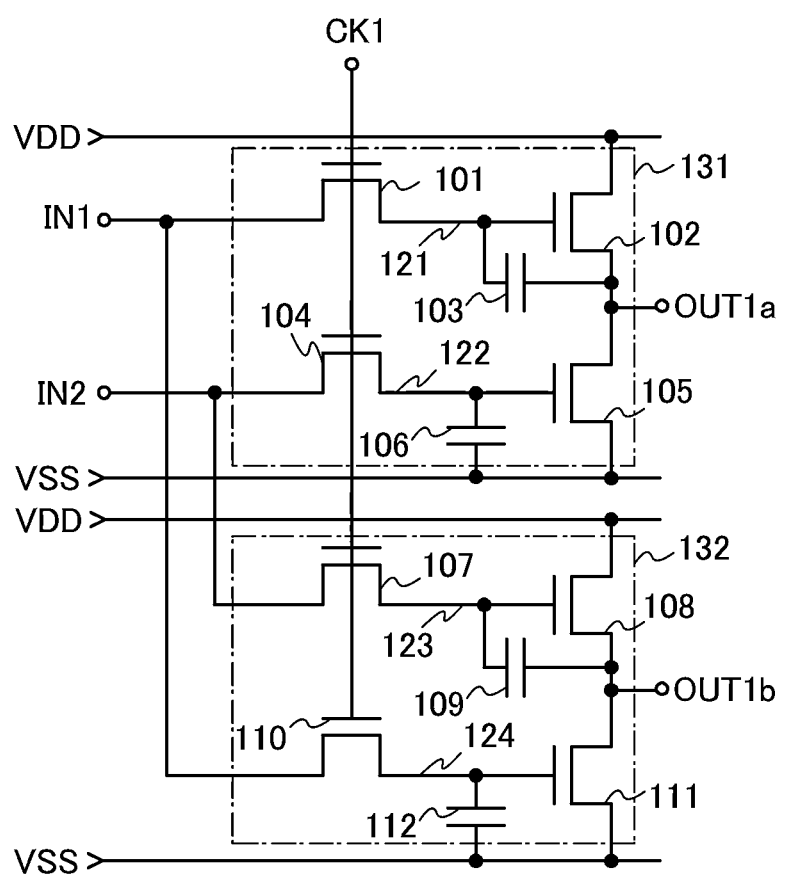

An example of a configuration of a logic circuit in this embodiment is described with reference to FIGS. 1A and 1B. FIGS. 1A and 1B illustrate an example of a configuration of a logic circuit in this embodiment.

To a logic circuit 100 in FIG. 1A, signals IN1, IN2, and CK1 are input as input signals. The logic circuit 100 in FIG. 1A outputs signals OUT1a and OUT1b as output signals.

Note that voltage generally refers to a difference between potentials at two points (also referred to as a potential difference). However, values of both a voltage and a potential are represented using volt (V) in a circuit diagram or the like in some cases, so that it is difficult to discriminate between them. This is why in this specification, a potential difference between a potential at one point and a potential to be the reference (also referred to as the reference potential) is used as a voltage at the point in some cases.

Note that as a signal in this specification, an analog signal or a digital signal which uses voltage, current, resistance, frequency, or the like can be used, for example. For example, as a signal with voltage (also referred to as a voltage signal), it is preferable to use a signal having at least a first voltage state and a second voltage state. A binary digital signal which has a high-level voltage state as the first voltage state and a low-level voltage state as the second voltage state can be used, for example. Note that in a binary digital signal, a high-level voltage is also referred to as $V_H$ and a low-level voltage is also referred to as $V_L$. Moreover, each of a voltage in the first voltage state and a voltage in the second voltage state is preferably a fixed value. However, since noise or the like, for example, has an influence on an electronic circuit, each of the voltage in the first voltage state and the voltage in the second voltage state is not necessarily a fixed value and may be a value within a certain range.

Note that in this specification, a high power supply voltage refers to a voltage on the relatively high voltage side (also referred to as VDD) and a low power supply voltage refers to a voltage on the relatively low voltage side (also referred to as VSS). Each of the high power supply voltage and the low power supply voltage is preferably constant; however, in an electronic circuit, a voltage sometimes varies from a desired value due to noise or the like. Therefore, in this specification, such a voltage can be considered as the high power supply voltage or the low power supply voltage as long as it is a value within a certain range. Further, a value of each power supply voltage can be set as appropriate. Note that positions where a high power supply voltage and a low power supply voltage are applied are switched depending on the polarity of a transistor, so that one of the high power supply voltage and the low power supply voltage is one of them and the other is the other of them.

Further, in this specification, terms with ordinal numbers such as "first" and "second" are used in order to avoid confusion among components, and the terms do not limit the components numerically.

As the signal IN2, an inverted signal of the signal IN1, or the like can be used for example.

The signal CK1 functions as a clock signal of the logic circuit 100.

The signal OUT1a is a signal whose voltage state is set by the signals IN1 and IN2 input.

The signal OUT1b is a signal whose voltage state is set by the signals IN1 and IN2 input.

In addition, FIG. 1B illustrates an example of a circuit configuration of the logic circuit illustrated in FIG. 1A. The logic circuit illustrated in FIG. 1B includes a unit logic circuit 131 and a unit logic circuit 132.

To the unit logic circuit 131, the signals IN1, IN2, and CK1 are input. The unit logic circuit 131 has a function of outputting the signal OUT1a whose voltage state is set in accordance with the signals IN1, IN2, and CK1 input.

To the unit logic circuit 132, the signals IN1, IN2, and CK1 are input. The unit logic circuit 132 has a function of outputting the signal OUT1b whose voltage state is set in accordance with the signals IN1, IN2, and CK1 input.

The unit logic circuit 131 includes a transistor 101, a transistor 102, a capacitor 103, a transistor 104, a transistor 105, and a capacitor 106. The unit logic circuit 132 includes a transistor 107, a transistor 108, a capacitor 109, a transistor 110, a transistor 111, and a capacitor 112.

Note that in this specification, a field-effect transistor can be used as each transistor, for example.

In this specification, a field-effect transistor has at least a gate, a source, and a drain. As the field-effect transistor, a thin film transistor (also referred to as a TFT) can be used, for example. Moreover, the field-effect transistor can have a top-gate structure or a bottom-gate structure, for example. Further, the field-effect transistor can have n-type or p-type conductivity. As an example, the case is described in which all the transistors in the logic circuit illustrated in FIGS. 1A and 1B are field-effect transistors of the same conductivity type. When all the transistors have the same conductivity type, the number of manufacturing steps can be reduced as compared to the case where transistors with different conductivities are used.

Note that the gate is an entire gate electrode and an entire gate wiring or part of them. The gate wiring is a wiring for electrically connecting a gate electrode of at least one transistor to another electrode or another wiring, and includes a scan line in a display device in its category, for example.

The source is an entire source region, an entire source electrode, and an entire source wiring or part of them. The source region is a region whose resistance is lower than that of a channel formation layer in a semiconductor layer. The source electrode is part of a conductive layer, which is connected to the source region. The source wiring is a wiring for electrically connecting a source electrode of at least one transistor to another electrode or another wiring. For example, in the case where a signal line in a display device is electrically connected to a source electrode, the source wiring includes the signal line in its category.

The drain is an entire drain region, an entire drain electrode, and an entire drain wiring or part of them. The drain region is a region whose resistance is lower than that of a channel formation layer in a semiconductor layer. The drain electrode is part of a conductive layer, which is connected to the drain region. The drain wiring is a wiring for electrically connecting a drain electrode of at least one transistor to another electrode or another wiring. For example, in the case where a signal line in a display device is electrically connected to a drain electrode, the drain wiring includes the signal line in its category.

In addition, in this document (the specification, the claims, the drawings, and the like), a source and a drain of a transistor are switched depending on the structure, the operating conditions, or the like of the transistor; therefore, it is difficult to determine which is the source and which is the drain. Accordingly, in this document (the specification, the claims, the drawings, and the like), one of the source and the drain, which is freely selected, is referred to as one of the source and the drain, whereas the other is referred to as the other of the source and the drain.

Further, in this document (the specification, the claims, the drawings, and the like), a capacitor includes a first electrode, a second electrode, and a dielectric to which a voltage between the first electrode and the second electrode is applied.

In the transistor 101, the signal CK1 is input to a gate and the signal IN1 is input to one of a source and a drain.

A gate of the transistor 102 is electrically connected to the other of the source and the drain of the transistor 101. One of a high power supply voltage and a low power supply voltage is applied to one of a source and a drain of the transistor 102. As an example, in FIGS. 1A and 1B, a high power supply voltage is applied to one of the source and the drain of the transistor 102. Note that a connection portion where the gate of the transistor 102 and the other of the source and the drain of the transistor 101 are connected to each other is referred to as a node 121. In addition, the logic circuit illustrated in FIGS. 1A and 1B outputs a voltage of the other of the source and the drain of the transistor 102 as the signal OUT1a.

A first electrode of the capacitor 103 is electrically connected to the gate of the transistor 102, and a second electrode of the capacitor 103 is electrically connected to the other of the source and the drain of the transistor 102. Note that in the case where parasitic capacitance is between the gate and the other of the source and the drain of the transistor 102, the parasitic capacitance may be used as the capacitor 103.

In the transistor 104, the signal CK1 is input to a gate and the signal IN2 is input to one of a source and a drain.

A gate of the transistor 105 is electrically connected to the other of the source and the drain of the transistor 104. One of a source and a drain of the transistor 105 is electrically connected to the other of the source and the drain of the transistor 102. The other of the high power supply voltage and the low power supply voltage is applied to the other of the source and the drain of the transistor 105. As an example, in the logic circuit in FIGS. 1A and 1B, a low power supply voltage is applied to the other of the source and the drain of the transistor 105. Note that a connection portion where the gate of the transistor 105 and the other of the source and the drain of the transistor 104 are connected to each other is referred to as a node 122.

A first electrode of the capacitor 106 is electrically connected to the other of the source and the drain of the transistor 104, and the other of the high power supply voltage and the low power supply voltage is applied to a second electrode of the capacitor 106. As an example, in the logic circuit illustrated in FIGS. 1A and 1B, the low power supply voltage is applied to the second electrode of the capacitor 106.

In the transistor 107, the signal CK1 is input to a gate and the signal IN2 is input to one of a source and a drain.

A gate of the transistor 108 is electrically connected to the other of the source and the drain of the transistor 107. One of the high power supply voltage and the low power supply voltage is applied to one of a source and a drain of the transistor 108. Note that the logic circuit in FIGS. 1A and 1B outputs a voltage of the other of the source and the drain of the transistor 108 as the signal OUT1*b*. Note that a connection portion where the gate of the transistor 108 and the other of the source and the drain of the transistor 107 are connected to each other is referred to as a node 123.

A first electrode of the capacitor 109 is electrically connected to the gate of the transistor 108, and a second electrode of the capacitor 109 is electrically connected to the other of the source and the drain of the transistor 108. Note that in the case where parasitic capacitance is between the gate and the other of the source and the drain of the transistor 108, the parasitic capacitance may be used as the capacitor 109.

In the transistor 110, the signal CK1 is input to a gate and the signal IN1 is input to one of a source and a drain.

A gate of the transistor 111 is electrically connected to the other of the source and the drain of the transistor 110. One of a source and a drain of the transistor 111 is electrically connected to the other of the source and the drain of the transistor 108. The other of the high power supply voltage and the low power supply voltage is applied to the other of the source and the drain of the transistor 111. As an example, in the logic circuit in FIGS. 1A and 1B, a low power supply voltage is applied to the other of the source and the drain of the transistor 111. Note that a connection portion where the gate of the transistor 111 and the other of the source and the drain of the transistor 110 are connected to each other is referred to as a node 124.

A first electrode of the capacitor 112 is electrically connected to the other of the source and the drain of the transistor 110, and the other of the high power supply voltage and the low power supply voltage is applied to a second electrode of the capacitor 112. Note that description is given assuming that the low power supply voltage is applied to the second electrode of the capacitor 112 in the logic circuit illustrated in FIGS. 1A and 1B.

Note that a transistor including an oxide semiconductor layer having a function of a channel formation layer can be used as each of the transistors 101, 102, 104, 105, 107, 108, 110, and 111. Note that the concentrations of hydrogen in the channel formation layer is $5\times10^{19}/cm^3$ or less, preferably $5\times10^{18}/cm^3$ or less, more preferably $5\times10^{17}/cm^3$ or less. The concentrations of hydrogen are measured using, for example, secondary ion mass spectrometry (SIMS). The carrier concentrations of the transistors are $1\times10^{14}/cm^3$ or less, preferably $1\times10^{12}/cm^3$ or less.

As illustrated in FIGS. 1A and 1B as an example, a first signal (e.g., the signal IN1), a second signal (e.g., the signal IN2), and a third signal (e.g., the signal CK1) are input to the logic circuit in this embodiment as input signals, and the logic circuit in this embodiment outputs a fourth signal (e.g., the signal OUT1*a*) and a fifth signal (e.g., the signal OUT1*b*) whose voltage states are set in accordance with the first to third signals input, as output signals.

Further, the example of the logic circuit of this embodiment is formed using transistors having the same conductivity type. By using the transistors having the same conductivity type, the number of manufacturing steps can be reduced as compared to the case where transistors with a plurality of conductivity types are used. As transistors having the same conductivity type, for example, n-channel transistors and p-channel transistors can be used.

Figure 2:
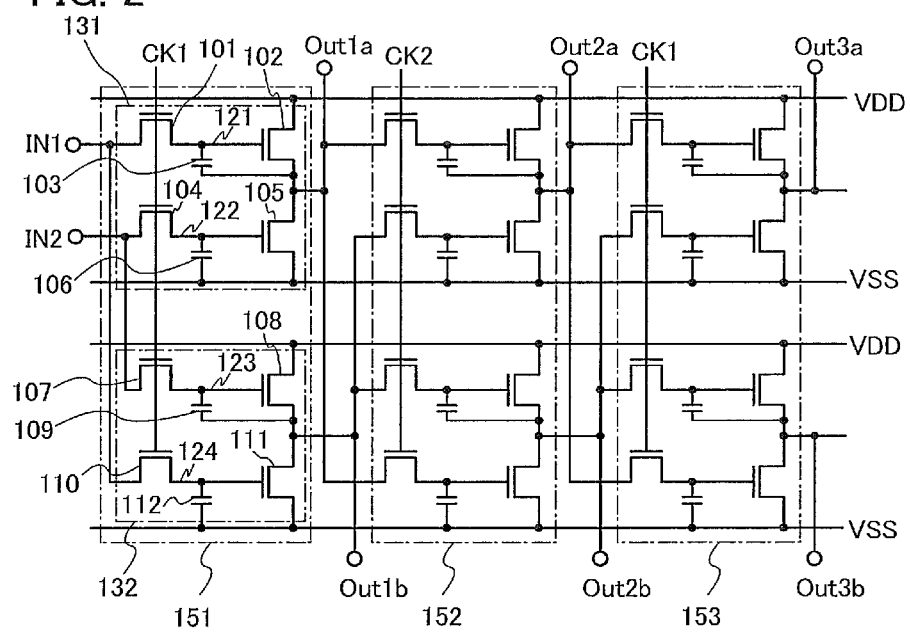
FIG. 2 is a circuit diagram illustrating a configuration example of a shift register in Embodiment 1.

Further, FIG. 2 illustrates an example of a structure of a shift register using the logic circuits illustrated in FIGS. 1A and 1B. FIG. 2 is a circuit diagram illustrating the example of the structure of the shift register. Note that the number of the logic circuits is not necessarily limited as long as the logic circuits of two or more stages are provided. Note that FIG. 2 illustrates an example where transistors included in the shift register are all n-channel transistors; however, an embodiment of the present invention is not limited to this and p-channel transistors may be used.

The shift register illustrated in FIG. 2 includes logic circuits 151, 152, and 153. Note that in each of the logic circuits illustrated in FIG. 2, the description of the logic circuit illustrated in FIGS. 1A and 1B is employed as appropriate for the same portion as that of the logic circuit in FIGS. 1A and 1B. The logic circuits 151, 152, and 153 are all sequential logic circuits.

As in the logic circuit in FIGS. 1A and 1B, in the logic circuit 151, the signal CK1 is input to a gate of the transistor 101, a gate of the transistor 104, a gate of the transistor 107, and a gate of the transistor 110, as an input signal; the signal IN1 is input to one of a source and a drain of the transistor 101 and one of a source and a drain of the transistor 110, as an input signal; and the signal IN2 is input to one of a source and a drain of the transistor 104 and one of a source and a drain of the transistor 107, as an input signal. In addition, the logic circuit 151 outputs the signals OUT 1*a* and OUT1*b* whose voltage states are set in accordance with states of the input signals, as output signals.

The signals OUT1*a* and OUT1*b*, and a signal CK2 are input to the logic circuit 152 as input signals, and the logic circuit 152 outputs signals OUT2*a* and OUT2*b* whose voltage states are set in accordance with the input signals, as output signals. A configuration of the logic circuit 152 is the same as that of the logic circuit 151.

The signal CK2 is a signal input to the logic circuit 152 instead of the signal CK1 in the logic circuit 151. As the signal CK2, a clock signal that is at a high level at a timing different from that of the signal CK1 can be used, for example. The shift register of this embodiment can have a structure in which the logic circuit to which the signal CK1 is input and the logic circuit to which the signal CK2 is input are electrically connected to each other. For example, one of the signals CK1 and CK2 may be input to the logic circuits of odd-numbered stages in the shift register and the other of the signals CK1 and CK2 may be input to the logic circuits of even-numbered stages in the shift register.

The signals OUT2a, OUT2b, and CK1 are input to the logic circuit 153 as input signals, and the logic circuit 153 outputs signals OUT3a and OUT3b whose voltage states are set in accordance with the input signals, as output signals. A configuration of the logic circuit 153 is the same as that of the logic circuit 151.

Next, an example of operation of the shift register illustrated in FIG. 2 is described with reference to FIG. 3. FIG. 3 is a timing chart illustrating an example of the operation of the shift register illustrated in FIG. 2, and illustrates signal waveforms of the signal CK1, the signal CK2, the signal IN1, the signal IN2, the node 121, the node 122, the node 123, the node 124, the signal OUT1a, the signal OUT1b, the signal OUT2a, the signal OUT2b, the signal OUT3a, and the signal OUT3b. Note that in the example of the operation of the shift register in FIG. 2, which is described with reference to FIG. 3, each of the signals is a binary digital signal and the signals CK1 and CK2 are clock signals. The value of the high power supply voltage is equal to a high-level voltage $V_H$ and the value of the low power supply voltage is equal to a low-level voltage $V_L$. Further, in the operation of the logic circuit in this embodiment, the voltage state of each of the signals illustrated in FIG. 3 can be inverted.

The operation of the shift register in FIG. 2 can be divided into a plurality of periods, for description. The operation in each period is described below.

First, the operation in each period is described focusing the logic circuit 151. In a period 141, the signal CK1 is at a low level, the signal CK2 is at a low level, the signal IN1 is at a low level, and the signal IN2 is at a high level.

At that time, the signals OUT1a, OUT1b, and OUT2a in the logic circuit 151 are at a low level.

Then, in a period 142, the signal CK1 is set to a high level at a time A2, the signal CK2 remains at a low level, the signal IN1 is at a high level, and the signal IN2 is at a low level. Note that the signal IN1 may be set to a high level in the period 141 and the signal IN2 may be set to a low level in the period 141.

At that time, in the logic circuit 151, the transistors 101 and 110 are on and the transistors 104 and 107 are off. A potential of the node 121 and a potential of the node 124 are raised in accordance with the signal IN1 and come to be equal to the voltage $V_H$. In addition, the transistor 102 is turned on and a voltage of the signal OUT1a is increased, in accordance with the potential of the node 121. At that time, a voltage of the signal OUT1a is increased by the capacitor 103 in accordance with the potential of the node 121 and comes to be equal to the voltage $V_H$. This is so-called bootstrap operation. A potential of the node 124 is raised in accordance with a voltage of the signal IN1, so that the potential of the node 124 comes to be equal to the voltage $V_H$. The transistor 111 is turned on and a voltage of the signal OUT1b comes to be the voltage $V_L$, in accordance with the potential of the node 124. At that time, a voltage corresponding to a potential of the node 122 and the low power supply voltage is applied to the capacitor 106 and the potential of the node 122 is held by the capacitor 106 for a certain period. In addition, a voltage corresponding to a potential of the node 124 and the low power supply voltage is applied to the capacitor 112 and the potential of the node 124 is held by the capacitor 112 for a certain period. In the case where an off current does not flow through the transistors 104 and 110, the voltage held in the capacitors 106 and 112 is maintained to be a value within a certain range; therefore, by using a transistor with a small off current, such as the transistor which can be applied to the logic circuit of this embodiment, the potential of the node 122 and the potential of the node 124 at the time when the transistor is off can be maintained to be values within a certain range.

Then, in a period 143, the signal CK1 is set to a low level at a time A3, the signal CK2 remains at a low level, the signal IN1 is set to a low level, and the signal IN2 is set to a high level.

At that time, in the logic circuit 151, the transistors 101, 104, 107, and 110 are turned off. The potential of the node 121 is held to be the same value as the voltage $V_H$, the potential of the node 122 is held to be the voltage $V_L$, the potential of the node 123 is held to be the voltage $V_L$, the potential of the node 124 is held to be the voltage $V_H$, the signal OUT1a remains at a high level, and the signal OUT1b remains at a low level.

Then, in a period 144, the signal CK1 remains at a low level, the signal CK2 is set to a high level at a time A4, the signal IN1 remains at a low level, and the signal IN2 remains at a high level. Note that the signal IN1 may be set to a low level and the signal IN2 may be set to a high level, at the time A3.

At that time, the logic circuit 151 maintains the state in the period 143; thus, the signal OUT1a remains at a high level and the signal OUT1b remains at a low level.

Then, in a period 145, the signal CK1 remains at a low level, the signal CK2 is set to a low level at a time A5, the signal IN1 remains at a low level, and the signal IN2 remains at a high level.

At that time, the logic circuit 151 maintains the state in the period 144; thus, the signal OUT1a remains at a high level and the signal OUT1b remains at a low level.

Then, in a period 146, the signal CK1 is set to a high level at a time A6, the signal CK2 remains at a low level, the signal IN1 remains at a low level, and the signal IN2 remains at a high level.

At that time, in the logic circuit 151, the transistors 101, 104, 107, and 110 are turned on, so that the potential of the node 121 and the potential of the node 124 come to be equal to the voltage $V_L$. In addition, the transistors 102 and 111 are turned off in accordance with the potential of the node 121 and the potential of the node 124. Further, the potential of the node 122 and the potential of the node 123 are raised and come to be equal to the voltage $V_H$. In addition, the transistors 105 and 111 are turned on in accordance with the potential of the node 122 and the potential of the node 123, and a voltage of the signal OUT1a comes to be the voltage $V_L$ and a voltage of the signal OUT1b comes to be the voltage $V_H$. At that time, a voltage corresponding to a potential of the node 122 and the low power supply voltage is applied to the capacitor 106 and the potential of the node 122 is held by the capacitor 106 for a certain period. In addition, a voltage corresponding to a potential of the node 124 and the low power supply voltage is applied to the capacitor 112 and the potential of the node 124 is held by the capacitor 112 for a certain period. In the case where an off current does not flow through the transistors 104 and 110, the voltage held in the capacitors 106 and 112 is maintained to be a value within a certain range; therefore, by using a transistor with a small off current, such as the transistor which can be applied to the logic circuit of this embodiment, the potential of the node 122 and the potential of the node 124 at the time when the transistor is off can be maintained to be values within a certain range.

In a subsequent period, the logic circuit 151 maintains in the same state for a certain period, so that the voltage of the signal OUT1a is held at a low level for a certain period and the voltage of the signal OUT1b is held at a high level for a certain period.

In addition, the logic circuits (here, e.g., the logic circuits 152 and 153) in stages following the stage of the logic circuit 151 are described. Note that operation in each of the logic circuits is the same as that of the logic circuit 151 except states of input signals and output signals and thus, description thereof is omitted.

First, in the logic circuit 152, in the period 144, the signal OUT2a which is an output signal is set to a high level at the time A4, and the signal OUT2b remains at a low level.

In the periods 145 to 147, the logic circuit 152 maintains in the same state as that in the period 144, so that the signal OUT2a remains at a high level and the signal OUT2b remains at a low level.

In a period 148, in the logic circuit 152, the signal OUT2a is set to a low level and the signal OUT2b is set to a high level, at a time A8.

In the logic circuit 153, in the period 146, the signal OUT2a which is an output signal is set to a high level at a time A6, and the signal OUT2b remains at a low level.

In the periods 147 to 149, the logic circuit 153 maintains in the same state as in the period 146, so that the signal OUT3a remains at a high level and the signal OUT3b remains at a low level.

Then, in the period 150, in the logic circuit 152, the signal OUT3a is set to a low level and the signal OUT3b is set to a high level, at a time A10.

Although not illustrated, even in the case where the shift register includes logic circuits of three or more stages, voltage states of output signals are sequentially changed in the logic circuits of the stages.

As described above, the shift register of this embodiment can output output signals in two different voltage states from the logic circuits of the stages. In addition, the shift register of this embodiment includes a storage capacitor to hold a gate potential of a transistor, which is for setting the output signal at a high level or a low level, for a certain period, and a transistor in which an off current is small and which includes an oxide semiconductor layer for a channel formation layer is used. With the above structure, since a leakage current through a transistor is reduced, a voltage held in the storage capacitor can be maintained to be a value within a certain range for a certain period. Accordingly, malfunction can be suppressed. In addition, reduction in leakage current due to the transistor leads to reduction in power consumption. Further, in a transistor including an oxide semiconductor layer as a channel formation layer, the impurity concentration of the oxide semiconductor layer is low; thus, variation in threshold voltage is small. In general, if in a shift register including a plurality of shift registers, threshold voltages of the transistors vary significantly, a voltage to turn on all of the transistors is high. By using such a transistor including an oxide semiconductor layer as a channel formation layer for the shift register of this embodiment, power consumption can be reduced.

Further, this embodiment describes a semiconductor device formed using the shift register which is an embodiment of the present invention for a driver circuit. Note that in this embodiment, a display device is described in which at least part of the driver circuit and a pixel portion including a pixel whose display state is controlled by the driver circuit are provided over one substrate, as an example.

Figure 4A:
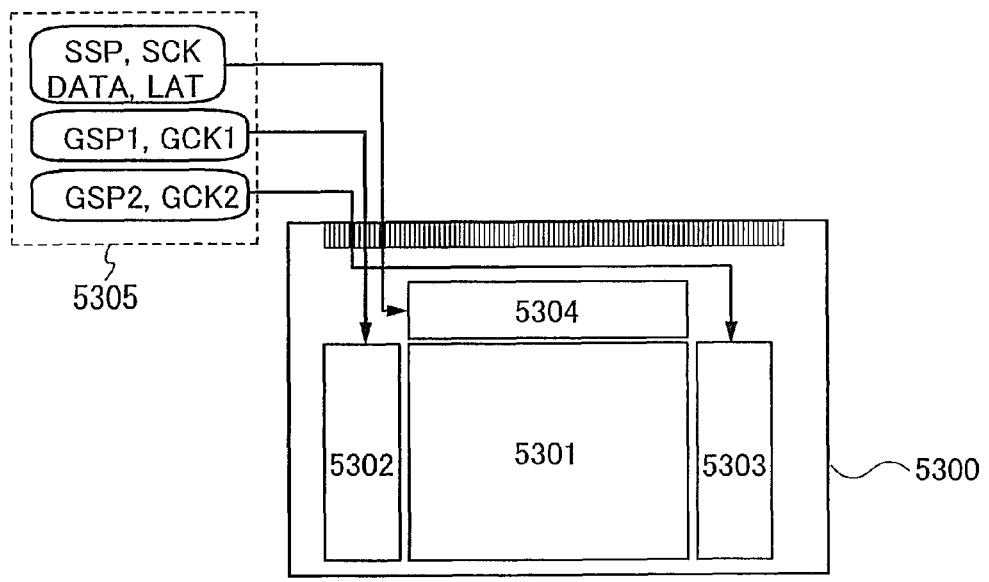
FIGS. 4A and 4B are block diagrams each illustrating a semiconductor device in Embodiment 1.

FIG. 4A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which are extended from the signal line driver circuit 5304 are provided and a plurality of scan lines which are extended from the first scan line driver circuit 5302 and the second scan line driver circuit 5303 are provided. Note that pixels each including a display element are provided in matrix in regions where the scan lines and the signal lines intersect with each other. The substrate 5300 of the display device is connected to a timing control circuit 5305 (also referred to as a controller or a control IC) through a connection portion such as a flexible printed circuit (FPC).

In FIG. 4A, the first scan line driver circuit 5302, the second scan line driver circuit 5303, and the signal line driver circuit 5304 are formed over the substrate 5300 provided with the pixel portion 5301. Accordingly, the number of components of a driver circuit and the like which are provided outside are reduced, so that reduction in cost can be achieved. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Note that as an example, the timing control circuit 5305 supplies a first scan line driver circuit start signal (GSP1) and a first scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. The timing control circuit 5305 supplies a signal line driver circuit start signal (SSP), a signal line driver circuit clock signal (SCK), video signal data (DATA) (also simply referred to as a video signal), and a latch signal (LAT) to the signal line driver circuit 5304, as an example. Each clock signal may be a plurality of clock signals with shifted phases or may be supplied together with a signal (CKB) obtained by inverting the clock signal. The number of each of the first scan line driver circuit start signal, the second scan line driver circuit start signal, the scan line driver circuit clock signal, the signal line driver circuit start signal, and the signal line driver circuit clock signal may be plural. In the semiconductor device of this embodiment, one of the first scan line driver circuit 5302 and the second scan line driver circuit 5303 can be omitted.

Figure 4B:
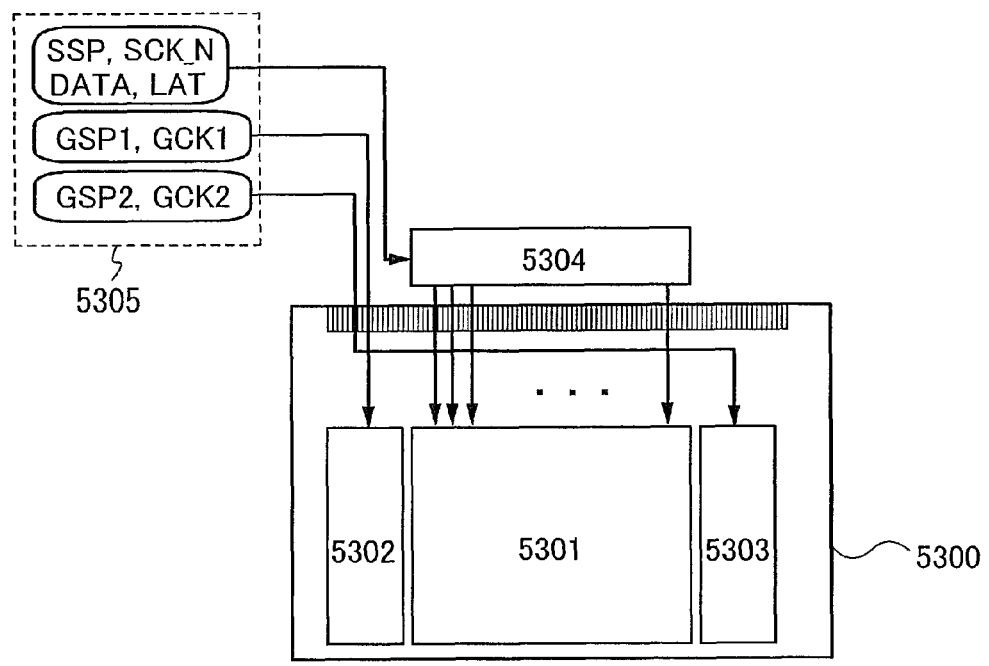

FIG. 4B illustrates a structure in which circuits each with a low drive frequency (e.g., the first scan line driver circuit 5302 and the second scan line driver circuit 5303) are formed over the substrate 5300 provided with the pixel portion 5301, and the signal line driver circuit 5304 is formed over another substrate which is different from the substrate provided with the pixel portion 5301. With this structure, a driver circuit formed over the substrate 5300 can be formed using a thin film transistor with lower field-effect mobility than that of a transistor formed using a single crystal semiconductor. Accordingly, increase in size of the display device, reduction in the number of steps, reduction in cost, improvement in yield, or the like can be achieved.

Figure 5A:
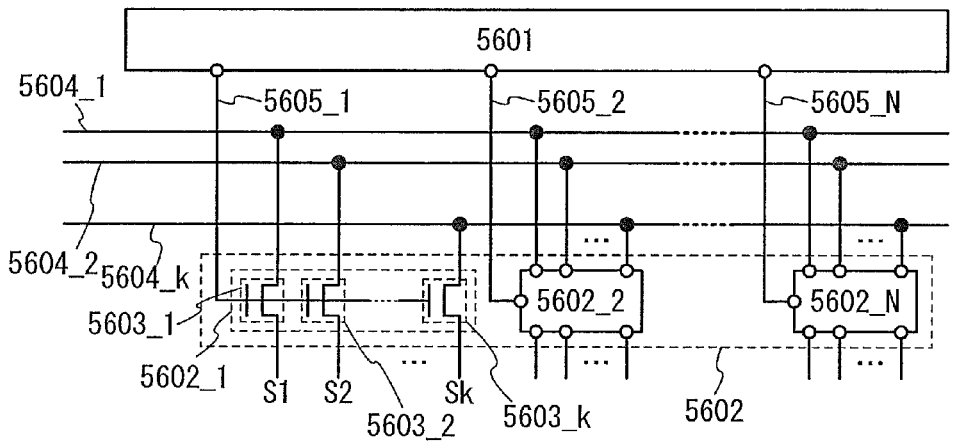
FIGS. 5A and 5B illustrate a configuration and a timing chart of a signal line driver circuit in Embodiment 1, respectively.
Figure 5B:
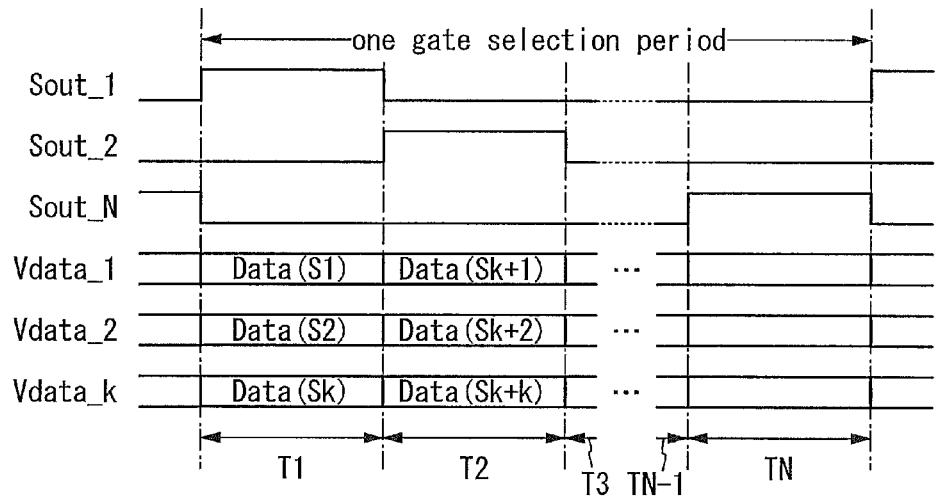

FIGS. 5A and 5B illustrate an example of a structure and operation of a signal line driver circuit including n-channel TFTs.

The signal line driver circuit illustrated in FIG. 5A includes a shift register 5601 and a switching circuit 5602. The switching circuit 5602 includes a plurality of switching circuits 5602_1 to 5602_N (N is a natural number greater than or equal to 2). The switching circuits 5602_1 to 5602_N each include a plurality of thin film transistors 5603_1 to 5603_k (k is a natural number greater than or equal to 2). Here, an example where the thin film transistors 5603_1 to 5603_k are n-channel TFTs is described.

A connection relation of the signal line driver circuit is described using the switching circuit 5602_1 as an example. One of sources and drains of the thin film transistors 5603_1 to 5603_k are electrically connected to wirings 5604_1 to 5604_k, respectively. The other of the sources and the drains of the thin film transistors 5603_1 to 5603_k are electrically connected to the signal lines S1 to Sk, respectively. Gates of the thin film transistors 5603_1 to 5603_k are electrically connected to a wiring 5605_1.

The shift register 5601 has a function of sequentially selecting the switching circuits 5602_1 to 5602_N by sequentially outputting high-level signals to wirings 5605_1 to 5605_N.

The switching circuit 5602_1 has a function of controlling conduction states between the wirings 5604_1 to 5604_k and the signal lines S1 to Sk, respectively, that is, a function of controlling whether potentials of the wirings 5604_1 to 5604_k are supplied to the signal lines S1 to Sk, respectively. Thus, the switching circuit 5602_1 has a function of a selector. Moreover, the thin film transistors 5603_1 to 5603_k have functions of controlling conduction states between the wirings 5604_1 to 5604_k and the signal lines S1 to Sk, respectively, that is, functions of controlling whether potentials of the wirings 5604_1 to 5604_k are supplied to the signal lines Si to Sk, respectively. In this manner, each of the thin film transistors 5603_1 to 5603_k functions as a switch.

Note that video signal data (DATA) is input to each of the wirings 5604_1 to 5604_k. The video signal data (DATA) is an analog signal corresponding to image data or image signals in many cases.

Next, operation of the signal line driver circuit in FIG. 5A is described with reference to a timing chart of FIG. 5B. In FIG. 5B, an example of signals Sout_1 to Sout_N and signals Vdata_1 to Vdata_k is illustrated. The signals Sout_1 to Sout_N are an example of output signals of the shift register 5601, and the signals Vdata_1 to Vdata_k are an example of signals which are input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to pixels which belong to a selected row.

In the periods T1 to TN, the shift register 5601 sequentially outputs high-level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk are electrically connected. At that time, Data (S1) to Data (Sk) are input to the wirings 5604_1 to 5604_k, respectively. The Data (S1) to Data (Sk) are input to pixels in a selected row in first to k-th columns through the thin film transistors 5603_1 to 5603_k, respectively. Thus, in the periods T1 to TN, video signal data (DATA) is sequentially written to the pixels in the selected row every k columns.

By thus writing video signal data (DATA) to pixels every plural columns, the number of video signal data (DATA) or the number of wirings can be reduced. Accordingly, connections to an external circuit can be reduced. By writing video signals to pixels every plural columns, writing time can be extended and insufficient writing of video signals can be prevented.

Note that the shift register which is an embodiment of the present invention can be used as the shift register 5601.

Next, a configuration of a scan line driver circuit is described. The scan line driver circuit includes a shift register. In addition, the scan line driver circuit may include a level shifter, a buffer, or the like in some cases. In the scan line driver circuit, a selection signal is generated by the shift register. The generated selection signal is buffered and amplified by the buffer, and the resulting signal is supplied to a corresponding scan line. Gates of the transistors in pixels of one line are electrically connected to the scan line. Since the transistors in the pixels of one line have to be turned on all at once, a buffer which can supply a large current is used.

As described above, the shift register which is an embodiment of the present invention can be applied to a driver circuit of a semiconductor device. By using the shift register which is an embodiment of the present invention, a display period of a unit image can be extended; thus, power consumption can be reduced in the case where a still image is displayed, for example.

(Embodiment 2)

In this embodiment, an example of thin film transistors which can be applied to transistors included in the logic circuit and the semiconductor device disclosed in this specification.

One embodiment of a semiconductor device and a manufacturing method of the semiconductor device of this embodiment is described with reference to FIGS. 31A and 31B and FIGS. 6A to 6E.

Figure 31A:
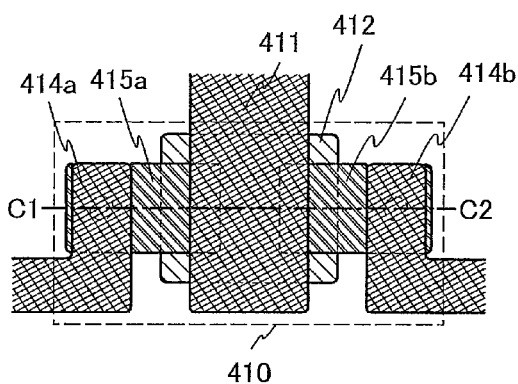
FIGS. 31A and 31B illustrate a semiconductor device.
Figure 31B:
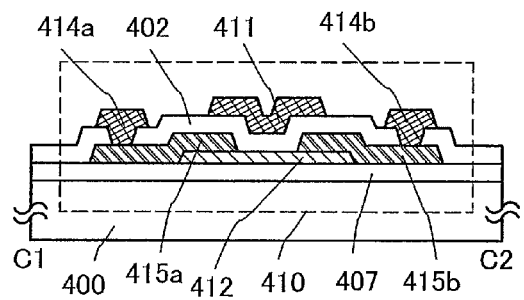

FIGS. 31A and 31B illustrate an example of a planar structure and a cross-sectional structure of a semiconductor device. A thin film transistor 410 illustrated in FIGS. 31A and 31B is one of top gate thin film transistors.

FIG. 31A is a plan view of the thin film transistor 410 having a top-gate structure and FIG. 31B is a cross-sectional view taken along C1-C2 in FIG. 31A.

The thin film transistor 410 includes, over a substrate 400, an insulating layer 407, an oxide semiconductor layer 412, a source or drain electrode layer 415a, a source or drain electrode layer 415b, a gate insulating layer 402, and a gate electrode layer 411. A wiring layer 414a and a wiring layer 414b are provided so as to be in contact with and electrically connected to the source or drain electrode layer 415a and the source or drain electrode layer 415b, respectively.

Although description is given using a single-gate thin film transistor as the thin film transistors 410, a multi-gate thin film transistor including a plurality of channel formation regions may be formed as needed.

A process of manufacturing the thin film transistor 410 over a substrate 400 is described below with reference to FIGS. 6A to 6E.

There is no particular limitation on a substrate that can be used as the substrate 400 having an insulating surface as long as it has at least heat resistance to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that by containing barium oxide (BaO) and boron oxide ($B_2O_3$) so that the amount of BaO is larger than that of $B_2O_3$, a glass substrate is heat-resistant and of more practical use. Therefore, a glass substrate containing BaO than $B_2O_3$ so that the amount of BaO is larger than that of $B_2O_3$ is preferably used.

Note that, instead of the glass substrate described above, a substrate formed using an insulator, such as a ceramic substrate, a quartz substrate, or a sapphire substrate, may be used as the substrate 400. Alternatively, a crystallized glass substrate or the like may be used. Still alternatively, a plastic substrate or the like can be used as appropriate.

First, the insulating layer 407 which serves as a base film is formed over the substrate 400 having an insulating surface. As the insulating layer 407 in contact with the oxide semiconductor layer, an oxide insulating layer such as a silicon oxide layer, a silicon oxynitride layer, an aluminum oxide layer, or an aluminum oxynitride layer is preferably used. Although a plasma CVD method, a sputtering method, or the like can be employed as a method for forming the insulating layer 407, the insulating layer 407 is preferably formed with a sputtering method so that hydrogen is contained in the insulating layer 407 as little as possible.

In this embodiment, a silicon oxide layer is formed as the insulating layer 407 with a sputtering method. The substrate 400 is transferred to a treatment chamber and a sputtering gas from which hydrogen and moisture are removed and which contains high-purity oxygen is introduced, whereby a silicon oxide layer is formed as the insulating layer 407 over the substrate 400 with the use of a silicon target. The substrate 400 may be at a room temperature or may be heated.

For example, a silicon oxide film is formed with an RF sputtering method under the following condition: quartz (preferably, synthetic quartz) is used as a target; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm Note that instead of quartz (preferably, synthetic quartz), a silicon target can be used as a target used when the silicon oxide film is formed. As a sputtering gas, oxygen or a mixed gas of oxygen and argon is used.

In that case, the insulating layer 407 is preferably formed removing moisture remaining in the treatment chamber. This is for preventing hydrogen, a hydroxyl group, and moisture from being contained in the insulating layer 407.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the insulating layer 407 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the insulating layer 407 is formed.

Examples of a sputtering method include an RF sputtering method in which a high-frequency power source is used as a sputtering power source, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or plural kinds of materials can be discharged for film formation at the same time in the same chamber.

In addition, there are a sputtering apparatus provided with a magnet system inside the chamber, which is for a magnetron sputtering method, and a sputtering apparatus which is used for an ECR sputtering method in which plasma produced with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Further, the insulating layer 407 may have a layered structure in which for example, a nitride insulating layer such as a silicon nitride layer, a silicon nitride oxide layer, an aluminum nitride layer, or an aluminum nitride oxide layer and an oxide insulating layer are stacked in this order from the substrate 400 side.

For example, a high-purity sputtering gas from which hydrogen and moisture are removed and which contains nitrogen is introduced and a silicon target is used, whereby a silicon nitride layer is formed between a silicon oxide layer and a substrate. In this case, the silicon nitride layer is preferably formed removing moisture remaining in a treatment chamber, similarly to the silicon oxide layer.

In the case of forming the silicon nitride layer, a substrate may be heated in film formation.

In the case where the stack of the silicon nitride layer and the silicon oxide layer is provided as the insulating layer 407, the silicon nitride layer and the silicon oxide layer can be formed with the use of a common silicon target in the same treatment chamber. After an etching gas containing nitrogen is introduced first, a silicon nitride layer is formed using a silicon target mounted in the treatment chamber, and then, the etching gas is switched to an etching gas containing oxygen and the same silicon target is used to form a silicon oxide layer. Since the silicon nitride layer and the silicon oxide layer can be formed successively without being exposed to the air, impurities such as hydrogen and moisture can be prevented from adsorbing onto a surface of the silicon nitride layer.

Then, an oxide semiconductor film is formed to a thickness of 2 nm to 200 nm inclusive over the insulating layer 407.

Further, in order that hydrogen, a hydroxyl group, and moisture be contained in the oxide semiconductor film as little as possible, it is preferable that the substrate 400 over which the insulating layer 407 is formed be preheated in a preheating chamber of a sputtering apparatus as pretreatment for film formation so that impurities such as hydrogen and moisture adsorbed to the substrate 400 are eliminated. Note that a cryopump is preferable as an evacuation unit provided in the preheating chamber. Note that this preheating treatment may be omitted. Further, this preheating may be similarly performed on the substrate 400 over which the gate insulating layer 402 has not been formed and the substrate 400 over which layers up to the source or drain electrode layer 415a and the source or drain electrode layer 415b have been formed.

Note that before the oxide semiconductor film is formed with a sputtering method, dust attached to a surface of the insulating layer 407 is preferably removed with reverse sputtering in which an argon gas is introduced and plasma is generated. The reverse sputtering refers to a method in which without application of a voltage to the target side, a high frequency power source is used for application of a voltage to the substrate side in an argon atmosphere so that plasma is generated to modify a surface of the substrate. Note that instead of an argon atmosphere, a nitrogen atmosphere, a helium atmosphere, an oxygen atmosphere, or the like may be used.

The oxide semiconductor film is formed with a sputtering method. The oxide semiconductor film is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film is formed with a sputtering method with the use of an In—Ga—Zn—O-based oxide semiconductor film formation target. Further, the oxide semiconductor film can be formed with a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

As a target for forming the oxide semiconductor film with a sputtering method, a metal oxide target containing zinc oxide as its main component can be used. As another example of a metal oxide target, an oxide semiconductor film formation target containing In, Ga, and Zn (in a composition ratio, $In_2O_3:Ga_2O_3:ZnO=1:1:1$ [mol %], In:Ga:Zn=1:1:0.5 [atomic %]) can be used. Alternatively, an oxide semiconductor film formation target containing In, Ga, and Zn (the composition ratio of In:Ga:Zn=1:1:1 or 1:1:2 [atomic %]) may be used. The proportion of the volume of a portion except for an area occupied by a space and the like with respect to the total volume of the oxide semiconductor film formation target formed (also referred to as the fill rate of the oxide semiconductor film formation target) is 90% to 100% inclusive, preferably, 95% to 99.9% inclusive. With the use of the oxide semiconductor film formation target with high fill rate, a dense oxide semiconductor film is formed.

The substrate is held in a treatment chamber kept under reduced pressure, a sputtering gas from which hydrogen and moisture are removed is introduced into the treatment chamber from which remaining moisture is being removed, and the oxide semiconductor film is formed over the substrate 400 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. The substrate may be heated when the oxide semiconductor film is formed.

An example of the deposition condition is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm). It is preferable that a pulsed DC power source be used because powder substances (also referred to as particles or dust) generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected in accordance with a material.

Figure 6A:
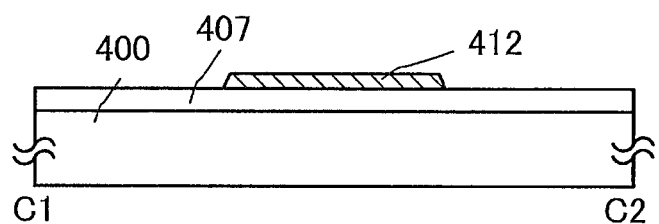
FIGS. 6A to 6E illustrate a method for manufacturing a transistor.
Figure 6B:
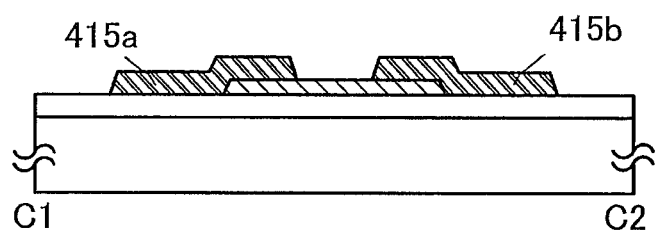

Then, in a first photolithography process, the oxide semiconductor film is processed into an island-shaped oxide semiconductor layer 412 (see FIG. 6A). A resist mask for forming the island-shaped oxide semiconductor layer 412 may be formed with an ink-jet method. When the resist mask is formed with an ink-jet method, a photomask is not used; therefore, manufacturing costs can be reduced.

Note that the etching of the oxide semiconductor film may be dry etching, wet etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on the substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the oxide semiconductor film can be etched to have a desired shape.

In this embodiment, the oxide semiconductor film is processed into the island-shaped oxide semiconductor layer 412 with a wet etching method with a mixed solution of phosphoric acid, acetic acid, and nitric acid as an etchant.

In this embodiment, the oxide semiconductor layer 412 is subjected to first heat treatment. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, the oxide semiconductor layer is obtained. Through the first heat treatment, dehydration or dehydrogenation of the oxide semiconductor layer 412 can be conducted.

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which hardly reacts with an object to be processed due to heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6 N (99.9999%) or more, preferably, 7 N (99.99999%) or more (that is, an impurity concentration is set to 1 ppm or lower, preferably, 0.1 ppm or lower).

Further, the oxide semiconductor layer might be crystallized to be a microcrystalline film or a polycrystalline film depending on a condition of the first heat treatment or a material of the oxide semiconductor layer. For example, the oxide semiconductor layer may be crystallized to become a microcrystalline oxide semiconductor film having a degree of crystallization of 90% or more, or 80% or more. Further, depending on the condition of the first heat treatment and the material of the oxide semiconductor layer, the oxide semiconductor layer may become an amorphous oxide semiconductor film containing no crystalline component. The oxide semiconductor layer might become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

Alternatively, the first heat treatment of the oxide semiconductor layer may be performed on the oxide semiconductor film which has not yet been processed into the island-shaped oxide semiconductor layer. In that case, after the first heat treatment, the substrate is taken out of the heating apparatus and a photolithography process is performed.

The heat treatment having an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a gate insulating layer is formed over the source electrode layer and the drain electrode layer.

Next, a conductive film is formed over the insulating layer 407 and the oxide semiconductor layer 412. The conductive film may be formed with, for example, a sputtering method or a vacuum evaporation method. As the material of the conductive film, there are an element selected from Al, Cr, Cu, Ta, Ti, Mo, or W; an alloy including any of the above elements; an alloy film containing a combination of any of these elements; and the like. Further, one or more materials selected from manganese, magnesium, zirconium, beryllium, and thorium may be used. The conductive film may have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

A second photolithography process is performed. A resist mask is formed over the conductive film and selective etching is performed, so that the source or drain electrode layer 415a and the source or drain electrode layer 415b are formed. Then, the resist mask is removed (see FIG. 6B). Note that the source electrode layer and the drain electrode layer preferably have tapered shapes because coverage with the gate insulating layer stacked thereover can be improved.

In this embodiment, a titanium film is formed to a thickness of 150 nm with a sputtering method for the source or drain electrode layer 415a and the source or drain electrode layer 415b.

Note that materials and etching conditions are adjusted as appropriate so that the oxide semiconductor layer 412 is not removed and the insulating layer 407 under the oxide semiconductor layer 412 is not exposed when the conductive film is etched.

Note that in the second photolithography process, only part of the oxide semiconductor layer 412 is etched, whereby an oxide semiconductor layer having a groove (a depressed portion) might be formed. The resist mask used for forming the source or drain electrode layer 415a and the source or drain electrode layer 415b may be formed with an ink-jet method. When the resist mask is formed with an ink-jet method, a photomask is not used; therefore, manufacturing costs can be reduced.

Ultraviolet, a KrF laser beam, or an ArF laser beam is used for light exposure for forming the resist mask in the second photolithography process. A channel length L of the thin film transistor to be formed later depends on a width of an interval between a bottom portion of the source electrode layer and a bottom portion of the drain electrode layer which are adjacent to each other over the oxide semiconductor layer 412. Note that when light exposure is performed in the case where the channel length L is shorter than 25 nm, extreme ultraviolet with extremely short wavelengths of several nanometers to several tens of nanometers is used for light exposure for forming the resist mask in the second photolithography process. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased, and further, an off current can be significantly small so that low power consumption can be achieved.

Figure 6C:
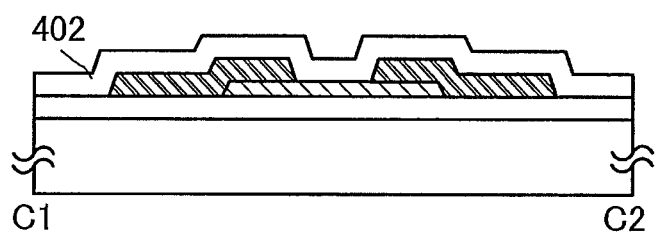
Figure 6D:
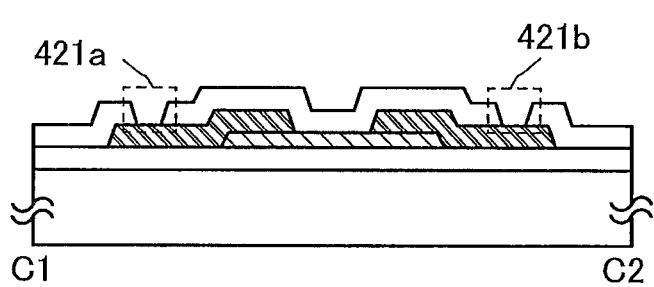

Next, a gate insulating layer 402 is formed over the insulating layer 407, the oxide semiconductor layer 412, the source or drain electrode layer 415a, and the source or drain electrode layer 415b (see FIG. 6C).

The gate insulating layer 402 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. Note that the gate insulating layer 402 is preferably formed with a sputtering method so that the gate insulating layer 402 contains hydrogen as little as possible. In the case where a silicon oxide film is formed with a sputtering method, a silicon target or a quartz target is used as a target and a mixed gas of oxygen and argon is used as a sputtering gas.

The gate insulating layer 402 may have a structure where a silicon oxide layer and a silicon nitride layer are stacked from the side of the source or drain electrode layer 415a and the source or drain electrode layer 415b. For example, a silicon oxide layer ($SiO_x$ (x>0)) with a thickness of 5 nm to 300 nm inclusive is formed as a first gate insulating layer and a silicon nitride layer ($SiN_y$ (y>0)) with a thickness of 50 nm to 200 nm inclusive is stacked as a second gate insulating layer over the first gate insulating layer; thus, the gate insulating layer with a thickness of 100 nm may be formed. In this embodiment, a silicon oxide layer is formed to a thickness of 100 nm with an RF sputtering method under the following condition: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Then, a third photolithography process is performed. A resist mask is formed and selective etching is performed to remove parts of the gate insulating layer 402, so that openings 421a and 421b reaching the source or drain electrode layer 415a and the source or drain electrode layer 415b, respectively, are formed (see FIG. 6D).

Then, after a conductive film is formed over the gate insulating layer 402 and in the openings 421a and 421b, the gate electrode layer 411 and the wiring layers 414a and 414b are formed in a fourth photolithography process. Note that a resist mask may be formed with an ink-jet method. When the resist mask is formed with an ink-jet method, a photomask is not used; therefore, manufacturing costs can be reduced.

Further, the gate electrode layer 411 and the wiring layers 414a and 414b can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of each of the gate electrode layer 411 and the wiring layers 414a and 414b, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer may be formed using a light-transmitting conductive film. A light-transmitting conductive oxide can be given as an example of the light-transmitting conductive film.

In this embodiment, a titanium film is formed to a thickness of 150 nm with a sputtering method for the gate electrode layer 411 and the wiring layers 414a and 414b.

Next, second heat treatment (preferably 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 410.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened.

Figure 6E:
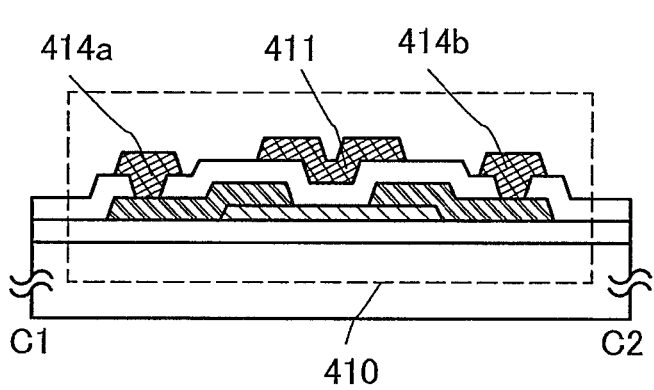

Through the above steps, the thin film transistor 410 including the oxide semiconductor layer 412 in which the concentration of hydrogen, moisture, hydride, or hydroxide is reduced can be formed (see FIG. 6E).

A protective insulating layer or a planarization insulating layer for planarization may be provided over the thin film transistor 410. For example, the protective insulating layer may be formed with a single-layer structure or a layered structure using any of a silicon oxide layer, a silicon nitride layer, a silicon oxynitride layer, a silicon nitride oxide layer, and an aluminum oxide layer.

The planarization insulating layer can be formed using a heat-resistant organic material such as polyimide, an acrylic resin, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films formed using any of these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method of forming the planarization insulating layer, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater.

This embodiment can be implemented in appropriate combination with any of the other embodiments.

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

Thus, the semiconductor device including the thin film transistor having the oxide semiconductor layer can have stable electric characteristics and high reliability.

(Embodiment 3)

In this embodiment, another example of thin film transistors which can be applied to transistors included in the logic circuit and the semiconductor device disclosed in this specification. The same portions as those in Embodiment 2 and portions having functions similar to those of the portions in Embodiment 2 and steps similar to those in Embodiment 2 may be handled as in Embodiment 2, and repeated description is omitted. In addition, detailed description of the same portions is also omitted.

One embodiment of a semiconductor device and a manufacturing method of the semiconductor device of this embodiment is described with reference to FIGS. 7A and 7B and FIGS. 8A to 8E.

Figure 7A:
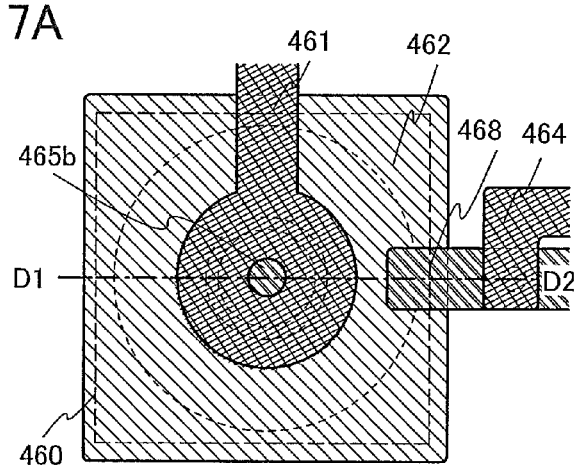
FIGS. 7A and 7B illustrate a transistor.
Figure 7B:
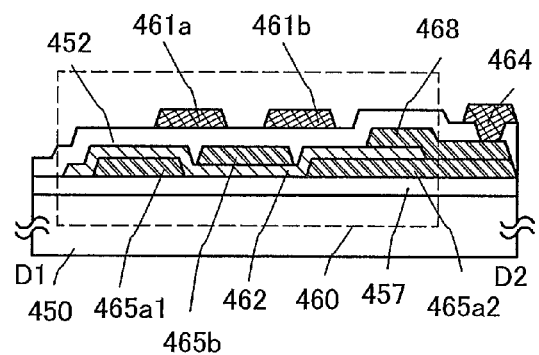

FIGS. 7A and 7B illustrate an example of a planar structure and a cross-sectional structure of a semiconductor device. A thin film transistor 460 illustrated in FIGS. 7A and 7B is one of top gate thin film transistors.

FIG. 7A is a plan view of the thin film transistor 460 having a top-gate structure and FIG. 7B is a cross-sectional view taken along D1-D2 in FIG. 7A.

The thin film transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. Although not illustrated, the source or drain electrode layer 465b is electrically connected to a wiring layer through an opening formed in the gate insulating layer 452.

A process of manufacturing the thin film transistor 460 over the substrate 450 is described below with reference to FIGS. 8A to 8E.

First, the insulating layer 457 which serves as a base film is formed over the substrate 450.

In this embodiment, a silicon oxide layer is formed as the insulating layer 457 with a sputtering method. The substrate 450 is transferred to a treatment chamber and a high-purity sputtering gas from which hydrogen and moisture is removed and which contains oxygen is introduced, whereby a silicon oxide layer is formed as the insulating layer 457 over the substrate 450 with the use of a silicon target or a quartz (preferably synthetic quartz). As a sputtering gas, oxygen or a mixed gas of oxygen and argon is used.

For example, a silicon oxide film is formed with an RF sputtering method under the following condition: the purity of a sputtering gas is 6N; quartz (preferably, synthetic quartz) is used; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (the flow ratio of oxygen to argon is 1:1 (each flow rate is 25 sccm). The thickness of the silicon oxide film is 100 nm. Note that instead of quartz (preferably, synthetic quartz), a silicon target can be used as a target used when the silicon oxide film is formed.

In that case, the insulating layer 457 is preferably formed removing moisture remaining in the treatment chamber. This is for preventing hydrogen, a hydroxyl group, and moisture from being contained in the insulating layer 457. In the deposition chamber which is evacuated with a cryopump, a hydrogen atom, a compound containing a hydrogen atom, such as water ($H_2O$), and the like are removed, whereby the concentration of an impurity in the insulating layer 457 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the insulating layer 457 is formed.

Further, the insulating layer 457 may have a layered structure in which for example, a nitride insulating layer such as a silicon nitride layer, a silicon nitride oxide layer, an aluminum nitride layer, or an aluminum nitride oxide layer and an oxide insulating layer are stacked in this order from the substrate 450 side.

For example, a high-purity sputtering gas from which hydrogen and moisture are removed and which contains nitrogen is introduced and a silicon target is used, whereby a silicon nitride layer is formed between a silicon oxide layer and a substrate. In this case, the silicon nitride layer is preferably formed removing remaining moisture in a treatment chamber, similarly to the silicon oxide layer.

Next, a conductive film is formed over the insulating layer 457 and a first photolithography process is performed. A resist mask is formed over the conductive film and selective etching is performed, so that the source or drain electrode layer 465a1 and 465a2 is formed. Then, the resist mask is removed (see FIG. 8A). It seems in cross section as if the source or drain electrode layer 465a1 and 465a2 is divided; however, the source or drain electrode layer 465a1 and 465a2 is a continuous film. Note that the source electrode layer and the drain electrode layer preferably have tapered shapes because coverage with the gate insulating layer stacked thereover can be improved.

As the material of the source or drain electrode layer 465a1 and 465a2, there are an element selected from Al, Cr, Cu, Ta, Ti, Mo, or W; an alloy including any of the above elements; an alloy film containing a combination of any of these elements; and the like. Further, one or more materials selected from manganese, magnesium, zirconium, beryllium, and thorium may be used. The conductive film may have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

In this embodiment, a titanium film is formed to a thickness of 150 nm with a sputtering method for the source or drain electrode layer 465a1 and 465a2.

Then, an oxide semiconductor film is formed to a thickness of 2 nm to 200 nm inclusive over the gate insulating layer 452.

Figure 8A:
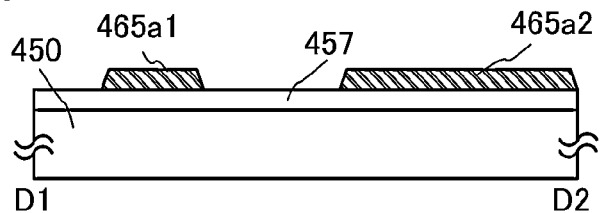
FIGS. 8A to 8E illustrate a method for manufacturing a transistor.
Figure 8B:
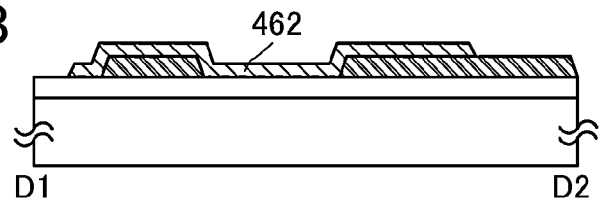
Figure 8C:
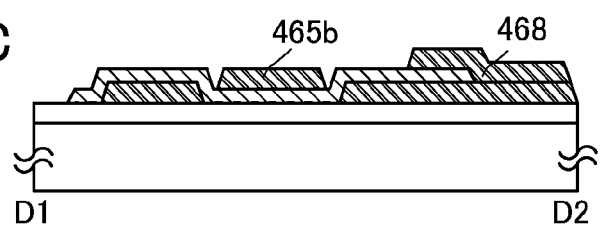
Figure 8D:
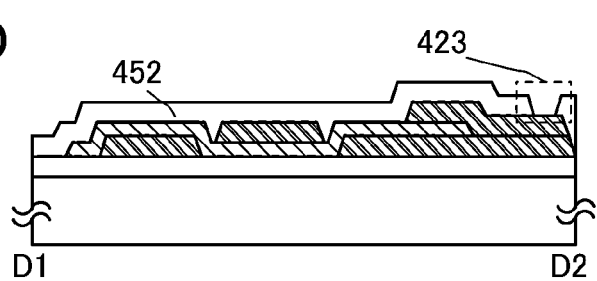

Then, an oxide semiconductor film is formed and in a second photolithography process, the oxide semiconductor film is processed into an island-shaped oxide semiconductor layer 462 (see FIG. 8B). In this embodiment, the oxide semiconductor film is formed with a sputtering method with the use of an In—Ga—Zn—O-based oxide semiconductor film formation target.

The substrate is held in a treatment chamber kept under reduced pressure, a sputtering gas from which hydrogen and moisture are removed is introduced into the treatment chamber from which remaining moisture is being removed, and the oxide semiconductor film is deposited over the substrate 450 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced. The substrate may be heated when the oxide semiconductor film is formed.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

An example of the deposition condition is as follows: the substrate temperature is room temperature, the distance between the substrate and the target is 60 mm, the pressure is 0.4 Pa, the DC power is 0.5 kW, and the atmosphere is an atmosphere containing oxygen and argon (the flow ratio of oxygen to argon is 15 sccm:30 sccm). It is preferable that a pulsed DC power source be used because powder substances (also referred to as particles or dust) generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected in accordance with a material.

In this embodiment, the oxide semiconductor film is processed into the island-shaped oxide semiconductor layer 462 with a wet etching method with a mixed solution of phosphoric acid, acetic acid, and nitric acid as an etchant.

Next, the oxide semiconductor layer 462 is subjected to first heat treatment. The temperature for the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, the oxide semiconductor layer is obtained. Through the first heat treatment, dehydration or dehydrogenation of the oxide semiconductor layer 462 can be conducted.

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6 N (99.9999%) or more, preferably, 7 N (99.99999%) or more (that is, an impurity concentration is set to 1 ppm or lower, preferably, 0.1 ppm or lower).

Further, the oxide semiconductor layer might be crystallized to be a microcrystalline film or a polycrystalline film depending on a condition of the first heat treatment or a material of the oxide semiconductor layer.

Alternatively, the first heat treatment of the oxide semiconductor layer may be performed on the oxide semiconductor film which has not yet been processed into the island-shaped oxide semiconductor layer. In that case, after the first heat treatment, the substrate is taken out of the heating apparatus and a photolithography process is performed.

The heat treatment has an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a gate insulating layer is formed over the source electrode layer and the drain electrode layer.

Next, a conductive film is formed over the insulating layer 457 and the oxide semiconductor layer 462 and a third photolithography process is performed. A resist mask is formed over the conductive film and selective etching is performed, so that the source or drain electrode layer 465*b* and the wiring layer 468 are formed. Then, the resist mask is removed (see FIG. 8C). The source or drain electrode layer 465*b* and the wiring layer 468 may be formed using a material and steps similar to those of the source or drain electrode layer 465*a*1 and 465*a*2.

In this embodiment, a titanium film is formed to a thickness of 150 nm with a sputtering method for the source or drain electrode layer 465*b* and the wiring layer 468. In this embodiment, the same titanium film is used for the source or drain electrode layer 465*a*1 and 465*a*2 and the source or drain electrode layer 465*b*, so that the etching rate of the source or drain electrode layer 465*a*1 and 465*a*2 is the same as or substantially the same as that of the source or drain electrode layer 465*b*. Therefore, the wiring layer 468 is provided over a portion of the source or drain electrode layer 465*a*2, which is not covered with the oxide semiconductor layer 462, to prevent the source or drain electrode layer 465*a*1 and 465*a*2 from being etched when the source or drain electrode layer 465*b* is etched. In the case of using different materials which provide high selectivity ratio of the source or drain electrode layer 465*b* to the source or drain electrode layer 465*a*1 and 465*a*2 in the etching step, the wiring layer 468 which protects the source or drain electrode layer 465*a*2 in etching is not necessarily provided.

Note that materials and etching conditions are adjusted as appropriate so that the oxide semiconductor layer 462 is not removed when the conductive film is etched.

Note that in the third photolithography process, only part of the oxide semiconductor layer 462 is etched, whereby an oxide semiconductor layer having a groove (a depressed portion) might be formed. The resist mask used for forming the source or drain electrode layer 465*b* and the wiring layer 468 may be formed with an ink-jet method. When the resist mask is formed with an ink-jet method, a photomask is not used; therefore, manufacturing costs can be reduced.

Next, a gate insulating layer 452 is formed over the insulating layer 457, the oxide semiconductor layer 462, the source or drain electrode layer 465a1 and 465a2, the source or drain electrode layer 465b, and the wiring layer 468.

The gate insulating layer 452 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. Note that the gate insulating layer 452 is preferably formed with a sputtering method so that the gate insulating layer 452 contains hydrogen as little as possible. In the case where a silicon oxide film is formed with a sputtering method, a silicon target or a quartz target is used as a target and a mixed gas of oxygen and argon is used as a sputtering target.

The gate insulating layer 452 may have a structure where a silicon oxide layer and a silicon nitride layer are stacked from the side of the source or drain electrode layer 465a1 and 465a2 and the source or drain electrode layer 465b. In this embodiment, a silicon oxide layer is formed to a thickness of 100 nm with an RF sputtering method under the following condition: the pressure is 0.4 Pa; the high frequency power is 1.5 kW; and the atmosphere is an atmosphere containing oxygen and argon (the flow ratio of oxygen to argon is 1:1 (each flow rate is 25 sccm).

Next, a fourth photolithography process is performed. A resist mask is formed and selective etching is performed to remove part of the gate insulating layer 452, so that an opening 423 reaching a wiring layer 438 is formed (see FIG. 8D). Although not illustrated, in forming the opening 423, an opening reaching the source or drain electrode layer 465b may be formed. In this embodiment, the opening reaching the source or drain electrode layer 465b is formed after an interlayer insulating layer is further stacked, and a wiring layer for electrical connection is formed in the opening.

Then, after a conductive film is formed over the gate insulating layer 452 and in the opening 423, the gate electrode layer 461 (461a and 461b) and the wiring layer 464 are formed in a fifth photolithography process. Note that a resist mask may be formed with an ink-jet method. When the resist mask is formed with an ink-jet method, a photomask is not used; therefore, manufacturing costs can be reduced.

Further, the gate electrode layer 461 (461a and 461b) and the wiring layer 464 can be formed with a single-layer structure or a layered structure using any of metal materials such as molybdenum, titanium, chromium, tantalum, tungsten, aluminum, copper, neodymium, and scandium, and an alloy material including any of these materials as a main component.

In this embodiment, a titanium film is formed to a thickness of 150 nm with a sputtering method for the gate electrode layer 461 (461a and 461b) and the wiring layer 464.

Next, second heat treatment (preferably 200° C. to 400° C. inclusive, for example, from 250° C. to 350° C. inclusive) is performed in an inert gas atmosphere or an oxygen gas atmosphere. In this embodiment, the second heat treatment is performed in a nitrogen atmosphere at 250° C. for one hour. The second heat treatment may be performed after a protective insulating layer or a planarization insulating layer is formed over the thin film transistor 410.

Further, heat treatment may be performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened.

Figure 8E:
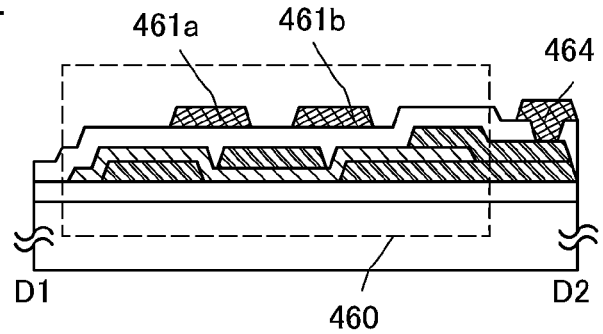

Through the above steps, the thin film transistor 460 including the oxide semiconductor layer 462 in which the concentration of hydrogen, moisture, hydride, or hydroxide is reduced can be formed (see FIG. 8E).

A protective insulating layer or a planarization insulating layer for planarization may be provided over the thin film transistor 460. Although not illustrated, an opening reaching the source or drain electrode layer 465b may be formed. In this embodiment, the opening reaching the source or drain electrode layer 465b is formed in the gate insulating layer 452, the protective insulating layer, and the planarization layer, and a wiring layer for electrical connection to the source or drain electrode layer 465b is formed in the opening.

This embodiment can be implemented in appropriate combination with any of the other embodiments.

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

Thus, the semiconductor device including the thin film transistor having the oxide semiconductor layer can have stable electric characteristics and high reliability.

(Embodiment 4)

In this embodiment, another example of thin film transistors which can be applied to transistors included in the logic circuit and the semiconductor device disclosed in this specification. The same portions as those in Embodiment 2 and portions having functions similar to those of the portions in Embodiment 2 and steps similar to those in Embodiment 2 may be handled as in Embodiment 2, and repeated description is omitted. In addition, detailed description of the same portions is also omitted. Thin film transistors 425 and 426 described in this embodiment can be used as thin film transistors included in the logic circuit and the semiconductor device in Embodiment 1.

The thin film transistors of this embodiment are described with reference to FIGS. 9A and 9B.

Figure 9A:
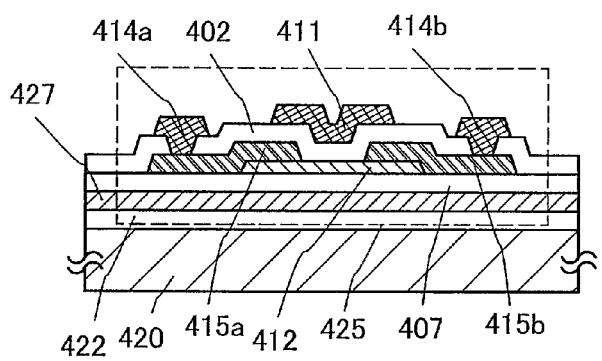
FIGS. 9A and 9B each illustrate a transistor.
Figure 9B:
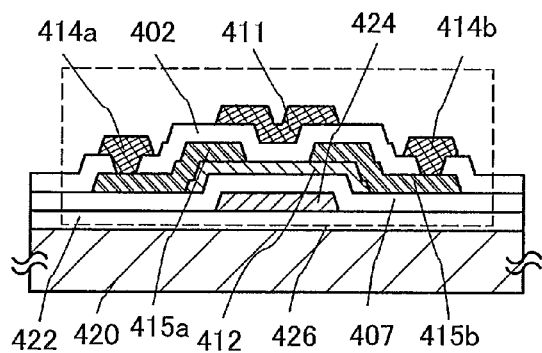

FIGS. 9A and 9B illustrate examples of cross-sectional structures of the thin film transistors. The thin film transistors 425 and 426 in FIGS. 9A and 9B are each one of thin film transistors where an oxide semiconductor layer is sandwiched between a conductive layer and a gate electrode layer.

In addition, in FIGS. 9A and 9B, a silicon substrate is used as a substrate and the thin film transistors 425 and 426 are provided over an insulating layer 422 which is formed over a silicon substrate 420.

In FIG. 9A, a conductive layer 427 is formed between the insulating layer 422 and the insulating layer 407 over the silicon substrate 420 so as to overlap with at least the whole oxide semiconductor layer 412.

Note that FIG. 9B illustrates an example where the conductive layer between the insulating layer 422 and the insulating layer 407 is processed like the conductive layer 424 by etching and overlaps with part of the oxide semiconductor layer 412, which includes at least a channel formation region.

The conductive layers 427 and 424 may each be formed using a metal material which can resist temperature for heat treatment to be performed in a later step: an element selected from titanium (Ti), tantalum (Ta), tungsten (W), molybdenum (Mo), chromium (Cr), neodymium (Nd), and scandium (Sc), an alloy containing any of the above elements as its component, an alloy film containing a combination of any of these elements, a nitride containing any of the above elements as its component, or the like. Further, the conductive layers 427 and 424 may each have either a single-layer structure or a layered structure, and for example, a single layer of a tungsten layer or a stack of a tungsten nitride layer and a tungsten layer can be used.

A potential of the conductive layers 427 and 424 may be the same as or different from that of the gate electrode layer 411 of the thin film transistors 425 and 426. The conductive layers 427 and 424 can each also function as a second gate electrode layer. The potential of the conductive layers 427 and 424 may be a fixed potential such as GND or 0 V.

Electric characteristics of the thin film transistors 425 and 426 can be controlled by the conductive layers 427 and 424.

This embodiment can be implemented in appropriate combination with any of the other embodiments.
(Embodiment 5)

In this embodiment, an example of thin film transistors which can be applied to transistors included in the logic circuit and the semiconductor device disclosed in this specification.

One embodiment of a thin film transistor and a manufacturing method of the thin film transistor of this embodiment is described with reference to FIGS. 10A to 10E.

FIGS. 10A to 10E illustrate an example of a cross-sectional structure of a thin film transistor. A thin film transistor 390 illustrated in FIGS. 10A to 10E is one of bottom gate thin film transistors and is also referred to as an inverted staggered thin film transistor.

Although description is given using a single-gate thin film transistor as the thin film transistor 390, a multi-gate thin film transistor including a plurality of channel formation regions may be formed as needed.

A process of manufacturing the thin film transistor 390 over a substrate 394 is described below with reference to FIGS. 10A to 10E.

First, after a conductive film is formed over the substrate 394 having an insulating surface, a gate electrode layer 391 is formed in a first photolithography process. The gate electrode layer preferably has a tapered shape because coverage with a gate insulating layer stacked thereover can be improved. Note that a resist mask may be formed with an ink-jet method. When the resist mask is formed with an ink-jet method, a photomask is not used; therefore, manufacturing costs can be reduced.

There is no particular limitation on a substrate that can be used as the substrate 394 having an insulating surface as long as it has at least heat resistance to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that in general, by containing a larger amount of barium oxide (BaO) than boron oxide, a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate 394. Alternatively, a crystallized glass substrate or the like may be used. Still alternatively, a plastic substrate or the like can be used as appropriate.

An insulating film serving as a base film may be provided between the substrate 394 and the gate electrode layer 391. The base film has a function of preventing diffusion of an impurity element from the substrate 394, and can be formed with a single-layer structure or a layered structure using any of a silicon nitride film, a silicon oxide film, a silicon nitride oxide film, and a silicon oxynitride film.

Further, the gate electrode layer 391 can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of the gate electrode layer 391, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable. Note that the gate electrode layer may be formed using a light-transmitting conductive film. A light-transmitting conductive oxide can be given as an example of the light-transmitting conductive film.

Then, the gate insulating layer 397 is formed over the gate electrode layer 391.

The gate insulating layer 397 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. Note that the gate insulating layer 397 is preferably formed with a sputtering method so that the gate insulating layer 397 contains hydrogen as little as possible. In the case where a silicon oxide film is formed with a sputtering method, a silicon target or a quartz target is used as a target and a mixed gas of oxygen and argon is used as a sputtering gas.

The gate insulating layer 397 may have a structure where a silicon nitride layer and a silicon oxide layer are stacked from the gate electrode layer 391 side. For example, a silicon nitride layer ($SiN_y$ (y>0)) with a thickness of 50 nm to 200 nm inclusive is formed with a sputtering method as a first gate insulating layer and a silicon oxide layer ($SiO_x$ (x>0)) with a thickness of 5 nm to 300 nm inclusive is stacked as a second gate insulating layer over the first gate insulating layer; thus, the gate insulating layer with a thickness of 100 nm may be formed.

Further, in order that hydrogen, a hydroxyl group, and moisture might be contained in the gate insulating layer 397 and the oxide semiconductor film 393 as little as possible, it is preferable that the substrate 394 over which the gate electrode layer 391 is formed or the substrate 394 over which layers up to the gate insulating layer 397 are formed be preheated in a preheating chamber of a sputtering apparatus as pretreatment for film formation so that impurities such as hydrogen and moisture adsorbed to the substrate 394 is eliminated. The temperature for the preheating is 100° C. to 400° C. inclusive, preferably 150° C. to 300° C. inclusive. Note that a cryopump is preferable as an evacuation unit provided in the preheating chamber. Note that this preheating treatment may be omitted. Further, this preheating may be similarly performed on the substrate 394 over which layers up to a source electrode layer 395a and a drain electrode layer 395b have been formed, before formation of the oxide insulating layer 396.

Figure 10A:
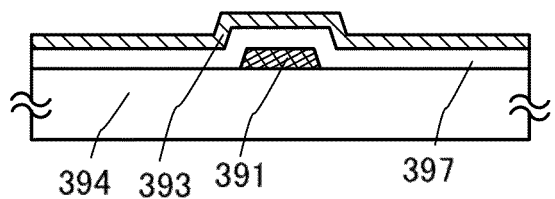
FIGS. 10A to 10E illustrate a method for manufacturing a transistor.

Then, an oxide semiconductor film 393 is formed to a thickness of 2 nm to 200 nm inclusive over the gate insulating layer 397 (see FIG. 10A).

Note that before the oxide semiconductor film 393 is formed with a sputtering method, dust attached to a surface of the gate insulating layer 397 is preferably removed with reverse sputtering in which an argon gas is introduced and plasma is generated.

The oxide semiconductor film 393 is formed with a sputtering method. The oxide semiconductor film 393 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 393 is formed with a sputtering method with the use of an In—Ga—Zn—O-based oxide semiconductor film formation target. Further, the oxide semiconductor film 393 can be formed with a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation.

As a target for forming the oxide semiconductor film 393 with a sputtering method, a metal oxide target containing zinc oxide as its main component can be used. As another example of a metal oxide target, an oxide semiconductor film formation target containing In, Ga, and Zn (in a composition ratio, $In_2O_3:Ga_2O_3:ZnO=1:1:1$ [mol %], In:Ga:Zn=1:1:0.5 [atomic %]) can be used. Alternatively, an oxide semiconductor film formation target containing In, Ga, and Zn (the composition ratio of In:Ga:Zn=1:1:1 or 1:1:2 [atomic %]) may be used. The fill rate of the oxide semiconductor film formation target is 90% to 100% inclusive, preferably, 95% to 99.9% inclusive. With the use of the oxide semiconductor film formation target with high fill rate, a dense oxide semiconductor film is formed.

The substrate is held in a treatment chamber kept under reduced pressure, and the substrate is heated to room temperature or a temperature of lower than 400° C. Then, a sputtering gas from which hydrogen and moisture are removed is introduced into the treatment chamber from which remaining moisture is being removed, and the oxide semiconductor film 393 is formed over the substrate 394 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

An example of the deposition condition is as follows: the distance between the substrate and the target is 60 mm, the pressure is 0.6 Pa, the DC power is 0.5 kW, and the atmosphere is an oxygen atmosphere (the flow rate of oxygen is 100%). It is preferable that a pulsed DC power source be used because powder substances generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected in accordance with a material.

Figure 10B:
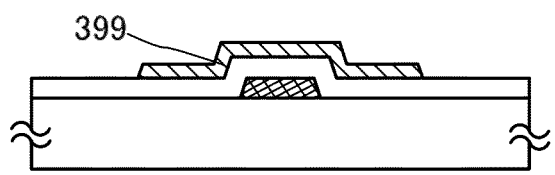
Figure 10C:
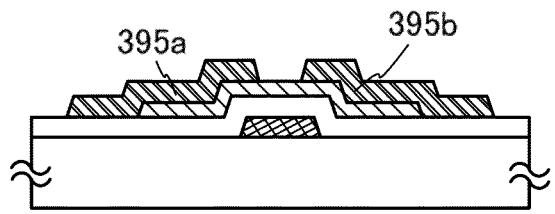

Then, in a second photolithography process, the oxide semiconductor film is processed into an island-shaped oxide semiconductor layer 399 (see FIG. 10B). A resist mask for forming the island-shaped oxide semiconductor layer 399 may be formed with an ink-jet method. When the resist mask is formed with an ink-jet method, a photomask is not used; therefore, manufacturing costs can be reduced.

In forming the oxide semiconductor layer 399, a contact hole can be formed in the gate insulating layer 397.

Note that the etching of the oxide semiconductor film 393 may be dry etching, wet etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on the substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO07N (produced by KANTO CHEMICAL CO., INC.) may be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the oxide semiconductor film can be etched to have a desired shape.

Note that it is preferable to perform reverse sputtering before formation of a conductive film in the following step so that a resist residue and the like attached to surfaces of the oxide semiconductor layer 399 and the gate insulating layer 397 can be removed.

Next, a conductive film is formed over the gate insulating layer 397 and the oxide semiconductor layer 399. The conductive film may be formed with a sputtering method or a vacuum evaporation method. As the material of the conductive film, there are an element selected from Al, Cr, Cu, Ta, Ti, Mo, or W; an alloy including any of the above elements; an alloy film containing a combination of any of these elements;

and the like. Further, one or more materials selected from manganese, magnesium, zirconium, beryllium, and thorium may be used. The conductive film may have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

A third photolithography process is performed. A resist mask is formed over the conductive film and selective etching is performed, so that the source electrode layer 395a and the drain electrode layer 395b are formed. Then, the resist mask is removed (see FIG. 10C).

Ultraviolet, a KrF laser beam, or an ArF laser beam is used for light exposure for forming the resist mask in the third photolithography process. A channel length L of the thin film transistor to be formed later depends on a width of an interval between a bottom portion of the source electrode layer and a bottom portion of the drain electrode layer which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased, and further, an off current is significantly small, so that low power consumption can be achieved.

Note that materials and etching conditions are adjusted as appropriate so that the oxide semiconductor layer 399 is not removed when the conductive film is etched.

Note that in the third photolithography process, only part of the oxide semiconductor layer 399 is etched, whereby an oxide semiconductor layer having a groove (a depressed portion) might be formed. The resist mask used for forming the source electrode layer 395a and the drain electrode layer 395b may be formed with an ink-jet method. When the resist mask is formed with an ink-jet method, a photomask is not used; therefore, manufacturing costs can be reduced.

To reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Thus, a resist mask corresponding to at least two kinds of different patterns can be formed by using a multi-tone mask. Accordingly, the number of light-exposure masks can be reduced and the number of corresponding photolithography steps can be also reduced, whereby simplification of a process can be realized.

With plasma treatment with a gas such as $N_2O$, $N_2$, or Ar, water adsorbed to a surface of an exposed portion of the oxide semiconductor layer may be removed. Alternatively, plasma treatment may be performed using a mixed gas of oxygen and argon.

Figure 10D:
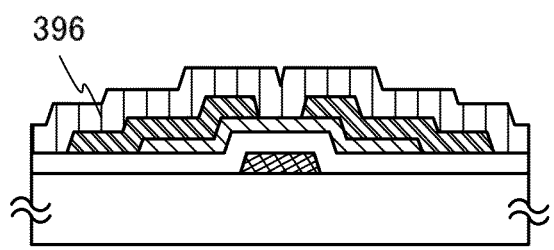

In the case of performing the plasma treatment, the oxide insulating layer 396 is formed without exposure to the air as an oxide insulating layer which serves as a protective insulating film and is in contact with part of the oxide semiconductor layer (see FIG. 10D). In this embodiment, the oxide insulating layer 396 is formed in contact with the oxide semiconductor layer 399 in a region where the oxide semiconductor layer 399 does not overlap with the source electrode layer 395a and the drain electrode layer 395b.

In this embodiment, the substrate 394 over which layers up to the island-shaped oxide semiconductor layer 399, the source electrode layer 395a, the drain electrode layer 395b have been formed is heated to room temperature or a temperature of lower than 100° C. and a sputtering gas from which hydrogen and moisture are removed and which contains high-purity oxygen is introduced, and a silicon semiconductor target is used, whereby a silicon oxide layer having a defect is formed as the oxide insulating layer 396.

For example, the silicon oxide layer is formed with a pulsed DC sputtering method in which the purity of a sputtering gas is 6N, a boron-doped silicon target (the resistivity is 0.01 $\Omega$cm) is used, the distance between the substrate and the target (T-S distance) is 89 mm, the pressure is 0.4 Pa, the DC power is 6 kW, and the atmosphere is an oxygen atmosphere (the oxygen flow rate is 100%). The thickness of the silicon oxide film is 300 nm Note that instead of a silicon target, quartz (preferably, synthetic quartz) can be used as a target used when the silicon oxide film is formed. As a sputtering gas, oxygen or a mixed gas of oxygen and argon is used.

In that case, the oxide insulating layer 396 is preferably formed removing moisture remaining in the treatment chamber. This is for preventing hydrogen, a hydroxyl group, and moisture from being contained in the oxide semiconductor layer 399 and the oxide insulating layer 396.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 396 formed in the deposition chamber can be reduced.

Note that as the oxide insulating layer 396, a silicon oxynitride layer, an aluminum oxide layer, an aluminum oxynitride layer, or the like may be used instead of the silicon oxide layer.

Further, heat treatment may be performed at 100° C. to 400° C. while the oxide insulating layer 396 and the oxide semiconductor layer 399 are in contact with each other. Since the oxide insulating layer 396 in this embodiment has a lot of defects, with this heat treatment, an impurity such as hydrogen, moisture, a hydroxyl group, or hydride contained in the oxide semiconductor layer 399 can be diffused to the oxide insulating layer 396 so that the impurity in the oxide semiconductor layer 399 can be further reduced.

Figure 10E:
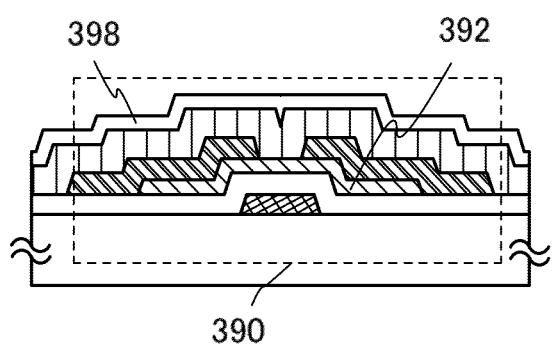

Through the above steps, the thin film transistor 390 including the oxide semiconductor layer 392 in which the concentration of hydrogen, moisture, hydride, or hydroxide is reduced can be formed (see FIG. 10E).

Moisture remaining in a reaction atmosphere is removed as described above in forming the oxide semiconductor film, whereby the concentration of hydrogen and hydride in the oxide semiconductor film can be reduced. Accordingly, the oxide semiconductor film can be stable.

A protective insulating layer may be provided over the oxide insulating layer. In this embodiment, the protective insulating layer 398 is formed over the oxide insulating layer 396. As the protective insulating layer 398, a silicon nitride layer, a silicon nitride oxide layer, an aluminum nitride layer, an aluminum nitride oxide layer, or the like is used.

The substrate 394 over which layers up to the oxide insulating layer 396 have been formed is heated to a temperature of 100° C. to 400° C., a sputtering gas from which hydrogen and moisture are removed and which contains high-purity nitrogen is introduced, and a silicon semiconductor target is used, whereby a silicon nitride layer is formed as the protective insulating layer 398. In this case, the protective insulating layer 398 is preferably formed removing moisture remaining in a treatment chamber, similarly to the oxide insulating layer 396.

In the case where the protective insulating layer 398 is formed, the substrate 394 is heated to 100° C. to 400° C. in forming the protective insulating layer 398, whereby hydrogen or water contained in the oxide semiconductor layer can be diffused to the oxide insulating layer. In that case, heat treatment is not necessarily performed after formation of the oxide insulating layer 396.

In the case where the silicon oxide layer is formed as the oxide insulating layer 396 and the silicon nitride layer is stacked thereover as the protective insulating layer 398, the silicon oxide layer and the silicon nitride layer can be formed with the use of a common silicon target in the same treatment chamber. After a sputtering gas containing oxygen is introduced first, a silicon oxide layer is formed using a silicon target mounted in the treatment chamber, and then, the sputteringgas is switched to a sputtering gas containing nitrogen and the same silicon target is used to form a silicon nitride layer. Since the silicon oxide layer and the silicon nitride layer can be formed successively without being exposed to the air, impurities such as hydrogen and moisture can be prevented from adsorbing onto a surface of the silicon oxide layer. In that case, after the silicon oxide layer is formed as the oxide insulating layer 396 and the silicon nitride layer is stacked thereover as the protective insulating layer 398, heat treatment (at a temperature of 100° C. to 400° C.) for diffusing hydrogen or moisture contained in the oxide semiconductor layer to the oxide insulating layer is preferably performed.

After the protective insulating layer is formed, heat treatment may be further performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened. With this heat treatment, the thin film transistor can be normally off. Therefore, reliability of the thin film transistor can be improved.

Moisture remaining in a reaction atmosphere is removed in forming the oxide semiconductor layer including a channel formation region over the gate insulating layer, whereby the concentration of hydrogen and hydride in the oxide semiconductor layer can be reduced.

The above steps can be used for manufacture of backplanes (substrates over which thin film transistors are formed) of liquid crystal display panels, electroluminescent display panels, display devices using electronic ink, or the like. Since the above steps can be performed at a temperature of 400° C. or lower, they can also be applied to manufacturing steps where a glass substrate with a thickness of 1 mm or smaller and a side of longer than 1 m. In addition, all of the above steps can be performed at a treatment temperature of 400° C. or lower, display panels can be manufactured without consuming much energy.

This embodiment can be implemented in appropriate combination with any of the other embodiments.

Thus, the thin film transistor including the oxide semiconductor layer can have stable electric characteristics and high reliability.

(Embodiment 6)

In this embodiment, an example of thin film transistors which can be applied to transistors included in the logic circuit and the semiconductor device disclosed in this specification.

One embodiment of a thin film transistor and a manufacturing method of the thin film transistor of this embodiment is described with reference to FIGS. 11A to 11E.

FIGS. 11A to 11E illustrate an example of a cross-sectional structure of a thin film transistor. A thin film transistor 310 illustrated in FIGS. 11A to 11E is one of bottom gate thin film transistors and is also referred to as an inverted staggered thin film transistor.

Although description is given using a single-gate thin film transistor as the thin film transistor 310, a multi-gate thin film transistor including a plurality of channel formation regions may be formed as needed.

A process of manufacturing the thin film transistor 410 over a substrate 300 is described below with reference to FIGS. 11A to 11E.

First, after a conductive film is formed over the substrate 300 having an insulating surface, a gate electrode layer 311 is formed in a first photolithography process. Note that a resist mask may be formed with an ink-jet method. When the resist mask is formed with an ink-jet method, a photomask is not used; therefore, manufacturing costs can be reduced.

There is no particular limitation on a substrate that can be used as the substrate 300 having an insulating surface as long as it has at least heat resistance enough to withstand heat treatment performed later. A glass substrate formed using barium borosilicate glass, aluminoborosilicate glass, or the like can be used.

When the temperature of the heat treatment performed later is high, a substrate having a strain point of 730° C. or higher is preferably used as the glass substrate. As a material of the glass substrate, a glass material such as aluminosilicate glass, aluminoborosilicate glass, or barium borosilicate glass is used, for example. Note that by containing a larger amount of barium oxide (BaO) than boron oxide ($B_2O_3$), a glass substrate is heat-resistant and of more practical use. Therefore, a glass substrate containing a larger amount of BaO than $B_2O_3$ is preferably used.

Note that, instead of the glass substrate described above, a substrate formed using an insulator such as a ceramic substrate, a quartz substrate, or a sapphire substrate may be used as the substrate 300. Alternatively, a crystallized glass substrate or the like may be used.

An insulating film serving as a base film may be provided between the substrate 300 and the gate electrode layer 311. The base film has a function of preventing diffusion of an impurity element from the substrate 300, and can be formed with a single-layer structure or a layered structure using any of a silicon nitride film, a silicon oxide film, a silicon nitride oxide film, and a silicon oxynitride film.

Further, the gate electrode layer 311 can be formed with a single-layer structure or a layered structure using any of metal materials such as molybdenum, titanium, chromium, tantalum, tungsten, aluminum, copper, neodymium, and scandium, and an alloy material including any of these materials as a main component.

As a two-layer structure of the gate electrode layer 311, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure in which a titanium nitride layer and a molybdenum layer are stacked, or a two-layer structure in which a tungsten nitride layer and a tungsten layer are stacked is preferable. As a three-layer structure, a stack of a tungsten layer or a tungsten nitride layer, an alloy layer of aluminum and silicon or an alloy layer of aluminum and titanium, and a titanium nitride layer or a titanium layer is preferable.

Then, the gate insulating layer 302 is formed over the gate electrode layer 311.

The gate insulating layer 302 can be formed with a single-layer structure or a layered structure using any of a silicon oxide layer, a silicon nitride layer, a silicon oxynitride layer, a silicon nitride oxide layer, and an aluminum oxide layer with a plasma CVD method, a sputtering method, or the like. For example, a silicon oxynitride layer may be formed with a plasma CVD method with $SiH_4$, oxygen, and nitrogen for a deposition gas. For example, the thickness of the gate insulating layer 302 is 100 nm to 500 nm inclusive, and in the case where the gate insulating layer 302 has a layered structure, a second gate insulating layer with a thickness of 5 nm to 300 nm inclusive is stacked over a first gate insulating layer with a thickness of 50 nm to 200 nm inclusive, for example.

In this embodiment, a silicon oxynitride layer having a thickness of smaller than or equal to 100 nm is formed as the gate insulating layer 302 with a plasma CVD method.

Then, an oxide semiconductor film 330 is formed to a thickness of 2 nm to 200 nm inclusive over the gate insulating layer 302.

Note that before the oxide semiconductor film 330 is formed with a sputtering method, dust attached to a surface of the gate insulating layer 302 is preferably removed with reverse sputtering in which an argon gas is introduced and plasma is generated. Note that instead of an argon atmosphere, a nitrogen atmosphere, a helium atmosphere, an oxygen atmosphere, or the like may be used.

Figure 11A:
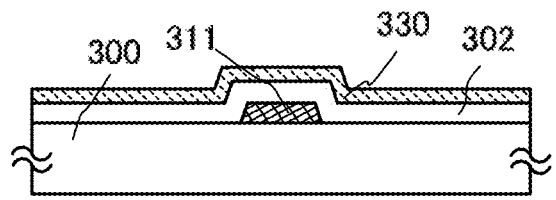
FIGS. 11A to 11E illustrate a method for manufacturing a transistor.
Figure 11B:
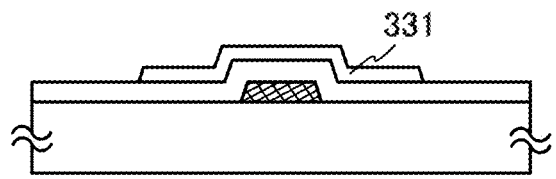
Figure 11C:
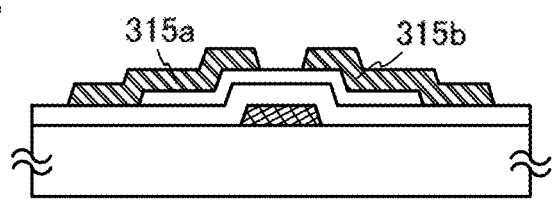
Figure 11D:
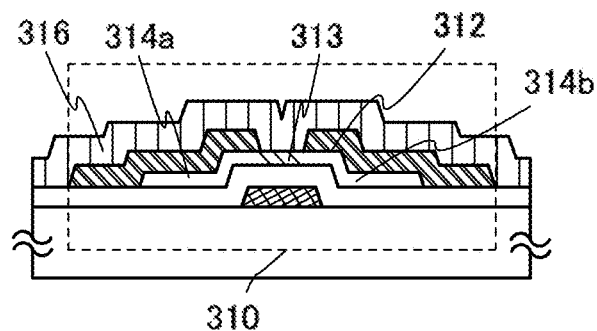
Figure 11E:
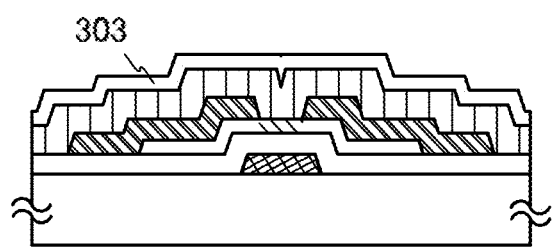
Figure 12A:
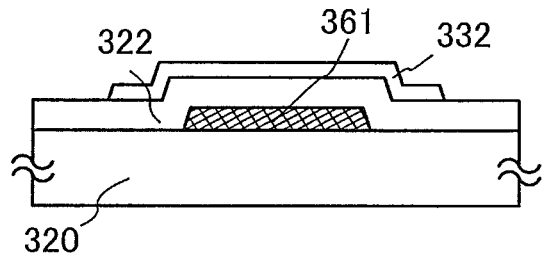
FIGS. 12A to 12D illustrate a method for manufacturing a transistor.
Figure 12B:
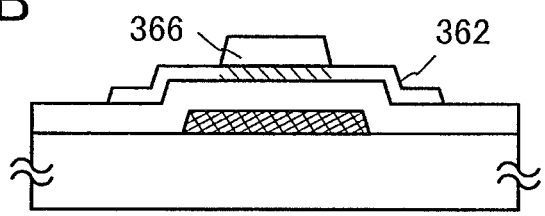
Figure 12C:
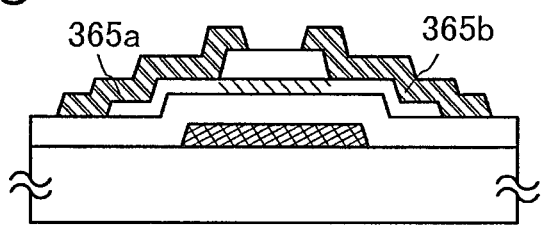
Figure 12D:
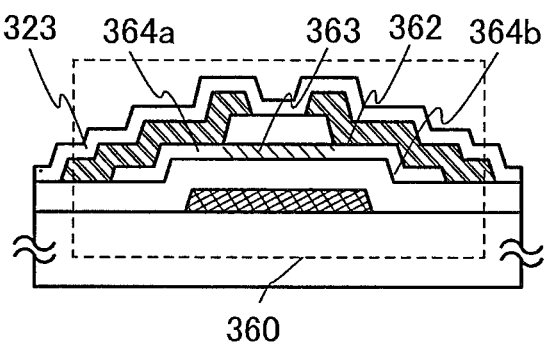

The oxide semiconductor film 330 is formed using an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 330 is formed with a sputtering method with the use of an In—Ga—Zn—O-based oxide semiconductor target. FIG. 11A corresponds to a cross-sectional view at this stage. Further, the oxide semiconductor film 330 can be formed with a sputtering method in a rare gas (typically, argon) atmosphere, an oxygen atmosphere, or a mixed atmosphere containing a rare gas (typically, argon) and oxygen. In the case of employing a sputtering method, a target containing $SiO_2$ at 2 wt % to 10 wt % inclusive may be used for film formation.

As a target for forming the oxide semiconductor film 330 with a sputtering method, a metal oxide target containing zinc oxide as its main component can be used. As another example of a metal oxide target, an oxide semiconductor film formation target containing In, Ga, and Zn (in a composition ratio, $In_2O_3:Ga_2O_3:ZnO=1:1:1$[mol %], In:Ga:Zn=1:1:0.5 [atomic %]) can be used. Alternatively, an oxide semiconductor film formation target containing In, Ga, and Zn (the composition ratio of In:Ga:Zn=1:1:1 or 1:1:2 [atomic %]) may be used. The fill rate of the oxide semiconductor film formation target is 90% to 100% inclusive, preferably, 95% to 99.9% inclusive. With the use of the oxide semiconductor film formation target with high fill rate, a dense oxide semiconductor film is formed.

It is preferable to use a high-purity gas from which an impurity such as hydrogen, water, a hydroxyl group, or hydride is removed to a concentration expressed by a level of ppm or ppb, as a sputtering gas used when the oxide semiconductor film 330 is formed.

The substrate is held in a treatment chamber kept under reduced pressure, and the substrate temperature is set to 100° C. to 600° C., preferably 200° C. to 400° C. Film formation is performed while the substrate is heated, whereby the concentration of an impurity contained in the oxide semiconductor film formed can be reduced. Further, damages due to sputtering can be reduced. Then, a sputtering gas from which hydrogen and moisture are removed is introduced into the treatment chamber from which remaining moisture is being removed, and the oxide semiconductor film 330 is formed over the substrate 300 with the use of a metal oxide as a target. To remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

An example of the deposition condition is as follows: the distance between the substrate and the target is 100 mm, the pressure is 0.6 Pa, the DC power is 0.5 kW, and the atmosphere is an oxygen atmosphere (the flow rate of oxygen is 100%). It is preferable that a pulsed DC power source be used because powder substances generated in film formation can be reduced and the film thickness can be uniform. The oxide semiconductor film preferably has a thickness of 5 nm to 30 nm inclusive. Note that the appropriate thickness depends on an oxide semiconductor material used and the thickness may be selected in accordance with a material.

Then, in a second photolithography process, the oxide semiconductor film 330 is processed into an island-shaped oxide semiconductor layer. A resist mask for forming the island-shaped oxide semiconductor layer may be formed with an ink-jet method. When the resist mask is formed with an ink-jet method, a photomask is not used; therefore, manufacturing costs can be reduced.

Next, the oxide semiconductor layer is subjected to first heat treatment. With the first heat treatment, dehydration or dehydrogenation of the oxide semiconductor layer can be conducted. The temperature of the first heat treatment is higher than or equal to 400° C. and lower than or equal to 750°

C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 331 is obtained (see FIG. 11B).

The apparatus for the heat treatment is not limited to the electric furnace and may be the one provided with a device for heating an object to be processed, using heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed due to heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

Note that in the first heat treatment, it is preferable that water, hydrogen, and the like be not included in nitrogen or a rare gas such as helium, neon, or argon. Alternatively, it is preferable that nitrogen or a rare gas such as helium, neon, or argon introduced into an apparatus for the heat treatment have a purity of 6 N (99.9999%) or more, preferably, 7 N (99.99999%) or more (that is, an impurity concentration is set to 1 ppm or lower, preferably, 0.1 ppm or lower).

Further, the oxide semiconductor layer might be crystallized to be a microcrystalline film or a polycrystalline film depending on a condition of the first heat treatment or a material of the oxide semiconductor layer. For example, the oxide semiconductor layer may be crystallized to become a microcrystalline oxide semiconductor film having a degree of crystallization of 90% or more, or 80% or more. Further, depending on the condition of the first heat treatment and the material of the oxide semiconductor layer, the oxide semiconductor layer may become an amorphous oxide semiconductor film containing no crystalline component. The oxide semiconductor layer might become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

Alternatively, the first heat treatment of the oxide semiconductor layer may be performed on the oxide semiconductor film 330 which has not yet been processed into the island-shaped oxide semiconductor layer. In that case, after the first heat treatment, the substrate is taken out of the heating apparatus and a photolithography process is performed.

The heat treatment having an effect of dehydration or dehydrogenation on the oxide semiconductor layer may be performed at any of the following timings: after the oxide semiconductor layer is formed; after a source electrode layer and a drain electrode layer are formed over the oxide semiconductor layer; and after a protective insulating layer is formed over the source electrode layer and the drain electrode layer.

In the case of forming a contact hole in the gate insulating layer 302, the step may be performed either before or after dehydration or dehydrogenation of the oxide semiconductor film 330.

Note that the etching of the oxide semiconductor film is not limited to wet etching and may be dry etching.

The etching conditions (such as an etchant, etching time, and temperature) are appropriately adjusted depending on the material so that the oxide semiconductor film can be etched to have a desired shape.

Next, a conductive film is formed over the gate insulating layer 302 and the oxide semiconductor layer 331. The conductive film may be formed with a sputtering method or a vacuum evaporation method. As the material of the conductive film, there are an element selected from Al, Cr, Cu, Ta, Ti, Mo, or W; an alloy including any of the above elements; an alloy film containing a combination of any of these elements; and the like. Further, one or more materials selected from manganese, magnesium, zirconium, beryllium, and thorium may be used. The conductive film may have a single-layer structure or a layered structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

If heat treatment is performed after formation of the conductive film, it is preferable that the conductive film have heat resistance enough to withstand the heat treatment.

A third photolithography process is performed. A resist mask is formed over the conductive film and selective etching is performed, so that a source electrode layer 315a and a drain electrode layer 315b are formed. Then, the resist mask is removed (see FIG. 11C).

Ultraviolet, a KrF laser beam, or an ArF laser beam is used for light exposure for forming the resist mask in the third photolithography process. A channel length L of the thin film transistor to be formed later depends on a width of an interval between a bottom portion of the source electrode layer and a bottom portion of the drain electrode layer which are adjacent to each other over the oxide semiconductor layer 331. Note that when light exposure is performed in the case where the channel length L is shorter than 25 nm, extreme ultraviolet with extremely short wavelengths of several nanometers to several tens of nanometers is used for light exposure for forming the resist mask in the third photolithography process. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased, and further, an off current is significantly small, so that low power consumption can be achieved.

Note that materials and etching conditions are adjusted as appropriate so that the oxide semiconductor layer 331 is not removed when the conductive film is etched.

Note that in the third photolithography process, only part of the oxide semiconductor layer 331 is etched, whereby an oxide semiconductor layer having a groove (a depressed portion) might be formed. The resist mask used for forming the source electrode layer 315a and the drain electrode layer 315b may be formed with an ink-jet method. When the resist mask is formed with an ink-jet method, a photomask is not used; therefore, manufacturing costs can be reduced.

Further, an oxide conductive layer may be formed between the oxide semiconductor layer and the source and drain electrode layers. The oxide conductive layer and a metal layer for forming the source and drain electrode layers can be formed successively. The oxide conductive layer can function as a source region and a drain region.

When the oxide conductive layer is provided as the source region and the drain region between the oxide semiconductor layer and the source and drain electrode layers, the source region and the drain region can have lower resistance and the transistor can operate at high speed.

To reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Thus, a resist mask corresponding to at least two kinds of different patterns can be formed by using a multi-tone mask. Accordingly, the number of light-exposure masks can be reduced and the number of corresponding photolithography steps can be also reduced, whereby simplification of a process can be realized.

Next, plasma treatment with a gas such as $N_2O$, $N_2$, or Ar is performed. With this plasma treatment, water adsorbed to a surface of an exposed portion of the oxide semiconductor layer is removed. Alternatively, plasma treatment may be performed using a mixed gas of oxygen and argon.

After the plasma treatment is performed, an oxide insulating layer 316 which serves as a protective insulating film and is in contact with part of the oxide semiconductor layer is formed without exposure to the air.

The oxide insulating layer 316 can be formed to a thickness of longer than or equal to 1 nm with a sputtering method or the like as appropriate, which is a method with which an impurity such as water or hydrogen does not enter the oxide insulating layer 316. When hydrogen is contained in the oxide insulating layer 316, entry of the hydrogen to the oxide semiconductor layer or extraction of oxygen in the oxide semiconductor layer by the hydrogen is caused, whereby a backchannel of the oxide semiconductor layer comes to be n-type (to have a lower resistance) and thus a parasitic channel might be formed. Therefore, it is important that a formation method in which hydrogen is not used is employed so that the oxide insulating layer 316 is formed containing as little hydrogen as possible.

In this embodiment, a silicon oxide film is formed to a thickness of 200 nm as the oxide insulating layer 316 with a sputtering method. The substrate temperature in film formation may be higher than or equal to room temperature and lower than or equal to 300° C. and in this embodiment, is 100° C. The silicon oxide film can be formed with a sputtering method in a rare gas (typically, argon) atmosphere, an oxygen atmosphere, or a mixed atmosphere of a rare gas (typically, argon) and oxygen. Further, a silicon oxide target or a silicon target can be used as a target. For example, the silicon oxide film can be formed using a silicon target with a sputtering method in an atmosphere containing oxygen and nitrogen. The oxide insulating layer 316 which is formed in contact with the oxide semiconductor layer in a region which is in an oxygen-deficient state and thus is n-type, that is, has a lower resistance is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 316 is preferably formed removing moisture remaining in the treatment chamber. This is for preventing hydrogen, a hydroxyl group, and moisture from being contained in the oxide semiconductor layer 331 and the oxide insulating layer 316.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 316 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 316 is formed.

Next, second heat treatment (preferably 200° C. to 400° C. inclusive, for example, from 250° C. to 350° C. inclusive) is performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 316.

Through the above steps, the oxide semiconductor layer comes to be in an oxygen-deficient state and thus has a lower resistance, that is, comes to be n-type when heat treatment for dehydration or dehydrogenation is performed on the formed oxide semiconductor layer. Then, the oxide insulating layer is formed in contact with the oxide semiconductor layer. Accordingly, part of the oxide semiconductor layer is selectively in an oxygen excess state. As a result, the channel formation region 313 overlapping with the gate electrode layer 311 becomes i-type. At that time, a high-resistance source region 314a which has higher carrier concentration than at least the channel formation region 363 and overlaps with the source electrode layer 315a and a high-resistance drain region 314b which has higher carrier concentration than at least the channel formation region 363 and overlaps with the drain electrode layer 315b are formed in a self-aligned manner. Through the above steps, the thin film transistor 310 is formed (see FIG. 11D).

Further, heat treatment may be performed at 100° C. to 200° C. inclusive for one hour to 30 hours inclusive in the air. In this embodiment, heat treatment is performed at 150° C. for ten hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved. When a silicon oxide layer having a lot of defects is used as the oxide insulating layer, with this heat treatment, an impurity such as hydrogen, moisture, a hydroxyl group, or hydride contained in the oxide semiconductor layer can be diffused to the oxide insulating layer so that the impurity in the oxide semiconductor layer can be further reduced.

Note that by forming the high-resistance drain region 314*b* (and the high-resistance source region 314*a*) in the oxide semiconductor layer overlapping with the drain electrode layer 315*b* (and the source electrode layer 315*a*), reliability of the thin film transistor can be improved. Specifically, by forming the high-resistance drain region 314*b*, the structure can be obtained in which conductivities of the drain electrode layer 315*b*, the high-resistance drain region 314*b*, and the channel formation region 313 vary. Therefore, in the case where the thin film transistor operates with the drain electrode layer 315*b* connected to a wiring for supplying a high power supply potential VDD, the high-resistance drain region serves as a buffer and an electric field is not applied locally even if a voltage is applied between the gate electrode layer 311 and the drain electrode layer 315*b*; thus, the withstand voltage of the thin film transistor can be increased.

Further, the high-resistance source region or the high-resistance drain region in the oxide semiconductor layer is formed in the entire thickness direction in the case where the thickness of the oxide semiconductor layer is 15 nm or smaller. In the case where the thickness of the oxide semiconductor layer is 30 nm or larger and 50 nm or smaller, in part of the oxide semiconductor layer, that is, in a region in the oxide semiconductor layer, which is in contact with the source electrode layer or the drain electrode layer, and the vicinity thereof, resistance is reduced and the high-resistance source region or the high-resistance drain region is formed, while a region in the oxide semiconductor layer, which is close to the gate insulating film, can be made to be i-type.

A protective insulating layer may be additionally formed over the oxide insulating layer 316. For example, a silicon nitride film is formed with an RF sputtering method. An RF sputtering method is preferable as a formation method of the protective insulating layer because of high productivity. The protective insulating layer is formed using an inorganic insulating film which does not contain impurities such as moisture, a hydrogen ion, and OW and blocks entry of these from the outside: for example, a silicon nitride film, an aluminum nitride film, a silicon nitride oxide film, an aluminum nitride oxide film, or the like is used. In this embodiment, as the protective insulating layer, a protective insulating layer 303 is formed using a silicon nitride film (see FIG. 11E).

The substrate 300 over which layers up to the oxide insulating layer 316 have been formed is heated to a temperature of 100° C. to 400° C., a sputtering gas from which hydrogen and moisture are removed and which contains high-purity nitrogen is introduced, and a silicon target is used, whereby a silicon nitride layer is formed as the protective insulating layer 303. In this case, the protective insulating layer 303 is preferably formed removing moisture remaining in a treatment chamber, similarly to the oxide insulating layer 316.

Note that a planarization insulating layer for planarization may be provided over the protective insulating layer 303.

Further, a conductive layer may be formed so as to overlap with the oxide semiconductor layer, over the protective insulating layer 303 (in the case of providing a planarization insulating layer, over the planarization insulating layer). A potential of the conductive layer may be the same as or different from that of the gate electrode layer 311 of the thin film transistor 310. The conductive layer can also function as a second gate electrode layer. The potential of the conductive layer may be a fixed potential such as GND or 0 V.

Electric characteristics of the thin film transistor 310 can be controlled by the conductive layer.

This embodiment can be implemented in appropriate combination with any of the other embodiments.

Thus, the thin film transistor including the oxide semiconductor layer can have stable electric characteristics and high reliability.

(Embodiment 7)

In this embodiment, an example of thin film transistors which can be applied to transistors included in the logic circuit and the semiconductor device disclosed in this specification.

One embodiment of a thin film transistor and a manufacturing method of the thin film transistor of this embodiment is described with reference to FIGS. 12A to 12D.

FIGS. 12A to 12D illustrate an example of a cross-sectional structure of a thin film transistor. A thin film transistor 360 illustrated in FIGS. 12A to 12D is one of bottom gate thin film transistors, which is called a channel protective thin film transistor (also referred to as a channel-stop thin film transistor), and is also referred to as an inverted staggered thin film transistor.

Although description is given using a single-gate thin film transistor as the thin film transistor 360, a multi-gate thin film transistor including a plurality of channel formation regions may be formed as needed.

A process of manufacturing the thin film transistor 360 over a substrate 320 is described below with reference to FIGS. 12A to 12D.

First, after a conductive film is formed over the substrate 320 having an insulating surface, the gate electrode layer 361 is formed in a first photolithography process. Note that a resist mask may be formed with an ink-jet method. When the resist mask is formed with an ink-jet method, a photomask is not used; therefore, manufacturing costs can be reduced.

Further, the gate electrode layer 361 can be formed with a single-layer structure or a layered structure using any of metal materials such as molybdenum, titanium, chromium, tantalum, tungsten, aluminum, copper, neodymium, and scandium, and an alloy material including any of these materials as a main component.

Then, the gate insulating layer 322 is formed over the gate electrode layer 361.

In this embodiment, a silicon oxynitride layer having a thickness of smaller than or equal to 100 nm is formed as the gate insulating layer 322 with a plasma CVD method.

Then, an oxide semiconductor film is formed to a thickness of 2 nm to 200 nm inclusive over the gate insulating layer 322 and processed into an island-shaped oxide semiconductor layer in a second photolithography process. In this embodiment, the oxide semiconductor film is formed with a sputtering method with the use of an In—Ga—Zn—O-based oxide semiconductor film formation target.

In that case, the oxide semiconductor film is preferably formed removing moisture remaining in the treatment chamber. This is for preventing hydrogen, a hydroxyl group, and moisture from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide semiconductor film formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 332 is obtained (see FIG. 12A).

Next, plasma treatment with a gas such as $N_2O$, $N_2$, or Ar is performed. With this plasma treatment, water adsorbed to a surface of an exposed portion of the oxide semiconductor layer is removed. Alternatively, plasma treatment may be performed using a mixed gas of oxygen and argon.

Next, an oxide insulating layer is formed over the gate insulating layer 322 and the oxide semiconductor layer 332 and a third photolithography process is performed. A resist mask is formed and selective etching is performed, so that the oxide insulating layer 366 is formed. Then, the resist mask is removed.

In this embodiment, a silicon oxide film is formed to a thickness of 200 nm as the oxide insulating layer 366 with a sputtering method. The substrate temperature in film formation may be higher than or equal to room temperature and lower than or equal to 300° C. and in this embodiment, is 100° C. The silicon oxide film can be formed with a sputtering method in a rare gas (typically, argon) atmosphere, an oxygen atmosphere, or a mixed atmosphere of a rare gas (typically, argon) and oxygen. Further, a silicon oxide target or a silicon target can be used as a target. For example, the silicon oxide film can be formed using a silicon target with a sputtering method in an atmosphere containing oxygen and nitrogen. The oxide insulating layer 366 which is formed in contact with the oxide semiconductor layer in a region which is in an oxygen-deficient state and thus has a lower resistance is formed using an inorganic insulating film that does not contain impurities such as moisture, a hydrogen ion, and $OH^-$ and blocks entry of such impurities from the outside, typically, a silicon oxide film, a silicon oxynitride film, an aluminum oxide film, or an aluminum oxynitride film.

In that case, the oxide insulating layer 366 is preferably formed removing moisture remaining in the treatment chamber. This is for preventing hydrogen, a hydroxyl group, and moisture from being contained in the oxide semiconductor layer 332 and the oxide insulating layer 366.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 366 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 366 is formed.

Next, second heat treatment (preferably 200° C. to 400° C. inclusive, for example, from 250° C. to 350° C. inclusive) may be performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 366.

In this embodiment, heat treatment is further performed on the oxide semiconductor layer 332 over which the oxide insulating layer 366 is provided and thus part of the oxide semiconductor layer 332 is exposed, in an inert gas atmosphere such as nitrogen or under reduced pressure. By performing heat treatment in an inert gas atmosphere such as nitrogen or under reduced pressure, the resistance of regions of the oxide semiconductor layer 332, which are not covered with the oxide insulating layer 366 and are thus exposed, can be increased. For example, heat treatment is performed in a nitrogen atmosphere at 250° C. for one hour.

With the heat treatment for the oxide semiconductor layer 332 provided with the oxide insulating layer 366 in a nitrogen atmosphere, the resistance of the exposed regions of the oxide semiconductor layer 332 is increased. Thus, an oxide semiconductor layer 362 including regions with different resistances (indicated as shaded regions and white regions in FIG. 12B) are formed.

Next, after a conductive film is formed over the gate insulating layer 322, the oxide semiconductor layer 362, and the oxide insulating layer 366, and a fourth photolithography process is performed. A resist mask is formed and selective etching is performed, so that a source electrode layer 365a and a drain electrode layer 365b are formed. Then, the resist mask is removed (see FIG. 12C).

As the material of the source electrode layer 365a and the drain electrode layer 365b, there are an element selected from Al, Cr, Cu, Ta, Ti, Mo, or W; an alloy including any of the above elements; an alloy film containing a combination of any of these elements; and the like. The metal conductive film may have a single-layer structure or a layered structure of two or more layers.

Through the above steps, the oxide semiconductor layer comes to be in an oxygen-deficient state, that is, comes to be n-type when heat treatment for dehydration or dehydrogenation is performed on the formed oxide semiconductor layer. Then, the oxide insulating layer is formed in contact with the oxide semiconductor layer. Accordingly, part of the oxide semiconductor layer is selectively in an oxygen excess state. As a result, the channel formation region 363 overlapping with the gate electrode layer 361 becomes i-type. At that time, a high-resistance source region 364a which has higher carrier concentration than at least the channel formation region 363 and overlaps with the source electrode layer 365a and a high-resistance drain region 364b which has higher carrier concentration than at least the channel formation region 363 and overlaps with the drain electrode layer 365b are formed in a self-aligned manner. Through the above steps, the thin film transistor 360 is formed.

Further, heat treatment may be performed at 100° C. to 200° C. inclusive for one hour to 30 hours inclusive in the air. In this embodiment, heat treatment is performed at 150° C. for ten hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed under a reduced pressure before formation of the oxide insulating layer. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved.

Note that by forming the high-resistance drain region 364b (and the high-resistance source region 364a) in the oxide semiconductor layer overlapping with the drain electrode layer 365b (and the source electrode layer 365a), reliability of the thin film transistor can be improved. Specifically, by forming the high-resistance drain region 364b, the structure can be obtained in which conductivities of the drain electrode layer 365b, the high-resistance drain region 364b, and the channel formation region 363 vary. Therefore, in the case where the thin film transistor operates with the drain electrode layer 365b connected to a wiring for supplying a high power supply potential VDD, the high-resistance drain region serves as a buffer and an electric field is not applied locally even if a voltage is applied between the gate electrode layer 361 and the drain electrode layer 365b; thus, the withstand voltage of the thin film transistor can be increased.

A protective insulating layer 323 is formed over the source electrode layer 365a, the drain electrode layer 365b, and the oxide insulating layer 366. In this embodiment, the protective insulating layer 323 is formed using a silicon nitride film (see FIG. 12D).

Note that an oxide insulating layer may be further formed over the source electrode layer 365a, the drain electrode layer 365b, and the oxide insulating layer 366, and the protective insulating layer 323 may be stacked over the oxide insulating layer.

Thus, the thin film transistor including the oxide semiconductor layer can have stable electric characteristics and high reliability.

Note that this embodiment can be implemented in appropriate combination with any of the other embodiments.

(Embodiment 8)

In this embodiment, an example of thin film transistors which can be applied to transistors included in the logic circuit and the semiconductor device disclosed in this specification.

One embodiment of a thin film transistor and a manufacturing method of the thin film transistor of this embodiment is described with reference to FIGS. 13A to 13D.

Although description is given using a single-gate thin film transistor as a thin film transistor 350, a multi-gate thin film transistor including a plurality of channel formation regions may be formed as needed.

A process of manufacturing the thin film transistor 350 over a substrate 340 is described below with reference to FIGS. 13A to 13D.

First, after a conductive film is formed over the substrate 340 having an insulating surface, a gate electrode layer 351 is formed in a first photolithography process. In this embodiment, a tungsten film is formed as the gate electrode layer 351 to a thickness of 150 nm.

Then, a gate insulating layer 342 is formed over the gate electrode layer 351. In this embodiment, a silicon oxynitride layer is formed as the gate insulating layer 342 to a thickness of smaller than or equal to 100 nm with a plasma CVD method.

Next, after a conductive film is formed over the gate insulating layer 342, and a second photolithography process is performed. A resist mask is formed and selective etching is performed, so that a source electrode layer 355a and a drain electrode layer 355b are formed. Then, the resist mask is removed (see FIG. 13A).

Figure 13A:
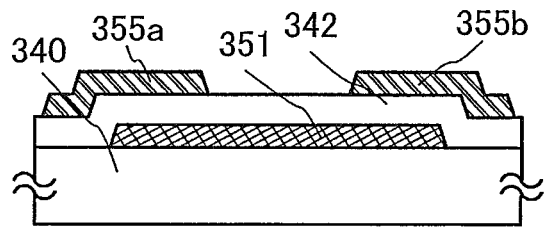
FIGS. 13A to 13D illustrate a method for manufacturing a transistor.
Figure 13B:
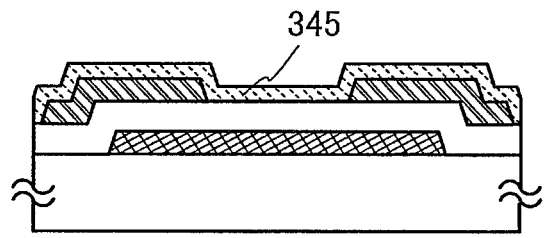
Figure 13C:
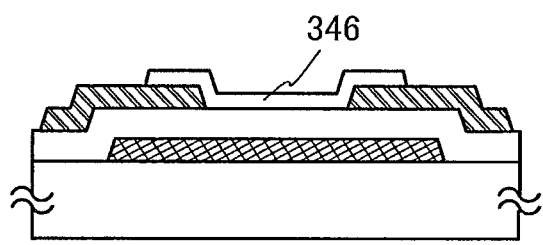
Figure 13D:
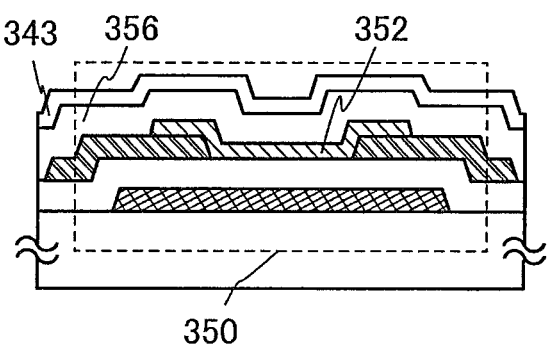

Then, an oxide semiconductor film 345 is formed (see FIG. 13B). In this embodiment, the oxide semiconductor film 345 is formed with a sputtering method with the use of an In—Ga—Zn—O-based oxide semiconductor film formation target. The oxide semiconductor film 345 is processed into an island-shaped oxide semiconductor layer in a third photolithography process.

In that case, the oxide semiconductor film 345 is preferably formed removing moisture remaining in the treatment chamber. This is for preventing hydrogen, a hydroxyl group, and moisture from being contained in the oxide semiconductor film 345.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide semiconductor film 345 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor film 345 is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 346 is obtained (see FIG. 13C).

As the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables high-temperature heat treatment in a short time.

An oxide insulating layer 356 which serves as a protective insulating film and is in contact with the oxide semiconductor layer 346 is formed.

The oxide insulating layer 356 can be formed to a thickness of longer than or equal to 1 nm with a sputtering method or the like as appropriate, which is a method with which an impurity such as water or hydrogen does not enter the oxide insulating layer 356. When hydrogen is contained in the oxide insulating layer 356, entry of the hydrogen to the oxide semiconductor layer or extraction of oxygen in the oxide semiconductor layer by the hydrogen is caused, whereby a backchannel of the oxide semiconductor layer comes to have a lower resistance (to be n-type) and thus a parasitic channel might be formed. Therefore, it is important that a formation method in which hydrogen is not used is employed so that the oxide insulating layer 356 is formed containing as little hydrogen as possible.

In this embodiment, a silicon oxide film is formed to a thickness of 200 nm as the oxide insulating layer 356 with a sputtering method. The substrate temperature in film formation may be higher than or equal to room temperature and lower than or equal to 300° C. and in this embodiment, is 100° C. The silicon oxide film can be formed with a sputtering method in a rare gas (typically, argon) atmosphere, an oxygen atmosphere, or a mixed atmosphere of a rare gas (typically, argon) and oxygen. Further, a silicon oxide target or a silicon target can be used as a target. For example, the silicon oxide film can be formed using a silicon target with a sputtering method in an atmosphere containing oxygen and nitrogen. The oxide insulating layer 356 which is formed in contact with the oxide semiconductor layer in a region which is in an oxygen-deficient state and thus has a lower resistance is formed using an inorganic insulating film that does not contain impurities such as moisture, a hydrogen ion, and OH⁻ and blocks entry of such impurities from the outside, typically, a silicon oxide film, a silicon oxynitride film, an aluminum oxide film, or an aluminum oxynitride film.

In that case, the oxide insulating layer 356 is preferably formed removing moisture remaining in the treatment chamber. This is for preventing hydrogen, a hydroxyl group, and moisture from being contained in the oxide semiconductor layer 346 and the oxide insulating layer 356.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 356 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 356 is formed.

Next, second heat treatment (preferably 200° C. to 400° C. inclusive, for example, from 250° C. to 350° C. inclusive) is performed in an inert gas atmosphere or an oxygen gas atmosphere. For example, the second heat treatment is performed in a nitrogen atmosphere at 250° C. for one hour. With the second heat treatment, heat is applied while part of the oxide semiconductor layer (a channel formation region) is in contact with the oxide insulating layer 356.

Through the above steps, the oxide semiconductor layer which is in an oxygen-deficient state and thus has a lower resistance through dehydration or dehydrogenation is brought into an oxygen-excess state. As a result, an i-type oxide semiconductor layer 352 having a high resistance is formed. Through the above steps, the thin film transistor 350 is formed.

Further, heat treatment may be performed at 100° C. to 200° C. inclusive for one hour to 30 hours inclusive in the air. In this embodiment, heat treatment is performed at 150° C. for ten hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved.

A protective insulating layer may be additionally formed over the oxide insulating layer 356. For example, a silicon nitride film is formed with an RF sputtering method. In this embodiment, as the protective insulating layer, a protective insulating layer 343 is formed using a silicon nitride film (see FIG. 13D).

Note that a planarization insulating layer for planarization may be provided over the protective insulating layer 343.

This embodiment can be implemented in appropriate combination with any of the other embodiments.

Thus, the thin film transistor including the oxide semiconductor layer can have stable electric characteristics and high reliability.

(Embodiment 9)

In this embodiment, an example of thin film transistors which can be applied to transistors included in the logic circuit and the semiconductor device disclosed in this specification.

Figure 14:
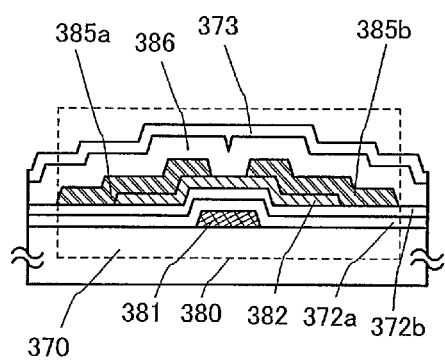
FIG. 14 illustrates a transistor.

In this embodiment, an example which is partly different from Embodiment 6 in the manufacturing process of a thin film transistor will be described with reference to FIG. 14. Since FIG. 14 is the same as FIGS. 11A to 11E except for part of the steps, common reference numerals are used for the same portions, and detailed description of the same portions is omitted.

First, a gate electrode layer 381 is formed over a substrate 370, and a first gate insulating layer 372a and a second gate insulating layer 372b are stacked thereover. In this embodiment, a gate insulating layer has a two layer structure in which a nitride insulating layer and an oxide insulating layer are used as the first gate insulating layer 372a and the second gate insulating layer 372b, respectively.

As the oxide insulating layer, a silicon oxide layer, a silicon oxynitride layer, an aluminum oxide layer, an aluminum oxynitride layer, or the like may be used. As the nitride insulating layer, a silicon nitride layer, a silicon nitride oxide layer, an aluminum nitride layer, an aluminum nitride oxide layer, or the like may be used.

In this embodiment, the gate insulating layer may have a structure where a silicon nitride layer and a silicon oxide layer are stacked from the gate electrode layer 381 side. A silicon nitride layer ($SiN_y$ ($y>0$)) with a thickness of 50 nm to 200 nm inclusive (50 nm in this embodiment) is formed with a sputtering method as a first gate insulating layer 372a and a silicon oxide layer ($SiO_x$ ($x>0$)) with a thickness of 5 nm to 300 nm inclusive (100 nm in this embodiment) is stacked as a second gate insulating layer 372b over the first gate insulating layer 372a; thus, the gate insulating layer with a thickness of 150 nm is formed.

Next, the oxide semiconductor film is formed and then processed into an island-shaped oxide semiconductor layer in a photolithography process. In this embodiment, the oxide semiconductor film is formed with a sputtering method with the use of an In—Ga—Zn—O-based oxide semiconductor film formation target.

In that case, the oxide semiconductor film is preferably formed removing moisture remaining in the treatment chamber. This is for preventing hydrogen, a hydroxyl group, and moisture from being contained in the oxide semiconductor film.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide semiconductor film formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide semiconductor film is formed.

Next, the oxide semiconductor layer is subjected to dehydration or dehydrogenation. The temperature of first heat treatment for dehydration or dehydrogenation is higher than or equal to 400° C. and lower than or equal to 750° C., preferably higher than or equal to 425° C. Note that in the case of the temperature that is 425° C. or more, the heat treatment time may be one hour or less, whereas in the case of the temperature less than 425° C., the heat treatment time is longer than one hour. Here, the substrate is introduced into an electric furnace which is one of heat treatment apparatuses, heat treatment is performed on the oxide semiconductor layer in a nitrogen atmosphere, and then, the oxide semiconductor layer is not exposed to the air so that entry of water and hydrogen into the oxide semiconductor layer is prevented. Thus, the oxide semiconductor layer is obtained. After that, a high-purity oxygen gas, a high-purity $N_2O$ gas, or an ultra-dry air (with a dew point of −40° C. or less, preferably −60° C. or less) is introduced into the same furnace and cooling is performed. It is preferable that water, hydrogen, and the like be not contained in the oxygen gas or the $N_2O$ gas. Alternatively, the purity of the oxygen gas or the $N_2O$ gas which is introduced into the heat treatment apparatus is preferably 6 N (99.9999%) or more, more preferably 7 N (99.99999%) or more (i.e., the impurity concentration of the oxygen gas or the $N_2O$ gas is preferably 1 ppm or lower, more preferably 0.1 ppm or lower).

Note that the heat treatment apparatus is not limited to the electric furnace, and for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. An LRTA apparatus may be provided with not only a lamp but also a device for heating an object to be processed by heat conduction or heat radiation from a heater such as a resistance heater. GRTA is a method for performing heat treatment using a high-temperature gas. As the gas, an inert gas which does not react with an object to be processed with heat treatment, such as nitrogen or a rare gas such as argon is used. Alternatively, the heat treatment may be performed at 600° C. to 750° C. for several minutes by an RTA method.

Moreover, after the first heat treatment for dehydration or dehydrogenation, heat treatment may be performed at from 200° C. to 400° C., preferably from 200° C. to 300° C., in an oxygen gas atmosphere or a $N_2O$ gas atmosphere.

The first heat treatment of the oxide semiconductor layer may be performed before processing the oxide semiconductor film into the island-like oxide semiconductor layer. In that case, after the first heat treatment, the substrate is taken out of the heating apparatus and a photolithography step is performed.

Through the above process, an entire region of the oxide semiconductor layer is made to be in an oxygen excess state; thus, the oxide semiconductor layer has higher resistance, that is, the oxide semiconductor layer becomes i-type. Accordingly, an oxide semiconductor layer 382 whose entire region is i-type is formed.

Next, a conductive film is formed over the oxide semiconductor layer 382, and a photolithography process is performed. A resist mask is formed and etching is performed selectively, whereby a source electrode layer 385a and a drain electrode layer 385b are formed. Then, an oxide insulating layer 386 is formed with a sputtering method.

In that case, the oxide insulating layer 386 is preferably formed removing moisture remaining in the treatment chamber. This is for preventing hydrogen, a hydroxyl group, and moisture from being contained in the oxide semiconductor layer 382 and the oxide insulating layer 386.

In order to remove moisture remaining in the treatment chamber, an entrapment vacuum pump is preferably used. For example, a cryopump, an ion pump, or a titanium sublimation pump is preferably used. Further, an evacuation unit may be a turbo pump provided with a cold trap. In the deposition chamber which is evacuated with the cryopump, a hydrogen atom, a compound containing a hydrogen atom, such as water ($H_2O$), and the like are removed, whereby the concentration of an impurity in the oxide insulating layer 386 formed in the deposition chamber can be reduced.

It is preferable to use a high-purity gas from which an impurity such as hydrogen, water, a hydroxyl group, or hydride is removed to a concentration expressed by a level of ppm or ppb, as a sputtering gas used when the oxide insulating layer 386 is formed.

Through the above steps, a thin film transistor 380 can be formed.

Next, in order to reduce variation in electric characteristics of the thin film transistors, heat treatment (preferably at 150° C. or higher and lower than 350° C.) may be performed in an inert gas atmosphere such as a nitrogen gas atmosphere. For example, the heat treatment is performed in a nitrogen atmosphere at 250° C. for one hour.

Further, heat treatment may be performed at 100° C. to 200° C. inclusive for one hour to 30 hours inclusive in the air. In this embodiment, heat treatment is performed at 150° C. for ten hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Under a reduced pressure, the heating time can be shortened. With this heat treatment, hydrogen is introduced from the oxide semiconductor layer to the oxide insulating layer; thus, the thin film transistor can be normally off. Therefore, reliability of the thin film transistor can be improved.

A protective insulating layer 373 is formed over the oxide insulating layer 386. In this embodiment, the protective insulating layer 373 is formed to a thickness of 100 nm with the use of a silicon nitride film with a sputtering method.

The protective insulating layer 373 and the first gate insulating layer 372a each formed using a nitride insulating layer do not contain impurities such as moisture, hydrogen, hydride, and hydroxide and has an effect of blocking entry of these from the outside.

Therefore, in a manufacturing process after formation of the protective insulating layer 373, entry of an impurity such as moisture from the outside can be prevented. Further, even after a device is completed as a semiconductor device such as a liquid crystal display device, entry of an impurity such as moisture from the outside can be prevented in the long term; therefore, long-term reliability of the device can be achieved.

Further, part of the insulating layers between the protective insulating layer 373 formed using a nitride insulating layer and the first gate insulating layer 372a may be removed so that the protective insulating layer 373 and the first gate insulating layer 372a are in contact with each other.

Accordingly, impurities such as moisture, hydrogen, hydride, and hydroxide in the oxide semiconductor layer are reduced as much as possible and entry of such impurities is prevented, so that the concentration of impurities in the oxide semiconductor layer can be maintained to be low.

Note that a planarization insulating layer for planarization may be provided over the protective insulating layer 373.

Further, a conductive layer may be formed so as to overlap with the oxide semiconductor layer, over the protective insulating layer 373. A potential of the conductive layer may be the same as or different from that of the gate electrode layer 381 of the thin film transistor 380. The conductive layer can also function as a second gate electrode layer. The potential of the conductive layer may be a fixed potential such as GND or 0 V.

Electric characteristics of the thin film transistor 380 can be controlled by the conductive layer.

This embodiment can be implemented in appropriate combination with any of the other embodiments.

Thus, the thin film transistor including the oxide semiconductor layer can have stable electric characteristics and high reliability.

(Embodiment 10)

An appearance and a cross section of a liquid crystal display panel corresponding to one mode of a semiconductor device are described with reference to FIGS. 15A to 15C. FIGS. 15A and 15C are plan views of panels in each of which thin film transistors 4010 and 4011 and a liquid crystal element 4013 are sealed between a first substrate 4001 and a second substrate 4006 with a sealant 4005. FIG. 15B is a cross-sectional view taken along line M-N in FIG. 15A or 15C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 15A illustrates an example in which the signal line driver circuit 4003 is mounted with a COG method. FIG. 15C illustrates an example in which the signal line driver circuit 4003 is mounted with a TAB method.

The pixel portion 4002 and the scan line driver circuit 4004 provided over the first substrate 4001 include a plurality of thin film transistors. FIG. 15B illustrates the thin film transistor 4010 included in the pixel portion 4002 and the thin film transistor 4011 included in the scan line driver circuit 4004, as an example. Insulating layers 4041, 4042, and 4021 are provided over the thin film transistors 4010 and 4011.

Any of the thin film transistors of Embodiments 2 to 9 can be used as appropriate as the thin film transistors 4010 and 4011. Hydrogen or water is reduced in the oxide semiconductor layers of the thin film transistors 4010 and 4011. Thus, the thin film transistors 4010 and 4011 are highly reliable thin film transistors. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011. The conductive layer 4040 is provided in the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Further, the potential of the conductive layer 4040 may be GND or 0 V, or the conductive layer 4040 may be in a floating state.

A pixel electrode layer 4030 included in the liquid crystal element 4013 is electrically connected to a source or drain electrode layer of the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the electrode layers with the insulating layers 4032 and 4033 therebetween.

Note that a light-transmitting substrate can be used as the first substrate 4001 and the second substrate 4006; glass, ceramics, or plastics can be used. The plastic may be a fiber-glass-reinforced plastics (FRP) plate, a polyvinyl fluoride (PVF) film, a polyester film, or an acrylic resin film.

A spacer 4035 is a columnar partition wall obtained by selective etching of an insulating film, and the columnar spacer is provided in order to control the distance (a cell gap) between the pixel electrode layer 4030 and the counter electrode layer 4031. Alternatively, a spherical spacer may be used as the spacer 4035. The counter electrode layer 4031 is electrically connected to a common potential line formed over the substrate where the thin film transistor 4010 is formed. The counter electrode layer 4031 and the common potential line can be electrically connected to each other through conductive particles provided between the pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A thin film transistor formed using an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor formed using an oxide semiconductor layer.

Note that this embodiment can also be applied to a transflective liquid crystal display device in addition to a transmissive liquid crystal display device.

Although a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layers. The insulating layer 4041 can be formed using a material and a method which are similar to those of the oxide insulating layer described in any of the embodiments. Here, as the insulating layer 4041, a silicon oxide layer is formed with a sputtering method. Further, the protective insulating layer 4042 is formed on and in contact with the insulating layer 4041. The protective insulating layer 4042 may be formed similarly to the protective insulating layer 303 described in Embodiment 6; for example, the protective insulating layer 4042 can be formed using a silicon nitride film. In order to reduce the surface roughness caused by the thin film transistors, the insulating layer 4021 serving as a planarization insulating layer is formed.

The insulating layer 4021 is formed as a planarization insulating layer. As the insulating layer 4021, an organic material having heat resistance such as polyimide, acrylic, benzocyclobutene, polyamide, or epoxy can be used. Other than such organic materials, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method for forming the insulating layer 4021. The insulating layer 4021 can be formed, depending on the material, with a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater. A baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium tin oxide (ITO), indium zinc oxide (IZO) in which zinc oxide (ZnO) is mixed in indium oxide, a conductive material in which silicon oxide ($SiO_2$) is mixed in indium oxide, organic indium, organotin, indium oxide containing tungsten oxide, indium zinc oxide containing tungsten oxide, indium oxide containing titanium oxide, indium tin oxide containing titanium oxide, or the like. Further, in the case where a light-transmitting property is not needed or a reflecting property is needed in a reflective liquid crystal display device, the pixel electrode layer 4030 and the counter electrode layer 4031 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of these metals; and a nitride of these metals.

A conductive composition containing a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule contained in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013, and a terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 15A to 15C illustrate examples in each of which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

A black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a sidelight, or the like may be used as a light source.

In an active matrix liquid crystal display device, display patterns are formed on a screen by driving of pixel electrodes that are arranged in matrix. Specifically, a voltage is applied between a selected pixel electrode and a counter electrode corresponding to the pixel electrode, and thus, a liquid crystal layer disposed between the pixel electrode and the counter electrode is optically modulated. This optical modulation is recognized as a display pattern by a viewer.

A liquid crystal display device has a problem in that, when displaying a moving image, image sticking occurs or the moving image is blurred because the response speed of liquid crystal molecules themselves is low. As a technique for improving moving image characteristics of a liquid crystal display device, there is a driving technique so-called black insertion by which an entirely black image is displayed every other frame.

Alternatively, a driving method called double-frame rate driving may be employed in which a vertical synchronizing frequency is 1.5 times or more, preferably 2 times or more as high as a normal vertical synchronizing frequency, whereby response speed is improved.

Furthermore, as a technique for improving moving image characteristics of a liquid crystal display device, there is another driving technique in which, as a backlight, a surface light source including a plurality of LED (light-emitting diode) light sources or a plurality of EL light sources is used, and each light source included in the surface light source is independently driven so as to perform intermittent lighting in one frame period. As the surface light source, three or more kinds of LEDs may be used, or a white-light-emitting LED may be used. Since a plurality of LEDs can be controlled independently, the timing at which the LEDs emit light can be synchronized with the timing at which optical modulation of a liquid crystal layer is switched. In this driving technique, part of LEDs can be turned off. Therefore, especially in the case of displaying an image in which the proportion of a black image area in one screen is high, a liquid crystal display device can be driven with low power consumption.

When combined with any of these driving techniques, a liquid crystal display device can have better display characteristics such as moving image characteristics than conventional liquid crystal display devices.

Since the thin film transistor is easily broken due to static electricity or the like, the protective circuit is preferably provided over the same substrate as the pixel portion and the driver circuit portion. The protective circuit is preferably formed using a non-linear element including an oxide semiconductor layer. For example, a protective circuit is provided between the pixel portion, and a scan line input terminal and a signal line input terminal. In this embodiment, a plurality of protective circuits are provided so that the pixel transistor and the like are not broken when a surge voltage due to static electricity or the like is applied to the scan line, the signal line, or a capacitor bus line. Accordingly, the protective circuit has a structure for releasing charge to a common wiring when a surge voltage is applied to the protective circuit. The protective circuit includes non-linear elements which are arranged in parallel between the scan line and the common wiring. Each of the non-linear elements includes a two-terminal element such as a diode or a three-terminal element such as a transistor. For example, the non-linear element can be formed through the same steps as the thin film transistor of the pixel portion. For example, characteristics similar to those of a diode can be achieved by connecting a gate terminal to a drain terminal.

Further, for the liquid crystal display module, a twisted nematic (TN) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

There is no particular limitation in the semiconductor device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as a vertical alignment mode. For example, an MVA (multi-domain vertical alignment) mode, a PVA (patterned vertical alignment) mode, an ASV mode, or the like can be employed.

Further, this embodiment can also be applied to a VA liquid crystal display device. The VA liquid crystal display device has a kind of form in which alignment of liquid crystal molecules in a liquid crystal display panel is controlled. In the VA liquid crystal display device, liquid crystal molecules are aligned in a vertical direction with respect to a panel surface when a voltage is not applied. Further, a method called multi-domain or multi-domain design, by which a pixel is divided into some regions (subpixels), and liquid crystal molecules are aligned in different directions in their respective regions, can be used.

This embodiment can be implemented in appropriate combination with any of the other embodiments.

(Embodiment 11)

In this embodiment, examples of manufacturing an active-matrix light-emitting display device by utilizing a thin film transistor and electroluminescence in the semiconductor device described in Embodiment 1 are described.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 16:
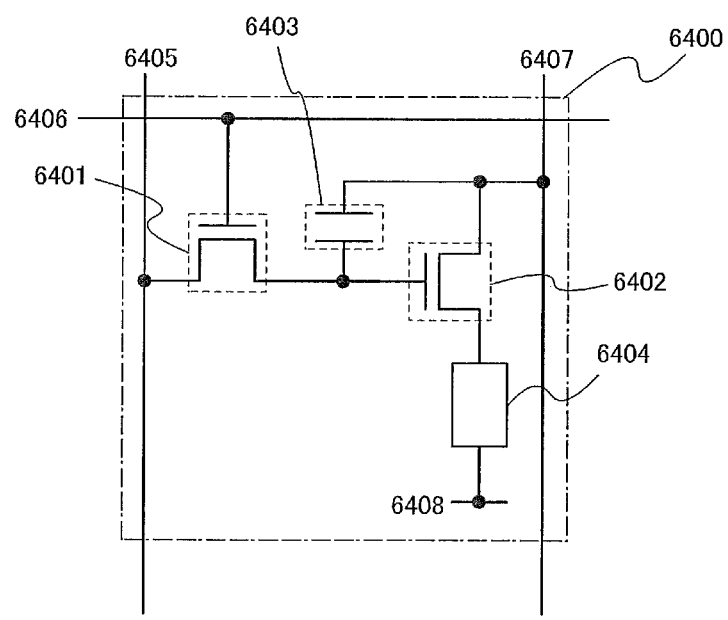
FIG. 16 illustrates an equivalent circuit of a pixel in a semiconductor device.

FIG. 16 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode. The common electrode is electrically connected to a common potential line 6408 provided over the same substrate as the common electrode.

The second electrode (common electrode) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is the threshold voltage of the light-emitting element 6404 or higher.

When the gate capacitance of the driving transistor 6402 is used as a substitute for the capacitor 6403, the capacitor 6403 can be omitted. The gate capacitance of the driving transistor 6402 may be formed between a channel formation region and a gate electrode.

Here, in the case of using a voltage-input voltage driving method, a video signal is input to the gate of the driving transistor 6402 to make the driving transistor 6402 completely turn on or off. That is, the driving transistor 6402 operates in a linear region. Since the driving transistor 6402 operates in a linear region, a voltage higher than the voltage of the power supply line 6407 is applied to the gate of the driving transistor 6402. Note that a voltage greater than or equal to (power supply line voltage $+V_{th}$ of the driving transistor 6402) is applied to the signal line 6405.

Further, in the case of using analog grayscale driving instead of the digital time ratio grayscale driving, the pixel structure the same as that of FIG. 16 can be employed by inputting signals in a different way.

In the case of using the analog grayscale method, a voltage greater than or equal to (forward voltage of the light-emitting element 6404+$V_{th}$ of the driving transistor 6402) is applied to the gate of the driving transistor 6402. The forward voltage of the light-emitting element 6404 indicates a voltage at which a desired luminance is obtained and includes at least the forward threshold voltage. By inputting a video signal to enable the driving transistor 6402 to operate in a saturation region, current can be supplied to the light-emitting element 6404. In order that the driving transistor 6402 can operate in the saturation region, the potential of the power supply line 6407 is made higher than a gate potential of the driving transistor 6402. When an analog video signal is used, it is possible to feed current to the light-emitting element 6404 in accordance with the video signal and perform analog grayscale driving.

Note that the pixel structure illustrated in FIG. 16 is not limited thereto. For example, a switch, a resistor, a capacitor, a transistor, a logic circuit, or the like may be added to the pixel shown in FIG. 16.

Next, structures of the light-emitting element will be described with reference to FIGS. 17A to 17C. Here, a cross-sectional structure of a pixel will be described by taking an n-channel driving TFT as an example.

In order to extract light emitted from the light-emitting element, at least one of an anode and a cathode is required to transmit light. A thin film transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. The pixel structure can be applied to a light-emitting element having any of these emission structures.

Next, a light-emitting element having a bottom emission structure is described with reference to FIG. 17A.

Figure 17A:
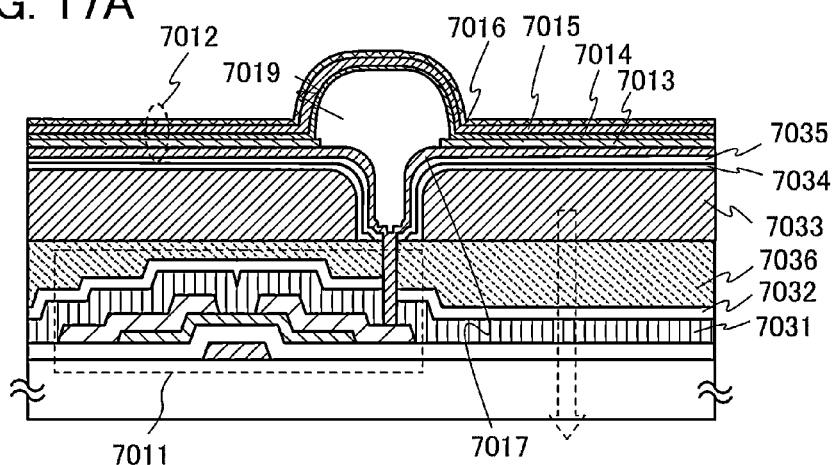
FIGS. 17A to 17C illustrate semiconductor devices.

FIG. 17A is a cross-sectional view of a pixel of the case where a driving TFT 7011 is of an n-type and light is emitted from a light-emitting element 7012 to a first electrode 7013 side. In FIG. 17A, the first electrode 7013 of the light-emitting element 7012 is formed over a light-transmitting conductive film 7017 which is electrically connected to a drain electrode layer of the driving TFT 7011, and an EL layer 7014 and a second electrode 7015 are stacked in the order presented, over the first electrode 7013.

As the light-transmitting conductive film 7017, a light-transmitting conductive film of indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like can be used.

A variety of materials can be used for the first electrode 7013 of the light-emitting element. For example, in the case where the first electrode 7013 is used as a cathode, the first electrode 7013 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 17A, the first electrode 7013 is approximately formed to a thickness such that light is transmitted (preferably, approximately 5 nm to 30 nm). For example, an aluminum film having a thickness of 20 nm is used for the first electrode 7013.

Note that the light-transmitting conductive film 7017 and the first electrode 7013 may be formed by stacking a light-transmitting conductive film and an aluminum film and then performing selective etching. In this case, the etching can be performed using the same mask, which is preferable.

Further, the periphery of the first electrode 7013 is covered with a partition wall 7019. The partition wall 7019 is formed using an organic resin film of polyimide, acrylic, polyamide, epoxy, or the like; an inorganic insulating film; or organic polysiloxane. It is particularly preferable that the partition wall 7019 be formed using a photosensitive resin material to have an opening over the first electrode 7013 so that a sidewall of the opening is formed to have an inclined surface with continuous curvature. In the case where a photosensitive resin material is used for the partition wall 7019, a step of forming a resist mask can be omitted.

As the EL layer 7014 formed over the first electrode 7013 and the partition wall 7019, an EL layer including at least a light-emitting layer is acceptable. Further, the EL layer 7014 may be formed to have either a single-layer structure or a stacked-layer structure. When the EL layer 7014 is formed using a plurality of layers, an electron-injection layer, an electron-transport layer, a light-emitting layer, a hole-transport layer, and a hole-injection layer are stacked in the order presented over the first electrode 7013 functioning as a cathode. Note that not all of these layers need to be provided except for the light-emitting layer.

The stacking order is not limited to the order presented above. The first electrode 7013 may serve as an anode, and a hole-injection layer, a hole-transport layer, a light-emitting layer, an electron-transport layer, and an electron-injection layer may be stacked in the order presented over the first electrode 7013. However, considering power consumption, it is preferable that the first electrode 7013 serve as a cathode and an electron-injection layer, an electron-transport layer, a light-emitting layer, a hole-transport layer, and a hole-injection layer be stacked in the order presented over the first electrode 7013 because an increase in voltage of a driver circuit portion can be prevented and power consumption can be reduced more effectively than in the case where the first electrode 7013 is used as the anode and the hole-injection layer, the hole-transport layer, the light-emitting layer, the electron-transport layer, and the electron-injection layer are stacked in this order over the first electrode 7013.

Further, any of a variety of materials can be used for the second electrode 7015 formed over the EL layer 7014. For example, in the case where the second electrode 7015 is used as an anode, a material having a high work function, for example, ZrN, Ti, W, Ni, Pt, Cr, or the like; or a transparent conductive material such as ITO, IZO, or ZnO is preferable. Further, a shielding film 7016, for example, a metal which blocks light, a metal which reflects light, or the like is provided over the second electrode 7015. In this embodiment, an ITO film is used as the second electrode 7015, and a Ti film is used as the shielding film 7016.

The light-emitting element 7012 corresponds to a region where the EL layer 7014 including the light-emitting layer is sandwiched between the first electrode 7013 and the second electrode 7015. In the case of the element structure illustrated in FIG. 17A, light emitted from the light-emitting element 7012 is ejected to the first electrode 7013 side as indicated by an arrow.

Note that in the example illustrated in FIG. 17A, a light-transmitting conductive film is used as a gate electrode layer and a thin light-transmitting film is used as source and drain electrode layers. Light emitted from the light-emitting element 7012 passes through a color filter layer 7033, and can be ejected through the substrate.

The color filter layer 7033 is formed with a droplet discharge method such as an ink-jet method, a printing method, an etching method with the use of a photolithography technique, or the like.

The color filter layer 7033 is covered with the overcoat layer 7034, and also covered with the protective insulating layer 7035. Note that although the overcoat layer 7034 with a small thickness is illustrated in FIG. 17A, the overcoat layer 7034 has a function to planarize roughness due to the color filter layer 7033.

A contact hole which is formed in the protective insulating layer 7035, the overcoat layer 7034, a planarization insulating layer 7036, the insulating layer 7032, and the insulating layer 7031, and which reaches the drain electrode layer is provided in a portion which overlaps with the partition wall 7019.

A light-emitting element having a dual emission structure is described with reference to FIG. 17B.

Figure 17B:
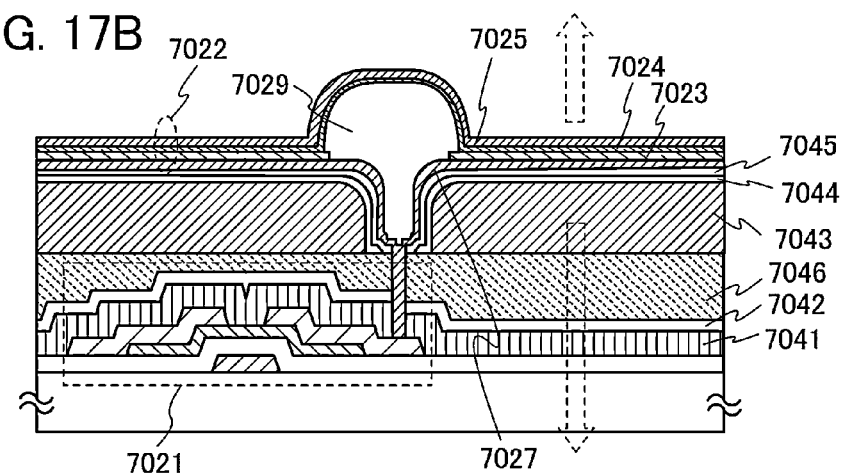

In FIG. 17B, a first electrode 7023 of a light-emitting element 7022 is formed over a light-transmitting conductive film 7027 which is electrically connected to a drain electrode layer of the driving TFT 7021, and an EL layer 7024 and a second electrode 7025 are stacked in the order presented over the first electrode 7023.

As the light-transmitting conductive film 7027, a light-transmitting conductive film of indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like can be used.

A variety of materials can be used for the first electrode 7023. For example, in the case where the first electrode 7023 is used as a cathode, the first electrode 7023 is preferably formed using, for example, a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 is used as a cathode, and the first electrode 7023 is approximately formed to a thickness such that light is transmitted (preferably, approximately 5 nm to 30 nm). For example, an aluminum layer having a thickness of 20 nm is used as the cathode.

Note that the light-transmitting conductive film 7027 and the first electrode 7023 may be formed by stacking the light-transmitting conductive film and the aluminum film and then performing selective etching. In this case, the etching can be performed using the same mask, which is preferable.

Further, the periphery of the first electrode 7023 is covered with a partition wall 7029. The partition wall 7029 is formed using an organic resin film of polyimide, acrylic, polyamide, epoxy, or the like; an inorganic insulating film; or organic polysiloxane. It is particularly preferable that the partition wall 7029 be formed using a photosensitive resin material to have an opening over the first electrode 7023 so that a sidewall of the opening is formed to have an inclined surface with continuous curvature. In the case where a photosensitive resin material is used for the partition wall 7029, a step of forming a resist mask can be omitted.

As the EL layer 7024 formed over the first electrode 7023 and the partition wall 7029, an EL layer including a light-emitting layer is acceptable. Further, the EL layer 7024 may be formed to have either a single-layer structure or a stacked-layer structure. When the EL layer 7024 is formed using a plurality of layers, an electron-injection layer, an electron-transport layer, a light-emitting layer, a hole-transport layer, and a hole-injection layer are stacked in the order presented over the first electrode 7023 functioning as a cathode. Note that not all of these layers need to be provided except for the light-emitting layer.

The stacking order is not limited to the order presented above. The first electrode 7023 may serve as an anode and a hole-injection layer, a hole-transport layer, a light-emitting layer, an electron-transport layer, and an electron-injection layer may be stacked in the order presented over the first electrode 7023. However, considering power consumption, it is preferable that the first electrode 7023 is used as a cathode and an electron-injection layer, an electron-transport layer, a light-emitting layer, a hole-transport layer, and a hole-injection layer be stacked in the order presented over the cathode because power consumption can be reduced more effectively than in the case where the first electrode 7023 is used as the anode and the hole-injection layer, the hole-transport layer, the light-emitting layer, the electron-transport layer, and the electron-injection layer are stacked in this order over the first electrode 7023.

Further, a variety of materials can be used for the second electrode 7025 formed over the EL layer 7024. For example, in the case where the second electrode 7025 is used as an anode, a material having a high work function, for example, a transparent conductive material such as ITO, IZO, or ZnO is preferable. In this embodiment, the second electrode 7025 is formed using an ITO layer including silicon oxide and is used as an anode.

The light-emitting element 7022 corresponds to a region where the EL layer 7024 including the light-emitting layer is sandwiched between the first electrode 7023 and the second electrode 7025. In the case of the element structure illustrated in FIG. 17B, light emitted from the light-emitting element 7022 is ejected to both the second electrode 7025 side and the first electrode 7023 side as indicated by arrows.

Note that in the example illustrated in FIG. 17B, a light-transmitting conductive film is used as a gate electrode layer and a thin light-transmitting film is used as source and drain electrode layers. Light emitted from the light-emitting element 7022 to the first electrode 7023 side passes through a color filter layer 7043, and can be ejected through the substrate.

The color filter layer 7043 is formed with a droplet discharge method such as an ink-jet method, a printing method, an etching method with the use of a photolithography technique, or the like.

The color filter layer 7043 is covered with the overcoat layer 7044, and also covered with the protective insulating layer 7045.

A contact hole which is formed in the protective insulating layer 7045, the overcoat layer 7044, a planarization insulating layer 7046, the insulating layer 7042, and the insulating layer 7041, and which reaches the drain electrode layer is provided in a portion which overlaps with the partition wall 7019.

Note that in the case where full-color display is realized on both display surfaces by using a light-emitting element having a dual emission structure, light emitted from the second electrode 7025 side does not pass through the color filter layer 7043; therefore, it is preferable that a sealing substrate having a color filter layer be further provided over the second electrode 7025.

Next, a light-emitting element having a top emission structure is described with reference to FIG. 17C.

Figure 17C:
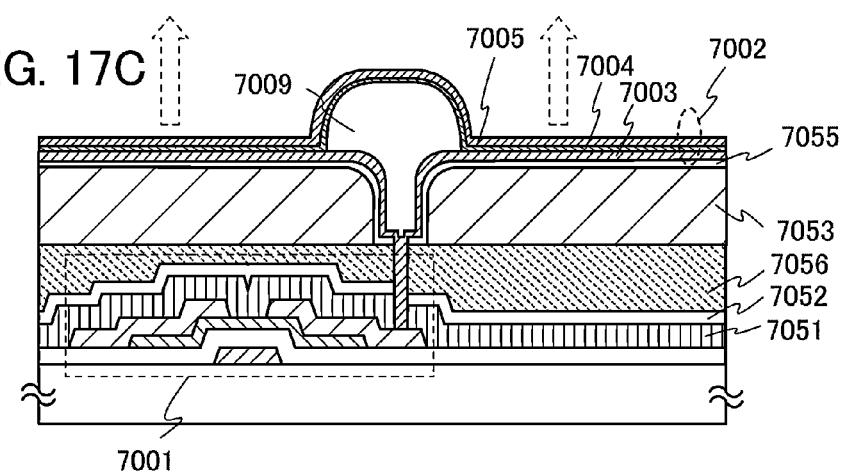

FIG. 17C is a cross-sectional view of a pixel of the case where a driving TFT 7001 is of an n-type and light emitted from a light-emitting element 7002 passes through a second electrode 7005. In FIG. 17C, a drain electrode layer of the driving TFT 7001 and a first electrode 7003 are in contact with each other, and the driving TFT 7001 and the first electrode 7003 of the light-emitting element 7002 are electrically connected to each other. An EL layer 7004 and the second electrode 7005 are stacked over the first electrode 7003 in the order presented.

Further, a variety of materials can be used for the first electrode 7003. For example, in the case where the first electrode 7003 is used as a cathode, the first electrode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

Further, the periphery of the first electrode 7003 is covered with a partition wall 7009. The partition wall 7009 is formed using an organic resin film of polyimide, acrylic, polyamide, epoxy, or the like; an inorganic insulating film; or organic polysiloxane. It is particularly preferable that the partition wall 7009 be formed using a photosensitive resin material to have an opening over the first electrode 7003 so that a sidewall of the opening is formed to have an inclined surface with continuous curvature. In the case where a photosensitive resin material is used for the partition wall 7009, a step of forming a resist mask can be omitted.

As the EL layer 7004 formed over the first electrode 7003 and the partition wall 7009, an EL layer including at least a light-emitting layer is acceptable. Further, the EL layer 7004 may be formed to have either a single-layer structure or a stacked-layer structure. When the EL layer 7004 is formed using a plurality of layers, an electron-injection layer, an electron-transport layer, a light-emitting layer, a hole-transport layer, and a hole-injection layer are stacked in the order presented over the first electrode 7003 used as a cathode. Note that not all of these layers need to be provided except for the light-emitting layer.

The stacking order is not limited to the order presented above, and a hole-injection layer, a hole-transport layer, a light-emitting layer, an electron-transport layer, and an electron-injection layer may be stacked in the order presented over the first electrode 7003 used as an anode.

In FIG. 17C, a hole-injection layer, a hole-transport layer, a light-emitting layer, an electron-transport layer, and an electron-injection layer are stacked in the order presented over a stacked-layer film in which a Ti film, an aluminum film, and a Ti film are stacked in the order presented, and thereover, a stacked layer of a thin Mg:Ag alloy film and ITO is formed.

However, in the case where the driving TFT 7001 is of an n-type, it is preferable that an electron-injection layer, an electron-transport layer, a light-emitting layer, a hole-transport layer, and a hole-injection layer be stacked in the order presented over the first electrode 7003 because an increase in voltage of a driver circuit can be prevented and power consumption can be reduced more effectively than in the case of using the layers stacked in the above order.

The second electrode 7005 is formed using a light-transmitting conductive material. For example, a light-transmitting conductive film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added, or the like can be used.

The light-emitting element 7002 corresponds to a region where the EL layer 7004 including the light-emitting layer is sandwiched between the first electrode 7003 and the second electrode 7005. In the case of the pixel illustrated in FIG. 17C, light emitted from the light-emitting element 7002 is ejected to the second electrode 7005 side as indicated by an arrow.

In FIG. 17C, the drain electrode layer of the driving TFT 7001 is electrically connected to the first electrode 7003 through a contact hole formed in a silicon oxide layer 7051, a protective insulating layer 7052, a planarization insulating layer 7056, a planarization insulating layer 7053, and an insulating layer 7055. The planarization insulating layers 7036, 7046, 7053, and 7056 can be formed using a resin material such as polyimide, acrylic, benzocyclobutene, polyamide, or epoxy. Other than such resin materials, it is also possible to use a low-dielectric constant material (low-k material), a siloxane-based resin, phosphosilicate glass (PSG), borophosphosilicate glass (BPSG), or the like. Note that the planarization insulating layers 7036, 7046, 7053, and 7056 may be formed by stacking a plurality of insulating films formed using these materials. The planarization insulating layers 7036, 7046, 7053, and 7056 can be formed, depending on the material, with a method such as a sputtering method, an SOG method, a spin coating method, a dipping method, a spray coating method, or a droplet discharge method (e.g., an ink-jet method, screen printing, or offset printing), or a tool (equipment) such as a doctor knife, a roll coater, a curtain coater, or a knife coater.

The partition wall 7009 is provided in order to insulate the first electrode 7003 from a first electrode of an adjacent pixel. The partition wall 7009 is formed using an organic resin film of polyimide, acrylic, polyamide, epoxy, or the like; an inorganic insulating film; or organic polysiloxane. It is particularly preferable that the partition wall 7009 be formed using a photosensitive resin material to have an opening over the first electrode 7003 so that a sidewall of the opening is formed as an inclined surface with continuous curvature. In the case where a photosensitive resin material is used for the partition wall 7009, a step of forming a resist mask can be omitted.

In the structure illustrated in FIG. 17C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full color display may be manufactured using four kinds of light-emitting elements which include a white light-emitting element in addition to three kinds of light-emitting elements.

In the structure of FIG. 17C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

This embodiment can be implemented in appropriate combination with any of the other embodiments.

FIGS. 18A and 18B illustrate an appearance and a cross section of a light-emitting display panel (also referred to as a light-emitting panel) according to this embodiment. FIG. 18A is a plan view of a panel in which a thin film transistor and a light-emitting element that are formed over a first substrate are sealed between the first substrate and a second substrate with a sealant. FIG. 18B is a cross-sectional view taken along H-I in FIG. 18A.

A sealant 4505 is provided to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b, which are formed over the first substrate 4501, each include a plurality of thin film transistors. A thin film transistor 4510 included in the pixel portion 4502 and a thin film transistor 4509 included in the signal line driver circuit 4503a are illustrated as an example in FIG. 18B.

Any of the thin film transistors of the embodiments 2 to 9 can be used as appropriate as the thin film transistors 4509 and 4510, and they can be formed using steps and materials similar to those for the thin film transistors of the embodiments. Hydrogen or water is reduced in the oxide semiconductor layers of the thin film transistors 4509 and 4510. Thus, the thin film transistors 4509 and 4510 are highly reliable thin film transistors.

A conductive layer is provided over a portion overlapping with the channel formation region of the oxide semiconductor layer in the thin film transistor 4509. In this embodiment, the thin film transistors 4509 and 4510 are n-channel thin film transistors.

The conductive layer 4540 is provided over part of an oxide silicon layer 4542, which overlaps with the channel formation region of the oxide semiconductor layer in the thin film transistor 4509. The conductive layer 4540 is provided at the position overlapping with the channel formation region of the oxide semiconductor layer, whereby the amount of change in threshold voltage of the thin film transistor 4509 before and after the BT test can be reduced. A potential of the conductive layer 4540 may be the same or different from that of a gate electrode layer in the thin film transistor 4509. The conductive layer 4540 can also function as a second gate electrode layer. Alternatively, the potential of the conductive layer 4540 may be GND or 0 V, or the conductive layer 4540 may be in a floating state.

Further, the silicon oxide layer 4542 is formed to cover the oxide semiconductor layer of the thin film transistor 4510. The source or drain electrode layer of the thin film transistor 4510 is electrically connected to a wiring layer 4550 in an opening formed in the silicon oxide layer 4542 and an insulating layer 4551 which are formed over the thin film transistor. The wiring layer 4550 is formed in contact with a first electrode 4517, and the thin film transistor 4510 is electrically connected to the first electrode 4517 through the wiring layer 4550.

The silicon oxide layer 4542 may be formed using a material and a method similar to those of the oxide insulating layer described in any of the embodiments.

A color filter layer 4545 is formed over the insulating layer 4551 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

An insulating layer 4544 is formed over the overcoat layer 4543. The insulating layer 4544 may be formed similarly to the protective insulating layer 303 described in Embodiment 6. For example, as the insulating layer 4544, a silicon nitride layer may be formed with a sputtering method, for example.

Reference numeral 4511 denotes a light-emitting element. The first electrode 4517 which is a pixel electrode included in the light-emitting element 4511 is electrically connected to a source electrode layer or a drain electrode layer of the thin film transistor 4510, through the wiring layer 4550. Note that the light-emitting element 4511 has a stacked-layer structure of the first electrode 4517, an electroluminescent layer 4512, and a second electrode 4513, and there is no particular limitation on the structure. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening portion over the first electrode 4517 so that a sidewall of the opening portion is formed as a tilted surface with continuous curvature.

The electroluminescent layer 4512 may be formed to have either a single-layer structure or a stacked-layer structure.

In order to prevent entry of oxygen, hydrogen, moisture, carbon dioxide, or the like into the light-emitting element 4511, a protective film may be formed over the second electrode 4513 and the partition wall 4520. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518*a* through an anisotropic conductive film 4519.

The second substrate located in the direction in which light is extracted from the light-emitting element 4511 should have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface to reduce the glare can be performed.

The sealant can be formed using a screen printing method, an ink-jet apparatus, or a dispensing apparatus. As the sealant, typically, a material containing a visible light curable resin, an ultraviolet curable resin, or a thermosetting resin can be used. Further, a filler may be contained.

As the signal line driver circuits 4503*a* and 4503*b* and the scan line driver circuits 4504*a* and 4504*b*, driver circuits formed using a single crystal semiconductor film or a polycrystalline semiconductor film over a substrate separately prepared may be used and mounted. Alternatively, only the signal line driver circuits or a part thereof, or only the scan line driver circuits or a part thereof may be separately formed and mounted. This embodiment is not limited to the structure illustrated in FIGS. 18A and 18B.

Through the above process, a highly reliable light-emitting display device (display panel) as a semiconductor device can be manufactured.

This embodiment can be implemented in appropriate combination with any of the other embodiments.

(Embodiment 12)

In this embodiment, an example of electronic paper is described as a semiconductor device according to one embodiment of the present invention.

Figure 19:
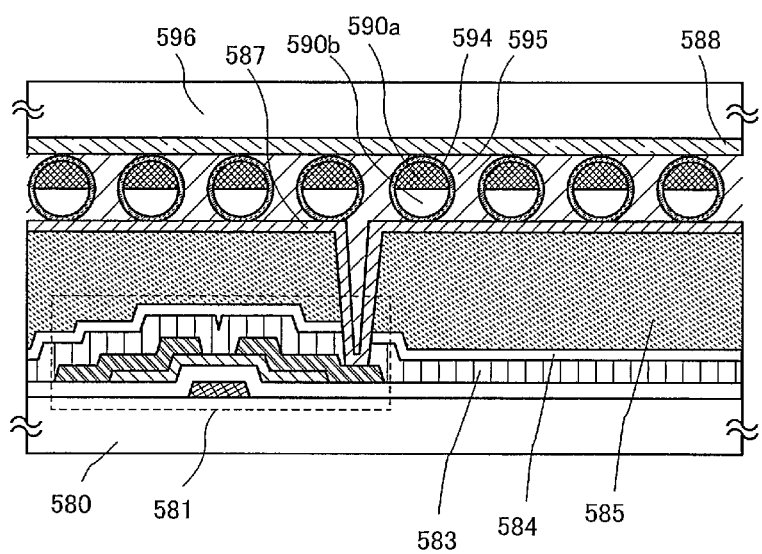
FIG. 19 illustrates a semiconductor device.

FIG. 19 illustrates an active matrix electronic paper as an example of a semiconductor device to which an embodiment of the present invention is applied. In this embodiment, the thin film transistor described in Embodiment 5 is used as a thin film transistor 581, for example. Hydrogen or water is reduced in the oxide semiconductor layer of the thin film transistor 581. Thus, the thin film transistor 581 is a highly reliable thin film transistor.

The electronic paper in FIG. 19 is an example of a display device using a twisting ball display system. The twisting ball display system refers to a system in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 has a bottom-gate structure in which source and drain electrode layers are electrically connected to a first electrode layer 587 through an opening formed in a silicon oxide layer 583, a protective insulating layer 584 and an insulating layer 585.

Between the first electrode layer 587 and the second electrode layer 588, spherical particles are provided. Each spherical particle includes a black region 590*a* and a white region 590*b*, and a cavity 594 filled with liquid around the black region 590*a* and the white region 590*b*. The circumference of the spherical particle is filled with a filler 595 such as a resin (see FIG. 19). In this embodiment, the first electrode layer 587 corresponds to a pixel electrode and the second electrode layer 588 provided on a counter substrate 596 corresponds to a common electrode.

Further, instead of the spherical element, an electrophoretic element can also be used. A microcapsule having a diameter of about 10 μm to 200 μm in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move in opposite directions to each other, so that white or black can be displayed. A display element using this principle is an electrophoretic display element, and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above steps, highly reliable electronic paper can be manufactured as a semiconductor device.

The logic circuit described in Embodiment 1 can be used for, for example, a driver circuit of the electronic paper in this embodiment. Further, since a transistor including an oxide semiconductor layer can be applied to a transistor in the display portion, the driver circuit and the display portion can be provided over one substrate, for example.

This embodiment can be implemented in appropriate combination with any of the other embodiments.

(Embodiment 13)

The semiconductor devices disclosed in this specification can be applied to a variety of electronic devices (including an amusement machine in its category). Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

Figure 20A:
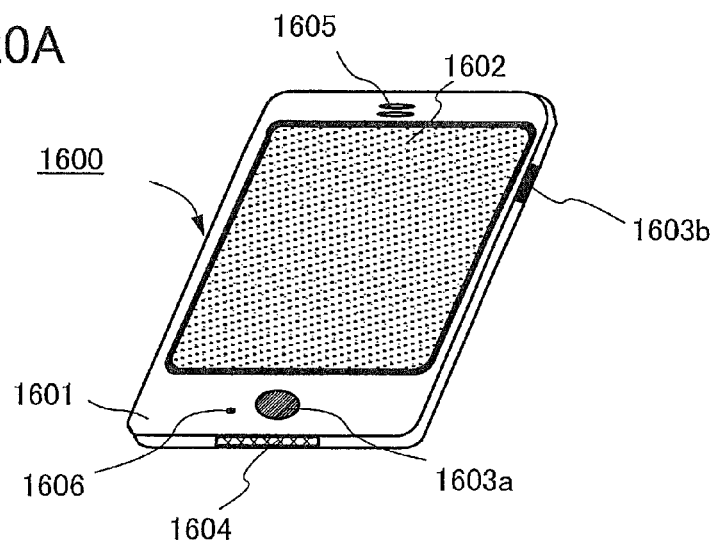
FIGS. 20A and 20B illustrate electronic appliances.

FIG. 20A illustrates an example of a mobile phone. A mobile phone 1600 is provided with a display portion 1602 incorporated in a housing 1601, operation buttons 1603*a* and 1603*b*, an external connection port 1604, a speaker 1605, a microphone 1606, and the like.

When the display portion 1602 of the mobile phone 1600 illustrated in FIG. 20A is touched with a finger or the like, data can be input into the mobile phone 1600. Further, operations such as making a call and composing a mail can be performed by touching the display portion 1602 with a finger or the like.

There are mainly three screen modes of the display portion 1602. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1602 so that text displayed on a screen can be input. In this case, it is preferable to display a keyboard or number buttons on almost all area of the screen of the display portion 1602.

When a detection device including a sensor for detecting inclination, such as a gyroscope or an acceleration sensor, is provided inside the mobile phone 1600, display of the screen on the display portion 1602 can be automatically switched by determining the direction of the mobile phone 1600 (whether the mobile phone 1600 is placed horizontally or vertically for a landscape mode or a portrait mode).

The screen modes are switched by touching the display portion 1602 or operating the operation buttons 1603*a* and 1603*b* of the housing 1601. Alternatively, the screen modes may be switched depending on the kind of the image displayed on the display portion 1602. For example, when a signal for an image displayed in the display portion is data of moving images, the screen mode is switched to the display mode. When the signal is text data, the screen mode is switched to the input mode.

Further, in the input mode, when input by touching the display portion 1602 is not performed for a certain period while a signal detected by the optical sensor in the display portion 1602 is detected, the screen mode may be controlled so as to be switched from the input mode to the display mode.

The display portion 1602 may function as an image sensor. For example, an image of the palm print, the fingerprint, or the like is taken by touching the display portion 1602 with the palm or the finger, whereby personal authentication can be performed. Further, by providing a backlight or sensing light source emitting a near-infrared light for the display portion, an image of a finger vein, a palm vein, or the like can be taken.

Any of the semiconductor devices described in the embodiments can be applied to the display portion 1602. For example, a plurality of thin film transistors described in the embodiments can be disposed as switching elements in pixels.

Figure 20B:
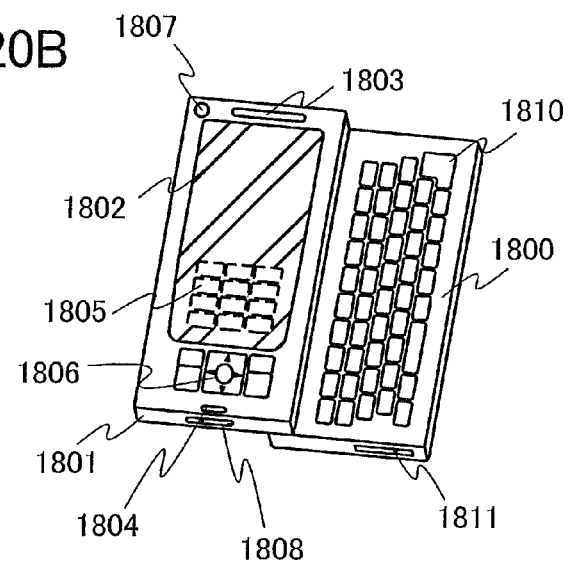

FIG. 20B also illustrates an example of a mobile phone. A portable information terminal whose example is illustrated in FIG. 20B can have a plurality of functions. For example, in addition to a telephone function, such a portable information terminal can have a function of processing a variety of pieces of data by incorporating a computer.

The portable information terminal illustrated in FIG. 20B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1800.

The display panel 1802 is provided with a touch panel. A plurality of operation keys 1805 displayed as images is indicated by dashed lines in FIG. 20B.

Further, in addition to the above structure, a contactless IC chip, a small memory device, or the like may be incorporated.

The semiconductor device described in any of the embodiments can be used for the display panel 1802. In the display panel 1802, the direction of display is changed appropriately depending on an application mode. Further, the portable information terminal is provided with the camera lens 1807 on the same surface as the display panel 1802, and thus it can be used as a video phone. The speaker 1803 and the microphone 1804 can be used for videophone calls, recording, playing sound, etc. as well as voice calls. Moreover, the housings 1800 and 1801 in a state where they are developed as illustrated in FIG. 20B can be slid so that one is lapped over the other; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 21A:
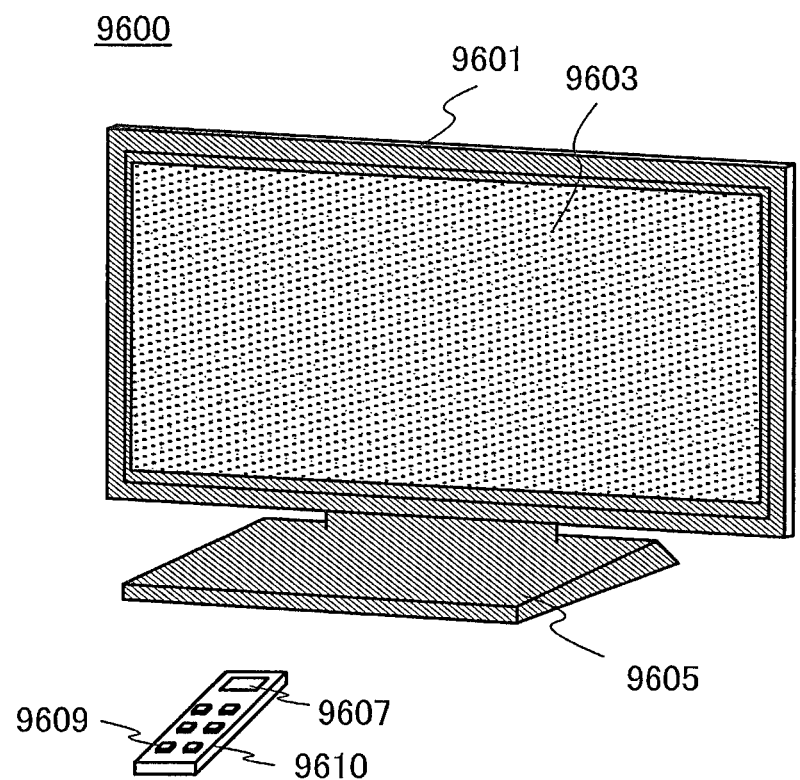
FIGS. 21A and 21B illustrate electronic appliances.

FIG. 21A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. With the use of the receiver, general TV broadcasts can be received. Moreover, when the display device is connected to a communication network with or without wires via the modem, one-way (from a sender to a receiver) or two-way (between a sender and a receiver or between receivers) information communication can be performed.

The semiconductor devices described in any of the embodiments can be applied to the display portion 9603. In the display portion 9603, for example, the plurality of thin film transistors described in any of the other embodiments can be provided as switching elements of pixels.

Figure 21B:
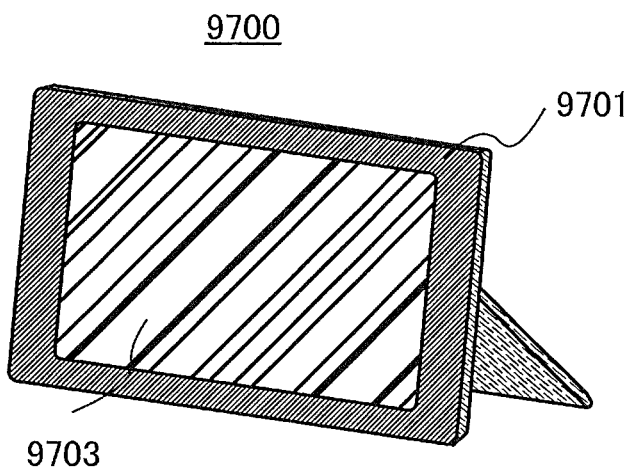

FIG. 21B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

The semiconductor devices described in any of the embodiments can be applied to the display portion 9703. In the display portion 9703, for example, the plurality of thin film transistors described in any of the other embodiments can be provided as switching elements of pixels.

Note that the digital photo frame 9700 is provided with an operation portion, an external connection terminal (a USB terminal, a terminal connectable to a variety of cables such as a USB cable, or the like), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame and the data is loaded, whereby the image can be displayed on the display portion 9703.

The digital photo frame 9700 may be configured to transmit and receive data wirelessly. Through wireless communication, desired image data can be loaded to be displayed.

Figure 22:
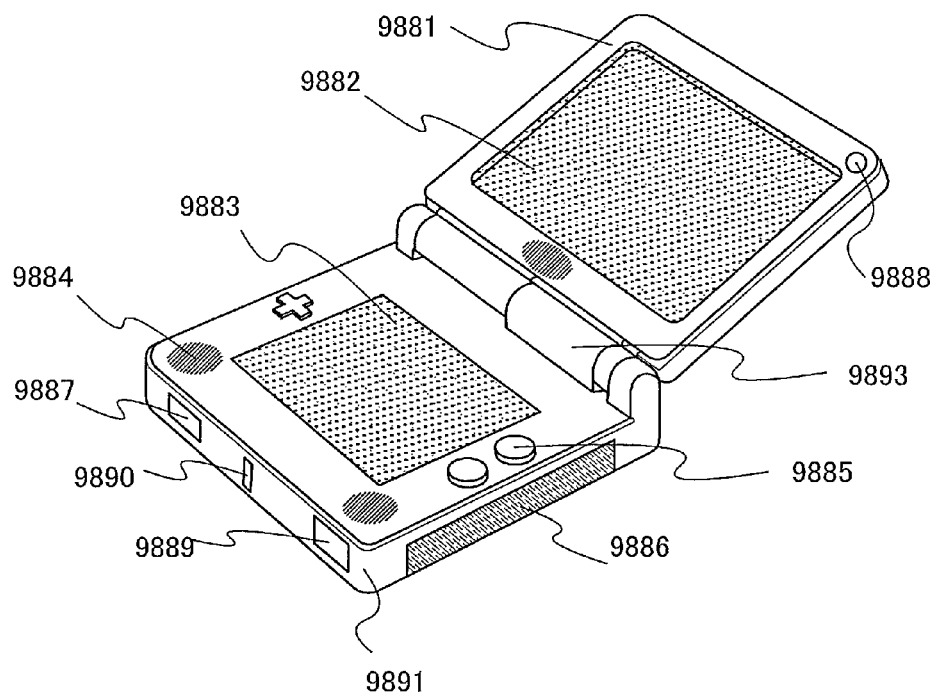
FIG. 22 illustrates an electronic appliance.

FIG. 22 is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively.

The semiconductor devices described in any of the embodiments can be applied to the display portion 9883. In the display portion 9883, for example, the plurality of thin film transistors described in any of the other embodiments can be provided as switching elements of pixels.

In addition, the portable game machine illustrated in FIG. 22 is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least the thin film transistor disclosed in this specification can be employed. The portable game machine may include an additional accessory as appropriate. The portable game machine illustrated in FIG. 22 has a function of reading a program or data stored in the recording medium to display it on the display portion, and a function of sharing data with another portable game machine by wireless communication. Note that a function of the portable game machine illustrated in FIG. 22 is not limited to these, and the portable game machine can have a variety of functions.

(Embodiment 14)

The semiconductor device disclosed in this specification can be used as electronic paper. Electronic paper can be used in electronic devices in all fields as long as they display information. For example, electronic paper can be applied to an e-book reader (an electronic book), a poster, an advertisement in a vehicle such as a train, or displays of various cards such as a credit card. An example of such electronic devices is illustrated in FIG. 23.

Figure 23:
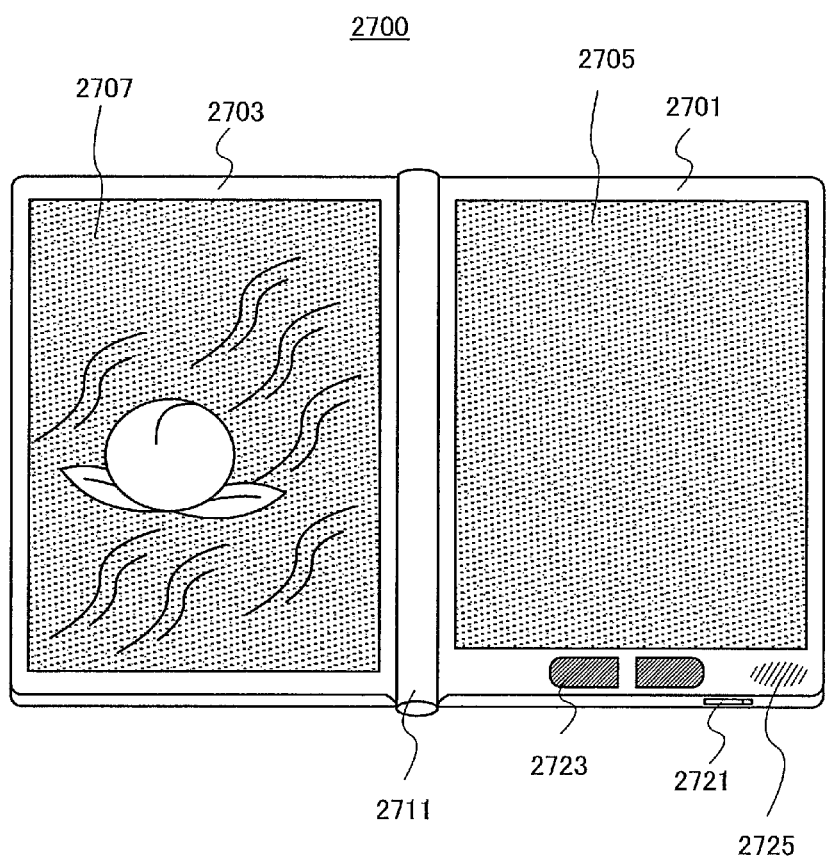
FIG. 23 illustrates an electronic appliance.

FIG. 23 illustrates an example of an e-book reader. For example, an e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure enables the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 23) can display text and a display portion on the left side (the display portion 2707 in FIG. 23) can display graphics.

FIG. 23 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in appropriate combination with the other embodiments.

(Embodiment 15)

In accordance with an embodiment of the present invention, impurities to be donors (or acceptors) of carriers in an oxide semiconductor are reduced to a very low level, whereby the oxide semiconductor is made to be intrinsic or substantially intrinsic, and the oxide semiconductor is used for a thin film transistor.

Figure 24:
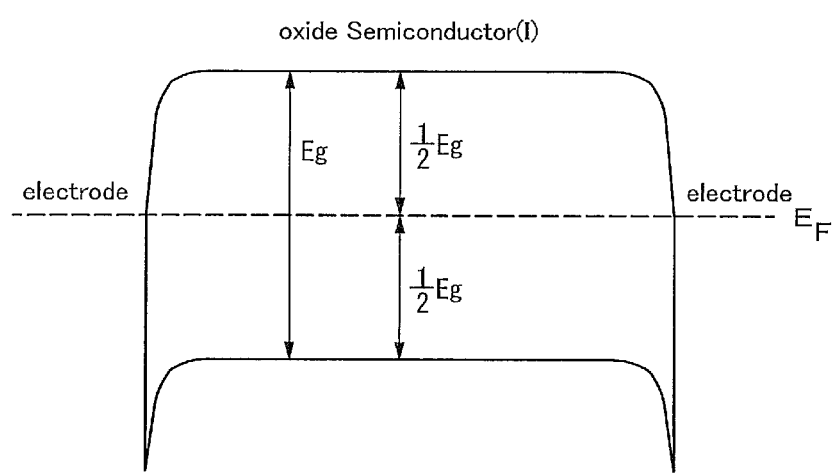
FIG. 24 illustrates a source-drain band structure of a MOS transistor formed using an oxide semiconductor.

FIG. 24 is a band structure of a portion between a source and a drain of such a transistor. For a highly purified oxide semiconductor, the Fermi level is located in the middle of the forbidden band under an ideal condition.

In this case, $\phi_m$ is a work function and $\chi$ is an electron affinity of the oxide semiconductor.

Here, at a junction surface, the Fermi level of metal for an electrode is the same as the level of the conduction band of an oxide semiconductor if the equation $\phi_m=\chi$ is satisfied. When the right side of the equation is greater than the left side, an ohmic contact is provided. It is assumed that an oxide semiconductor has a band gap of 3.05 eV and an electron affinity of 4.3 eV and is in an intrinsic state (the carrier density: approximately $1\times10^{-7}/cm^3$), and a source electrode and a drain electrode are formed using titanium (Ti) having a work function of 4.3 eV. Under these conditions, a Shottky barrier with respect to electrons is not formed as illustrated in FIG. 24.

Figure 25:
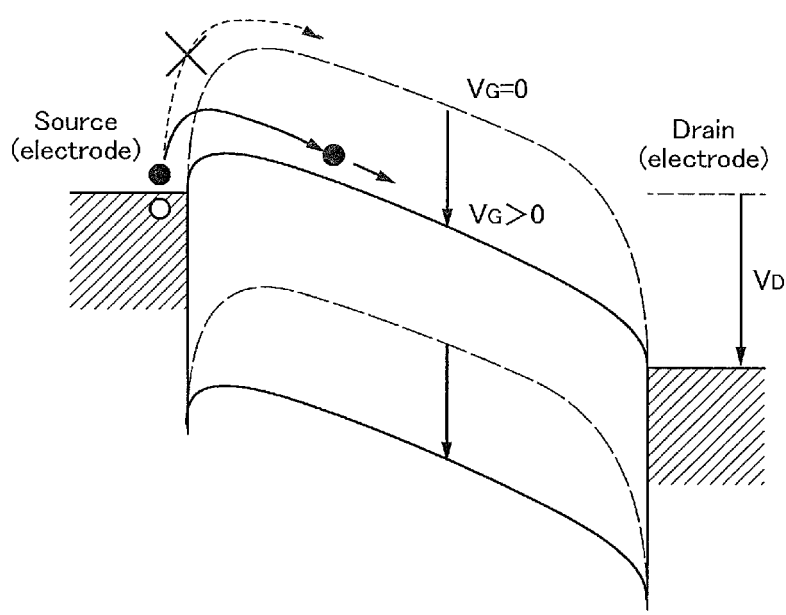
FIG. 25 illustrates a state where a positive voltage is applied on the drain side in FIG. 24.

FIG. 25 illustrates a state where a positive voltage is applied to the drain side in a transistor formed using an oxide semiconductor. FIG. 25 illustrates the case where a positive voltage (VD>0) is applied and a voltage is not applied to a gate (VG=0) (shown by dashed lines) or a positive voltage is applied to a gate (VG>0) (shown by solid lines). Since the band gap of an oxide semiconductor is wide, the intrinsic carrier density of a highly purified oxide semiconductor which is intrinsic or substantially intrinsic is zero or as close as zero. In the case where a voltage is not applied to the gate, a carrier (electron) is not injected to the oxide semiconductor side from an electrode because of high ohmic contact resistance, so that a current does not flow, which means an off state. On the other hand, when a positive voltage is applied to the gate, ohmic contact resistance is reduced, and thus a current flows, which means an in state.

Figure 26A:
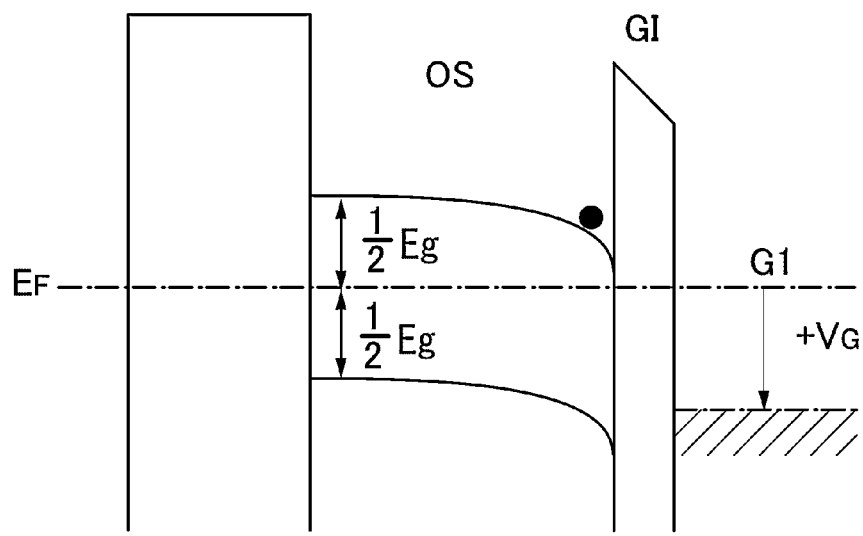
FIGS. 26A and 26B are energy band diagrams of a MOS transistor formed using an oxide semiconductor in the case where a gate voltage is positive and the case where a gate voltage is negative, respectively.

FIG. 26A is an energy band diagram of a MOS transistor formed using an oxide semiconductor, to which a positive gate voltage is applied. In this case, almost no thermally excited carriers exist in a highly purified oxide semiconductor. Thus, carriers are not stored also in the vicinity of a gate insulating film. However, as illustrated in FIG. 25, transmission of carriers injected from the source side is possible.

Figure 26B:
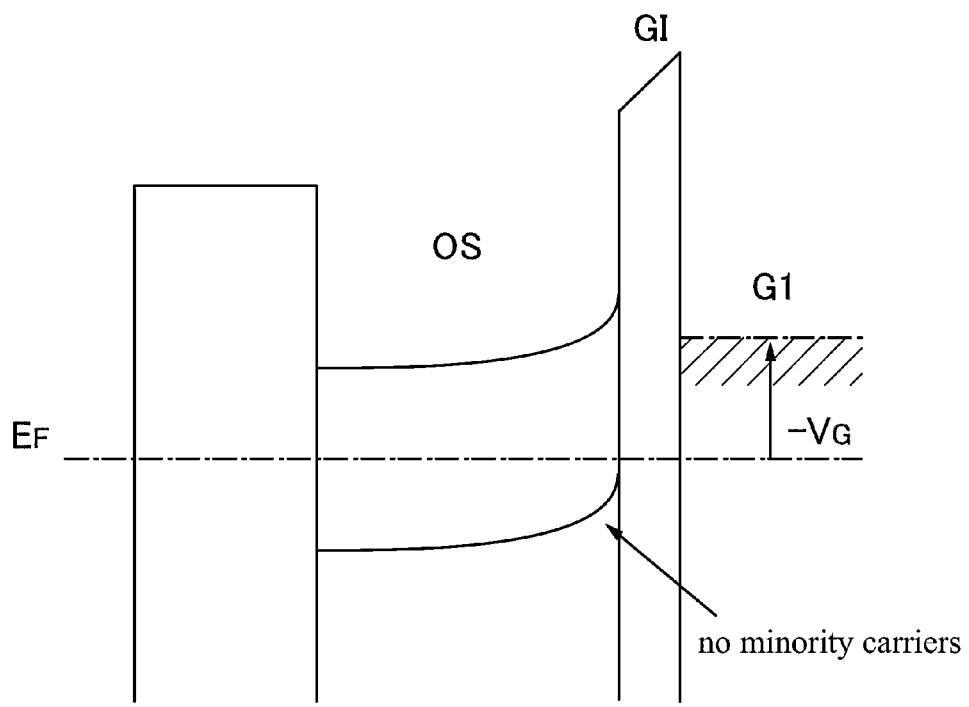

FIG. 26B is an energy band diagram of a MOS transistor formed using an oxide semiconductor, to which a negative gate voltage is applied. There are almost no minority carriers (holes) in an oxide semiconductor; therefore, carriers are not stored also in the vicinity of a gate insulating film. This means that off current is small.

Figure 27:
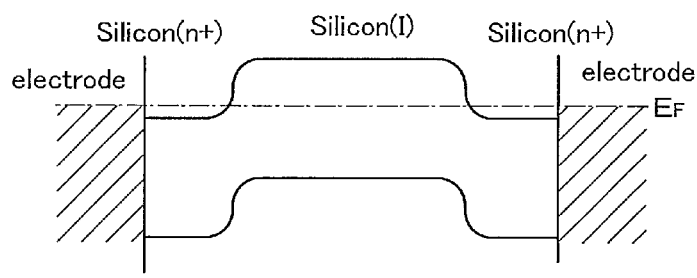
FIG. 27 illustrates a source-drain band structure of a silicon MOS transistor.

FIG. 27 is a band diagram of a transistor formed using a silicon semiconductor. For a silicon semiconductor, the band gap is 1.12 eV, the intrinsic carrier density is $1.45\times10^{10}/cm^3$ (300 K), and carriers exist even at room temperatures. The thermally excited carriers are not negligible even at room temperatures. Thus, off current is greatly varied depending on a temperature.

In such a manner, not only by simply using an oxide semiconductor with a wide band gap for a transistor, but also by reducing impurities to be donors, such as hydrogen, and thus setting the carrier density to $1\times10^{14}/cm^3$ or less, preferably $1\times10^{12}/cm^3$ or less, carriers excited by heat applied to the transistor at practical operation temperatures can be removed, so that a transistor can be operated by only carriers injected from the source side. Accordingly, it is possible to obtain a transistor whose off current is reduced to $1\times10^{-13}$ [A] or less and is hardly changed due to temperature change, whereby the transistor can be operated in an extremely stable manner.

(Embodiment 16)

In this embodiment, measured values of off current using a test element group (also referred to as a TEG) will be described below.

Figure 28:
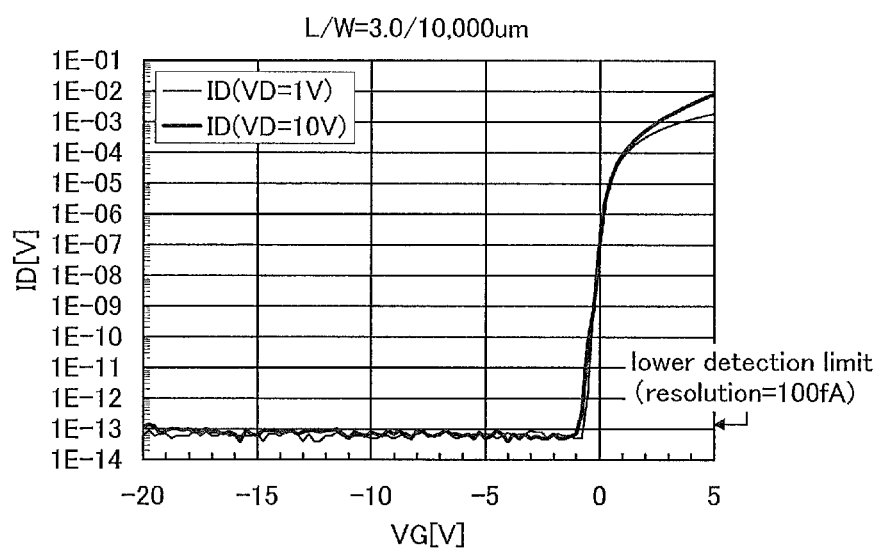
FIG. 28 is a graph showing initial characteristics of a thin film transistor.
Figure 29A:
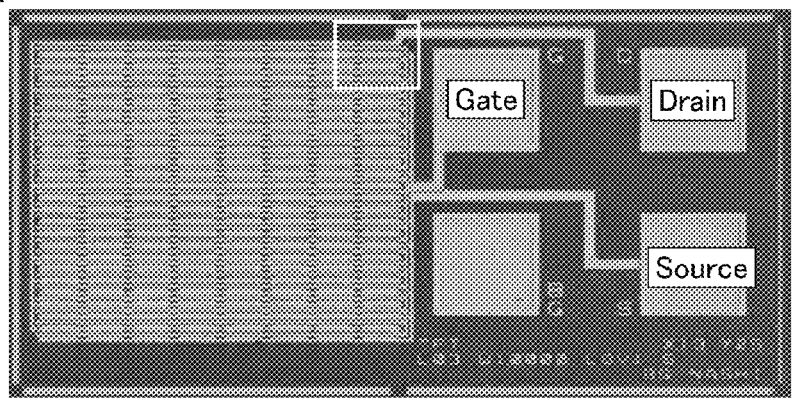
FIGS. 29A and 29B are top plan views illustrating a thin film transistor.
Figure 29B:
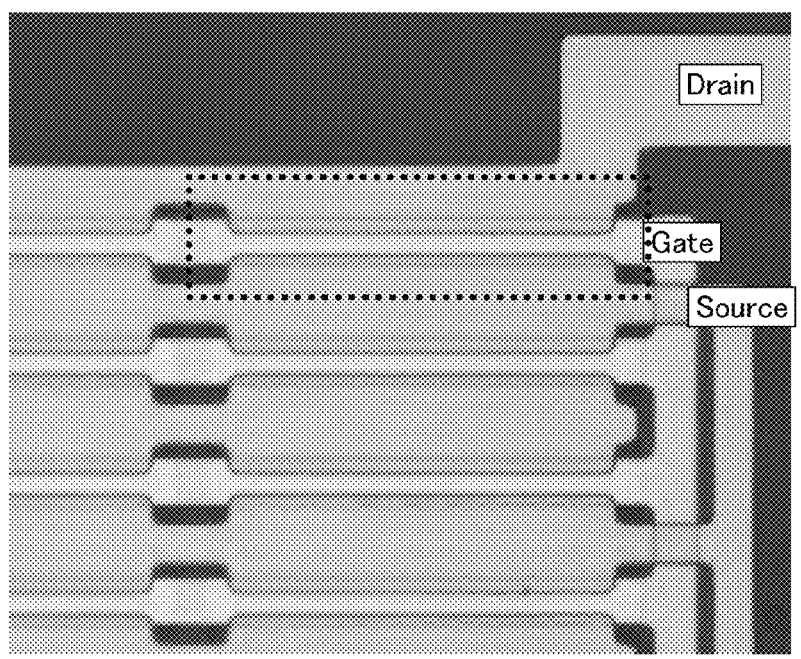

FIG. 28 shows initial characteristics of a thin film transistor with L/W=3 μm/10000 μm in which 200 thin film transistors each virtually with L/W=3 μm/50 μm are connected in parallel. In addition, a top view is shown in FIG. 29A and a partially enlarged top view thereof is show in FIG. 29B. The region enclosed by a dotted line in FIG. 29B is a thin film transistor of one stage with L/W=3 μm/50 μm and Lov=1.5 μm. In order to measure initial characteristics of the thin film transistor, the changing characteristics of the source-drain current (hereinafter referred to as a drain current or Id), i.e., Vg-Id characteristics, were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 28 shows Vg in the range of from −20 V to +5 V.

As shown in FIG. 28, the thin film transistor having a channel width W of 10000 μm has an off current of $1\times10^{-13}$ A or less at Vd of 1 V and 10 V, which is less than or equal to the resolution (100 fA) of a measurement device (a semiconductor parameter analyzer, Agilent 4156C manufactured by Agilent Technologies Inc.). The off current of the transistor per 10000 micrometers in channel width W is $1\times10^{-13}$ A or less. Thus, it can be said that the off current of the transistor per micrometer in channel width W is $1\times10^{-13}$ A or less. Further, the off current of the transistor per 10000 micrometers in channel width W, which is $1\times10^{-13}$ A or less, can be converted into the off current of the transistor per micrometer in channel width W, which is $1\times10^{-17}$ A or less.

A method for manufacturing the thin film transistor used for the measurement is described.

First, a silicon nitride layer was formed as a base layer over a glass substrate by a CVD method, and a silicon oxynitride layer was formed over the silicon nitride layer. A tungsten layer was formed as a gate electrode layer over the silicon oxynitride layer by a sputtering method. Here, the gate electrode layer was formed by selectively etching the tungsten layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based oxide semiconductor film formation target (at a molar ratio of $In_2O_3:Ga_2O_3:ZnO=1:1:2$). Here, an island-shaped oxide semiconductor layer was formed by selectively etching the oxide semiconductor layer.

Then, first heat treatment was performed on the oxide semiconductor layer in a nitrogen atmosphere in a clean oven at 450° C. for 1 hour.

Then, a titanium layer (having a thickness of 150 nm) was formed as a source electrode layer and a drain electrode layer over the oxide semiconductor layer by a sputtering method. Here, the source electrode layer and the drain electrode layer were formed by selective etching such that 200 thin film transistors each having a channel length L of 3 μm and a channel width W of 50 μm were connected in parallel to obtain a thin film transistor virtually with L/W=3 μm/10000 μm.

Then, a silicon oxide layer having a thickness of 300 nm was formed as a protective insulating layer in contact with the oxide semiconductor layer by a reactive sputtering method. Here, opening portions were formed over the gate electrode layer, the source electrode layer, and the drain electrode layer by selectively etching the silicon oxide layer which is a protective layer. After that, second heat treatment was performed in a nitrogen atmosphere at 250° C. for 1 hour.

Then, heat treatment was performed at 150° C. for 10 hours before the measurement of Vg-Id characteristics.

Through the above process, a bottom-gate thin film transistor was manufactured.

The reason why the thin film transistor has an off current of approximately $1\times10^{-13}$ A as shown in FIG. 28 is that the concentration of hydrogen in the oxide semiconductor layer could be sufficiently reduced in the above manufacturing process. The concentration of hydrogen in the oxide semiconductor layer is $5\times10^{19}/cm^3$ or less, preferably $5\times10^{18}/cm^3$ or less, more preferably $5\times10^{17}/cm^3$ or less. Note that the concentration of hydrogen in the oxide semiconductor layer was measured by secondary ion mass spectrometry (SIMS).

Although the example of using an In—Ga—Zn—O-based oxide semiconductor is described, this embodiment is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. Furthermore, as an oxide semiconductor material, an In—Al—Zn—O-based oxide semiconductor mixed with $AlO_x$ of 2.5 wt % to 10 wt % or an In—Zn—O-based oxide semiconductor mixed with $SiO_x$ of 2.5 wt % to 10 wt % can be used.

The carrier concentration of the oxide semiconductor layer which is measured by a carrier measurement device is lower than or equivalent to the carrier concentration of silicon, $1.45\times10^{10}/cm^3$, preferably less than $5\times10^{14}/cm^3$, more preferably $5\times10^{12}/cm^3$ or less. In other words, the carrier concentration of the oxide semiconductor layer can be made as close to zero as possible.

The thin film transistor can also have a channel length L of 10 nm to 1000 nm, which enables an increase in circuit operation speed, and the off current is extremely small, which enables a further reduction in power consumption.

In addition, in circuit design, the oxide semiconductor layer can be regarded as an insulator when the thin film transistor is in an off state.

After that, the temperature characteristics of off current of the thin film transistor manufactured in this embodiment were evaluated. Temperature characteristics are important in considering the environmental resistance, maintenance of performance, or the like of an end product in which the thin film transistor is used. It is to be understood that a smaller amount of change is more preferable, which increases the degree of freedom for product designing.

For the temperature characteristics, the Vg-Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 30A:
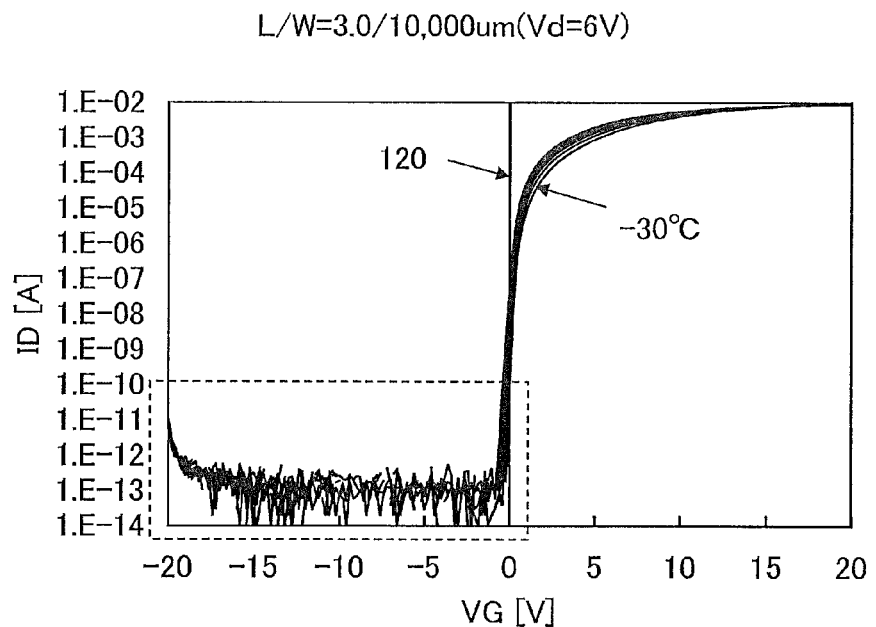
FIGS. 30A and 30B are a graph showing Vg-Id characteristics of a thin film transistor.
Figure 30B:
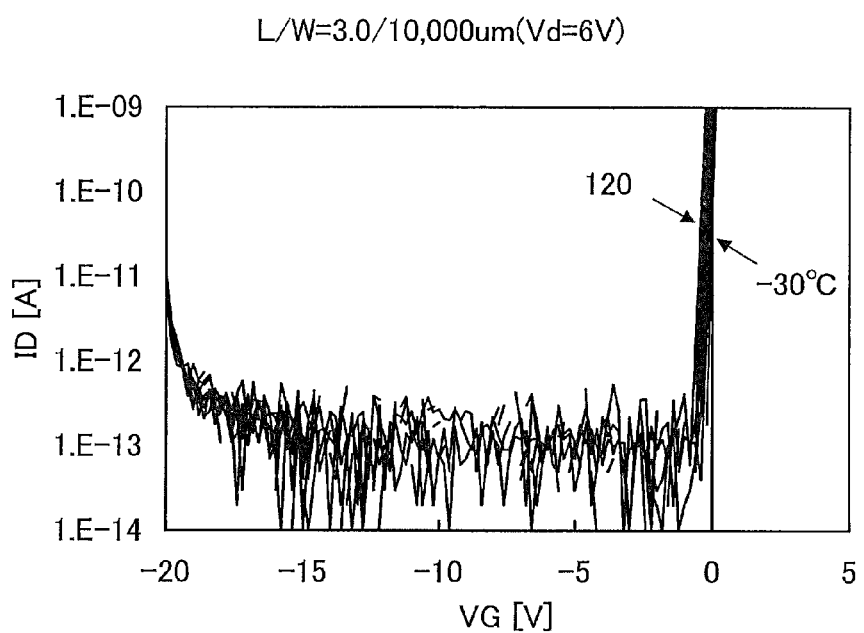

FIG. 30A shows Vg-Id characteristics measured at the above temperatures and superimposed on one another, and FIG. 30B shows an enlarged view of a range of off current enclosed by a dotted line in FIG. 30A. The rightmost curve indicated by an arrow in the diagram is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 30B, the off currents are less than or equal to $1\times10^{-12}$ A, which is near the resolution of the measurement device, at all temperatures except in the vicinity of a gate voltage of 20 V, and the temperature dependence thereof is not observed. In other words, even at a high temperature of 120° C., the off current is kept less than or equal to $1\times10^{-12}$ A, and given that the channel width W is 10000 μm, it can be seen that the off current is significantly small.

A thin film transistor including a purified oxide semiconductor shows almost no dependence of off current on temperature. This also results from the fact that the oxide semiconductor has an energy gap of 3 eV or more and includes very few intrinsic carriers. In addition, the source region and the drain region are in a degenerated state, which is also a factor for showing no temperature dependence. The thin film transistor is mainly operated with carriers which are injected from the degenerated source region to the oxide semiconductor, and the above characteristics (independence of off current on temperature) can be explained by independence of carrier density on temperature.

In the case where a memory circuit (memory element) or the like is manufactured using a thin film transistor having such an extremely small off current, there is very little leakage. Therefore, memory data can be stored for a longer period of time. Note that memory elements here includes a logic circuit in its category.

This application is based on Japanese Patent Application serial no. 2009-238918 filed with Japan Patent Office on Oct. 16, 2009, the entire contents of which are hereby incorporated by reference.

EXPLANATION of REFERENCE

100: logic circuit, 101: transistor, 102: transistor, 103: capacitor, 104: transistor, 105: transistor, 106: capacitor, 107: transistor, 108: transistor, 109: capacitor, 110: transistor, 111: transistor, 112: capacitor, 121: node, 122: node, 123: node, 124: node, 131: unit logic circuit, 132: unit logic circuit, 141: period, 142: period, 143: period, 144: period, 145: period, 146: period, 147: period, 148: period, 149: period, 150: period, 151: logic circuit, 152: logic circuit, 153: logic circuit, 300: substrate, 302: gate insulating layer, 303: protective insulating layer, 310: thin film transistor, 311: gate electrode layer, 313: channel formation region, 314*a*: high-resistance source region, 314*b*: high-resistance drain region, 315*a*: source electrode layer, 315*b*: drain electrode layer, 316: oxide insulating layer, 320: substrate, 322: gate insulating layer, 323: protective insulating layer, 330: oxide semiconductor film, 331: oxide semiconductor layer, 332: oxide semiconductor layer, 340: substrate, 342: gate insulating layer, 343: protective insulating layer, 345: oxide semiconductor film, 346: oxide semiconductor layer, 350: thin film transistor, 351: gate electrode layer, 352: oxide semiconductor layer, 355*a*: source electrode layer, 355*b*: drain electrode layer, 356: oxide insulating layer, 360: thin film transistor, 361: gate electrode layer, 362: oxide semiconductor layer, 363: channel formation region, 364a: high-resistance source region, 364b: high-resistance drain region, 365a: source electrode layer, 365b: drain electrode layer, 366: oxide insulating layer, 370: substrate, 372a: first gate insulating layer, 372b: second gate insulating layer, 373: protective insulating layer, 380: thin film transistor, 381: gate electrode layer, 382: oxide semiconductor layer, 385a: source electrode layer, 385b: drain electrode layer, 386: oxide insulating layer, 390: thin film transistor, 391: gate electrode layer, 392: oxide semiconductor layer, 393: oxide semiconductor film, 394: substrate, 395a: source electrode layer, 395b: drain electrode layer, 396: oxide insulating layer, 397: gate insulating layer, 398: protective insulating layer, 399: oxide semiconductor layer, 400: substrate, 402: gate insulating layer, 407: insulating layer, 410: thin film transistor, 411: gate electrode layer, 412: oxide semiconductor layer, 414a: wiring layer, 414b: wiring layer, 415a: source or drain electrode layer, 415b: source or drain electrode layer, 420: silicon substrate, 421a: opening, 421b: opening, 422: insulating layer, 423: opening, 424: conductive layer, 425: thin film transistor, 426: thin film transistor, 427: conductive layer, 438: wiring layer, 450: substrate, 452: gate insulating layer, 457: insulating layer, 460: thin film transistor, 461: gate electrode layer, 461a: gate electrode layer, 461b: gate electrode layer, 462: oxide semiconductor layer, 464: wiring layer, 465a: source or drain electrode layer, 465a1: source or drain electrode layer, 465a2: source or drain electrode layer, 465b: source or drain electrode layer, 468: wiring layer, 580: substrate, 581: thin film transistor, 583: silicon oxide layer, 584: protective insulating layer, 585: insulating layer, 587: electrode layer, 588: electrode layer, 590a: black region, 590b: white region, 594: cavity, 595: filler, 596: counter substrate, 1600: mobile phone, 1601: housing, 1602: display portion, 1603a: operation button, 1603b: operation button, 1604: external connection port, 1605: speaker, 1606: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: e-book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4021: insulating layer, 4030: pixel electrode layer, 4031: counter electrode layer, 4032: insulating layer, 4033: insulating layer, 4035: spacer, 4040: conductive layer, 4041: insulating layer, 4042: protective insulating layer, 4501: substrate, 4502: pixel portion, 4503a: signal line driver circuit, 4503b: signal line driver circuit, 4504a: scan line driver circuit, 4504b: scan line driver circuit, 4505: sealant, 4506: substrate, 4507: filler, 4509: thin film transistor, 4510: thin film transistor, 4511: light-emitting element, 4512: electroluminescent layer, 4513: electrode, 4515: connection terminal electrode, 4516: terminal electrode, 4517: electrode, 4518a: FPC, 4518b: FPC, 4519: anisotropic conductive film, 4520: partition wall, 4540: conductive layer, 4542: silicon oxide layer, 4543: overcoat layer, 4544: insulating layer, 4545: color filter layer, 4550: wiring layer, 4551: insulating layer, 5300: substrate, 5301: pixel portion, 5302: scan line driver circuit, 5303: scan line driver circuit, 5304: signal line driver circuit, 5305: timing control circuit, 5601: shift register, 5602: switching circuit, 5603: thin film transistor, 5604: wiring, 5605: wiring, 6400: pixel, 6401: switching transistor, 6402: driving transistor, 6403: capacitor, 6404: light-emitting element, 6405: signal line, 6406: scan line, 6407: power supply line, 6408: common potential line, 7001: driving TFT, 7002: light-emitting element, 7003: electrode, 7004: EL layer, 7005: electrode, 7009: partition wall, 7011: driving TFT, 7012: light-emitting element, 7013: electrode, 7014: EL layer, 7015: electrode, 7016: shielding film, 7017: conductive film, 7019: partition wall, 7021: driving TFT, 7022: light-emitting element, 7023: electrode, 7024: EL layer, 7025: electrode, 7026: electrode, 7027: conductive film, 7029: partition wall, 7031: insulating layer, 7032: insulating layer, 7033: color filter layer, 7034: overcoat layer, 7035: protective insulating layer, 7036: planarization insulating layer, 7041: insulating layer, 7042: insulating layer, 7043: color filter layer, 7044: overcoat layer, 7045: protective insulating layer, 7046: planarization insulating layer, 7051: silicon oxide layer, 7052: protective insulating layer, 7053: planarization insulating layer, 7055: insulating layer, 7056: planarization insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, and 9893: joint portion.

What is claimed is:

1. A semiconductor device comprising:

first to eighth transistors, wherein one of source and drain of the first transistor is electrically connected to one of source and drain of the second transistor, wherein one of source and drain of the third transistor is electrically connected to a gate of the first transistor, wherein one of source and drain of the fourth transistor is electrically connected to a gate of the second transistor, wherein one of source and drain of the fifth transistor is electrically connected to one of source and drain of the sixth transistor, wherein one of source and drain of the seventh transistor is electrically connected to a gate of the fifth transistor, wherein one of source and drain of the eighth transistor is electrically connected to a gate of the sixth transistor, wherein the other of source and drain of the first transistor is electrically connected to the other of source and drain of the fifth transistor, wherein the other of source and drain of the second transistor is electrically connected to the other of source and drain of the sixth transistor, wherein the other of source and drain of the third transistor is electrically connected to the other of source and drain of the eighth transistor, wherein the other of source and drain of the fourth transistor is electrically connected to the other of source and drain of the seventh transistor, wherein the one of source and drain of the first transistor is electrically connected to a first output terminal, wherein the other of source and drain of the third transistor is electrically connected to a first input terminal, wherein the other of source and drain of the fourth transistor is electrically connected to a second input terminal, and wherein the one of source and drain of the fifth transistor is electrically connected to a second output terminal.

2. A display device comprising:
a driver circuit comprising the semiconductor device according to claim 1; and
a pixel portion including a pixel whose display state is controlled by the driver circuit.

3. An electronic device comprising:
the semiconductor device according to claim 1 or the display device according to claim 2; and
an input unit, an LED lamp, or a speaker.

4. A semiconductor device comprising:
first to eighth transistors; and
first to fourth capacitor,
wherein one of source and drain of the first transistor is electrically connected to one of source and drain of the second transistor,
wherein one of source and drain of the third transistor is electrically connected to a gate of the first transistor,
wherein one of source and drain of the fourth transistor is electrically connected to a gate of the second transistor,
wherein one of source and drain of the fifth transistor is electrically connected to one of source and drain of the sixth transistor,
wherein one of source and drain of the seventh transistor is electrically connected to a gate of the fifth transistor,
wherein one of source and drain of the eighth transistor is electrically connected to a gate of the sixth transistor,
wherein the other of source and drain of the first transistor is electrically connected to the other of source and drain of the fifth transistor,
wherein the other of source and drain of the second transistor is electrically connected to the other of source and drain of the sixth transistor,
wherein the other of source and drain of the third transistor is electrically connected to the other of source and drain of the eighth transistor,
wherein the other of source and drain of the fourth transistor is electrically connected to the other of source and drain of the seventh transistor,
wherein the one of source and drain of the first transistor is electrically connected to a first output terminal,
wherein the other of source and drain of the third transistor is electrically connected to a first input terminal,
wherein the other of source and drain of the fourth transistor is electrically connected to a second input terminal,
wherein the one of source and drain of the fifth transistor is electrically connected to a second output terminal,
wherein a first terminal of the first capacitor is electrically connected to the gate of the first transistor,
wherein a second terminal of the first capacitor is electrically connected to the one of source and drain of the first transistor,
wherein a first terminal of the second capacitor is electrically connected to the gate of the second transistor,
wherein a second terminal of the second capacitor is electrically connected to the other of source and drain of the second transistor,
wherein a first terminal of the third capacitor is electrically connected to the gate of the fifth transistor,
wherein a second terminal of the third capacitor is electrically connected to the one of source and drain of the fifth transistor,
wherein a first terminal of the fourth capacitor is electrically connected to the gate of the sixth transistor, and
wherein a second terminal of the fourth capacitor is electrically connected to the other of source and drain of the sixth transistor.

5. A display device comprising:
a driver circuit comprising the semiconductor device according to claim 4; and
a pixel portion including a pixel whose display state is controlled by the driver circuit.

6. An electronic device comprising:
the semiconductor device according to claim 4 or the display device according to claim 5; and
an input unit, an LED lamp, or a speaker.

* * * * *

UNITED STATES PATENT AND TRADEMARK OFFICE
CERTIFICATE OF CORRECTION

PATENT NO.          : 8,884,651 B2                                        Page 1 of 1
APPLICATION NO.     : 14/073902
DATED               : November 11, 2014
INVENTOR(S)         : Shunpei Yamazaki et al.

It is certified that error appears in the above-identified patent and that said Letters Patent is hereby corrected as shown below:

In the Specification

At column 8, line 53, "OUT 1a" should be --OUT1a--;

At column 15, line 37, "nm" should be --nm.--;

At column 19, line 41, "6 N" should be --6N--;

At column 19, line 41, "7 N" should be --7N--;

At column 34, line 29, "nm" should be --nm.--;

At column 43, line 44, "OW" should be --OH$^-$--;

At column 56, line 29, "nm" should be --nm.--;

At column 75, line 45, "$1.45 \times 10^{10}/cm^3$," should be --$1.45 \times 10^{10}/cm^3$,--.

Signed and Sealed this
Seventh Day of April, 2015

Michelle K. Lee
*Director of the United States Patent and Trademark Office*